United States Patent [19]
Yamauchi et al.

[11] Patent Number: 5,260,589
[45] Date of Patent: Nov. 9, 1993

[54] SEMICONDUCTOR DEVICE HAVING REFLECTING LAYERS MADE OF VARYING UNIT SEMICONDUCTORS

[75] Inventors: Norikatsu Yamauchi, Wakata 2-chome, Midori-ku, Nagoya-shi, Aichi-ken; Takashi Saka, Nagoya; Masumi Hirotani, Tokai; Toshihiro Kato, Kasugai; Hiromoto Susawa, Tokai, all of Japan

[73] Assignees: Norikatsu Yamauchi; Daido Tokushuko Kabushiki Kaisha, both of Nagoya, Japan

[21] Appl. No.: 786,006

[22] Filed: Oct. 31, 1991

[30] Foreign Application Priority Data

| Nov. 2, 1990 | [JP] | Japan | 2-298415 |
| Nov. 7, 1990 | [JP] | Japan | 2-301395 |
| Feb. 19, 1991 | [JP] | Japan | 3-45975 |
| Mar. 26, 1991 | [JP] | Japan | 3-87602 |
| Apr. 26, 1991 | [JP] | Japan | 3-125139 |
| Jul. 31, 1991 | [JP] | Japan | 3-216146 |

[51] Int. Cl.$^5$ .......................... H01L 33/00
[52] U.S. Cl. .................. 257/98; 257/13; 257/88; 257/96; 372/45
[58] Field of Search ............ 372/46, 43, 44, 45; 257/13, 88, 94, 96, 98

[56] References Cited

U.S. PATENT DOCUMENTS

| 4,570,172 | 2/1986 | Henry et al. | 372/45 |
| 4,775,876 | 10/1988 | Moyer | 357/17 |
| 4,991,179 | 2/1991 | Deppe et al. | 372/45 |
| 4,999,842 | 3/1991 | Huang et al. | 372/45 |
| 5,031,187 | 7/1991 | Orenstein et al. | 372/45 |
| 5,052,008 | 9/1991 | Kemeny | 372/45 |
| 5,055,893 | 10/1991 | Sasagawa | 357/17 |
| 5,068,868 | 11/1991 | Deppe et al. | 372/45 |
| 5,132,750 | 7/1992 | Kato et al. | 257/98 |
| 5,170,407 | 12/1992 | Schubert et al. | 372/45 |

FOREIGN PATENT DOCUMENTS

| 0114548 | 8/1984 | European Pat. Off. . |
| 0184463 | 6/1986 | European Pat. Off. . |
| 0430041 | 6/1991 | European Pat. Off. | 357/17 |
| 3404875 | 8/1985 | Fed. Rep. of Germany | 357/17 |
| 60-81887 | 5/1985 | Japan | 372/45 |
| 60-81888 | 5/1985 | Japan | 372/45 |
| 2-170486 | 7/1990 | Japan | 372/45 |
| 3-225885 | 10/1991 | Japan | 372/45 |
| 4-42589 | 2/1992 | Japan | 372/45 |

OTHER PUBLICATIONS

Physics Today, May 1976, pp. 38–47, H. Kressel, et al., "Light Sources".
Patent Abstracts of Japan, vol. 7, No. 280 (E-216) [1425], Dec. 14, 1983, JP-A-58-159385, Sep. 21, 1983, H. Abe, "Two-Color Light Emitting Diode".

(List continued on next page.)

Primary Examiner—Rolf Hille
Assistant Examiner—Minhloan Tran
Attorney, Agent, or Firm—Oblon, Spivak, McClelland, Maier & Neustadt

[57] ABSTRACT

A semiconductor device having a reflecting layer consisting of unit semiconductors each consisting of two or more semiconductor films of different compositions. The thickness of the unit semiconductors varies continuously or in steps in the direction of thickness of the reflecting layer, preferably decreases in the direction toward the light incidence surface of the layer. For example, the reflecting layer has a varying-thickness portion whose unit semiconductors have a continuously varying thickness, and may include an iso-thickness portion whose semiconductors have the same thickness. The composition at the interface of the adjacent films preferably changes to mitigate a lattice mismatch which causes crystal defects of the layer.

16 Claims, 37 Drawing Sheets

OTHER PUBLICATIONS

Patent Abstracts of Japan, vol. 7, No. 208 (E-198) [1353], Sep. 14, 1983, JP-A-58-103182, Jun. 20, 1983, K. Kasahara, "Two Wavelength Light Emitting Diode".

Patent Abstracts of Japan, vol. 13, No. 496 (E-843) [3844], Nov. 9, 1989, T. Kato, "Light-Emitting Diode", JP-A-1-200678, Aug. 11, 1989.

Patent Abstracts of Japan, vol. 9, No. 216 (E-340) [1939], Sep. 3, 1985, M. Mushigami, "Semiconductor Light Emitting Element and Manufacture Thereof", JP-A-60-77473, May 2, 1985.

Applied Physics Letters, vol. 45, No. 10, pp. 1028–1030, Nov. 15, 1984, R. L. Thornton, et al., "High Reflectivity GaAs-AlGaAs Mirrors Fabricated by Metalorganic Chemical Vapor Deposition".

Japanese Journal of Applied Physics, Aug. 28–30, 1989, pp. 429–432, Y. Nitta, et al., "GaAs/AlGaAs Optical Interconnection Chip for Neural Network".

THICKNESS OF UNIT SEMICONDUCTOR 30

THICKNESS OF UNIT SEMICONDUCTOR 30

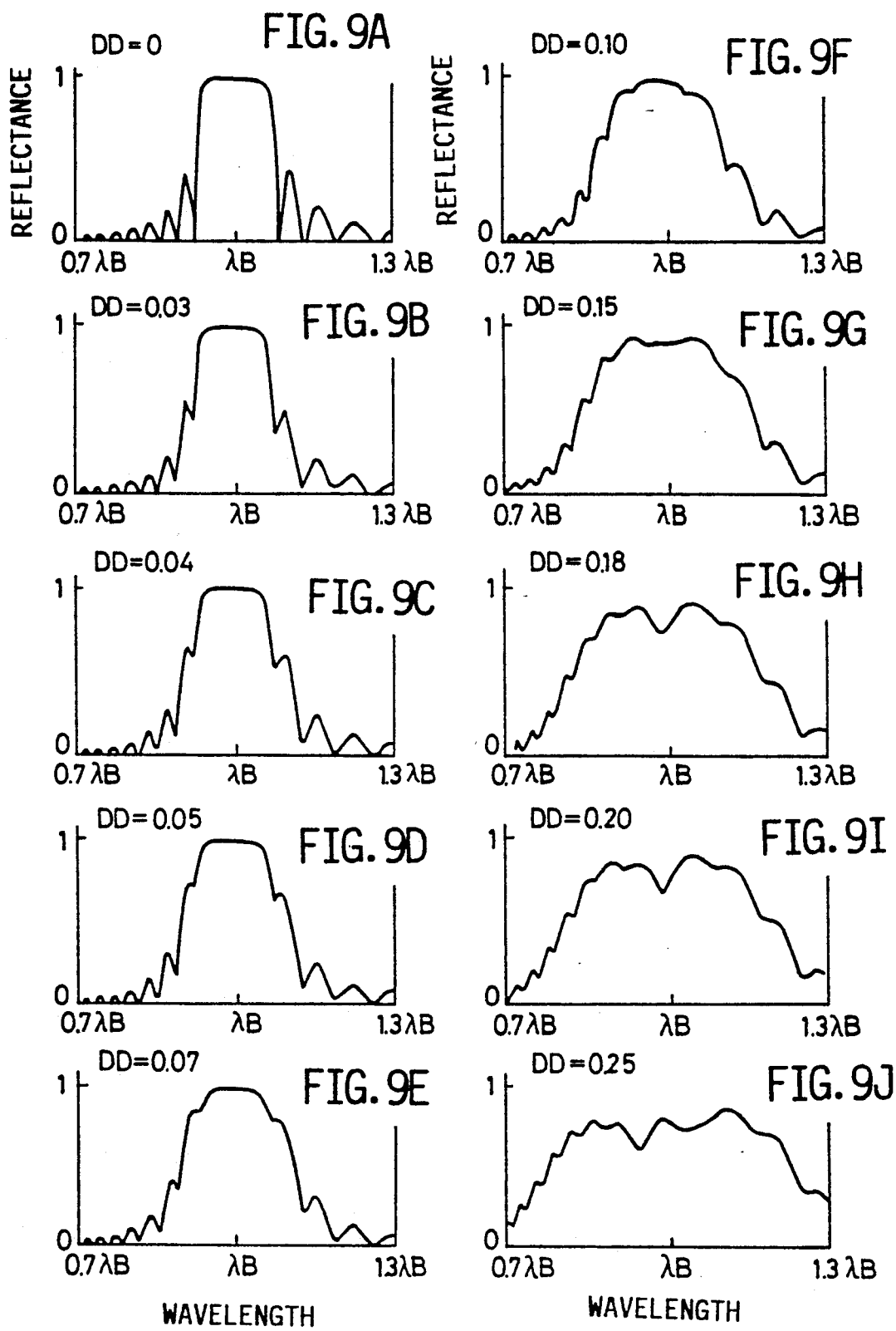

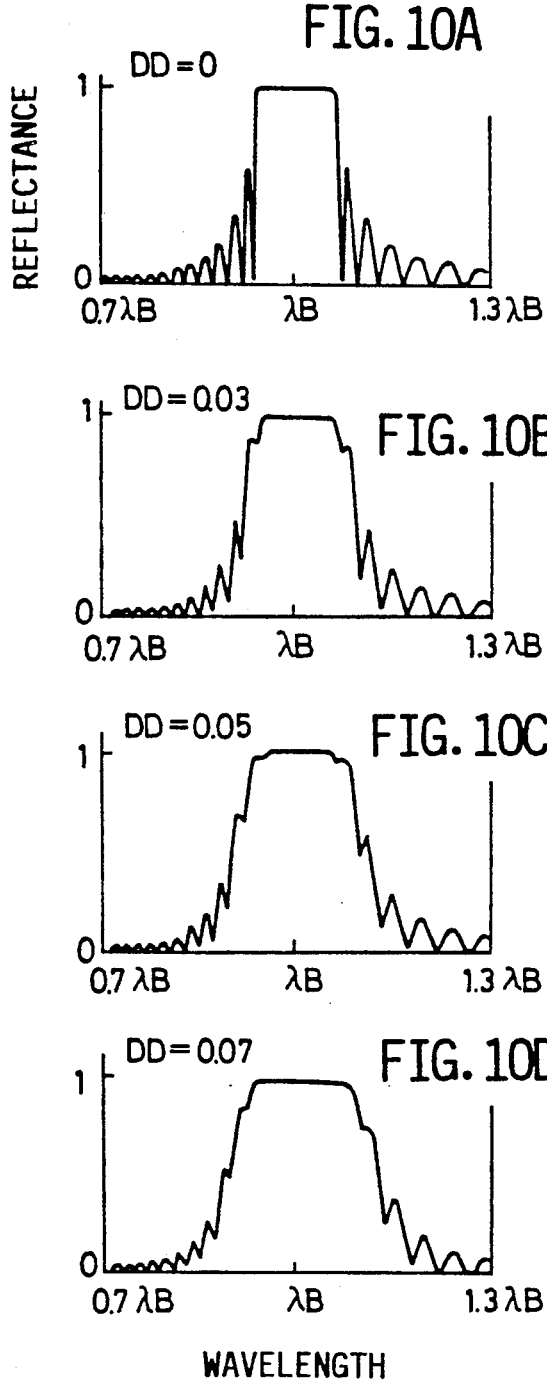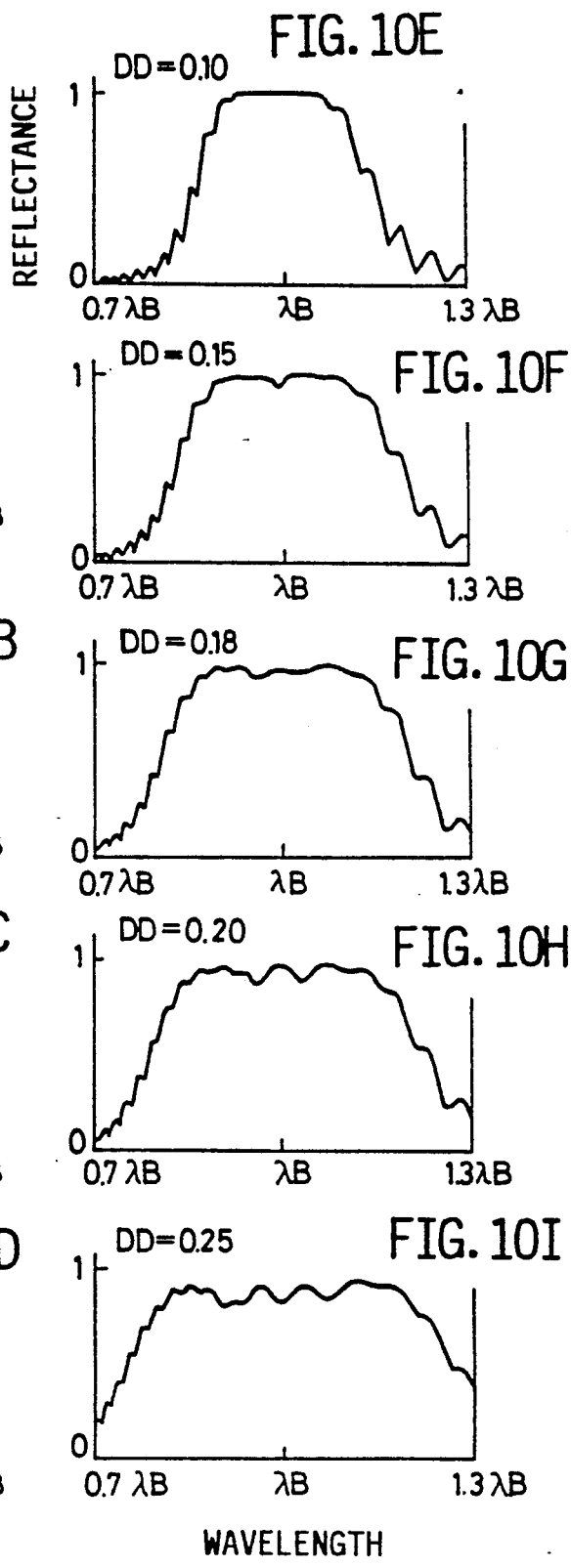

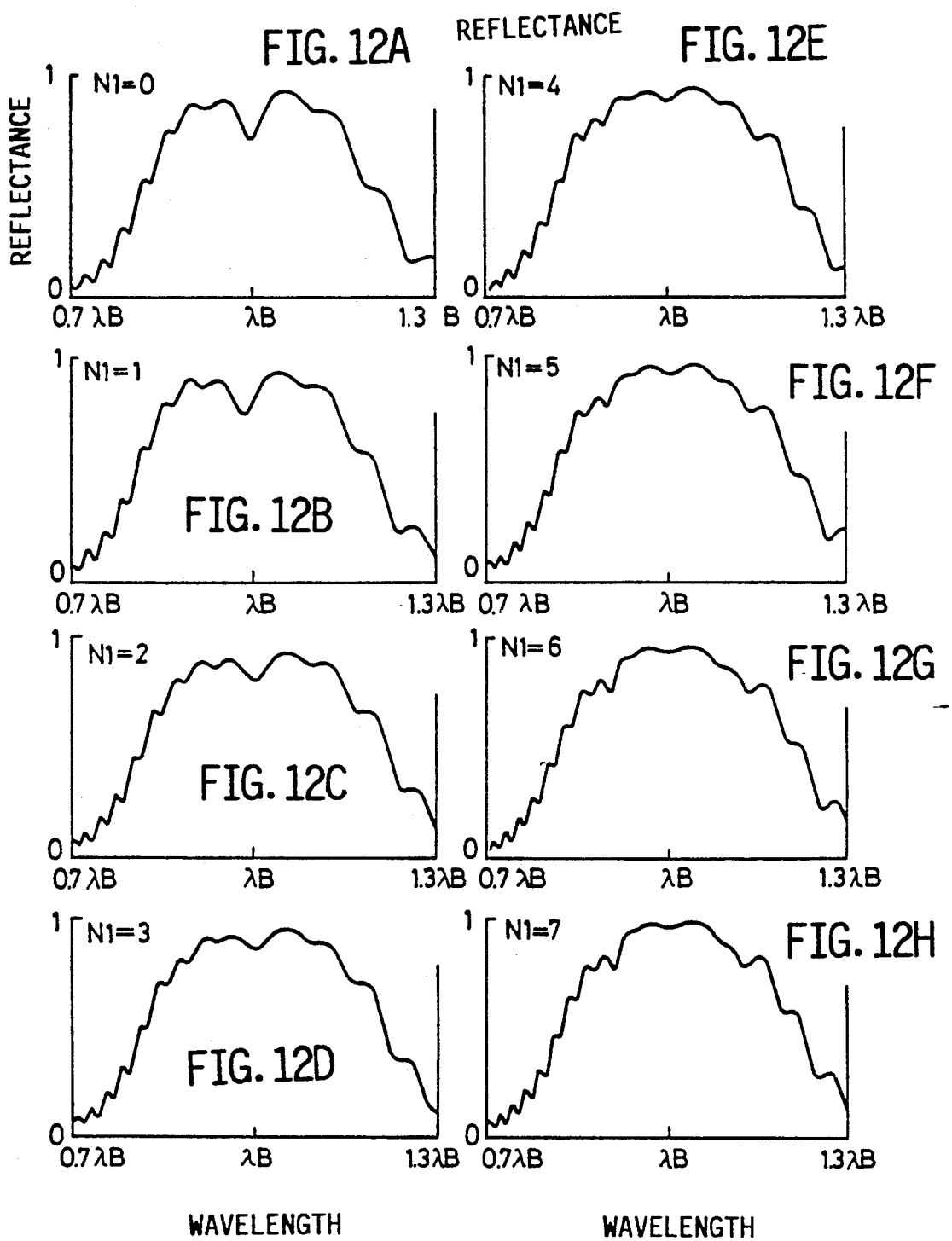

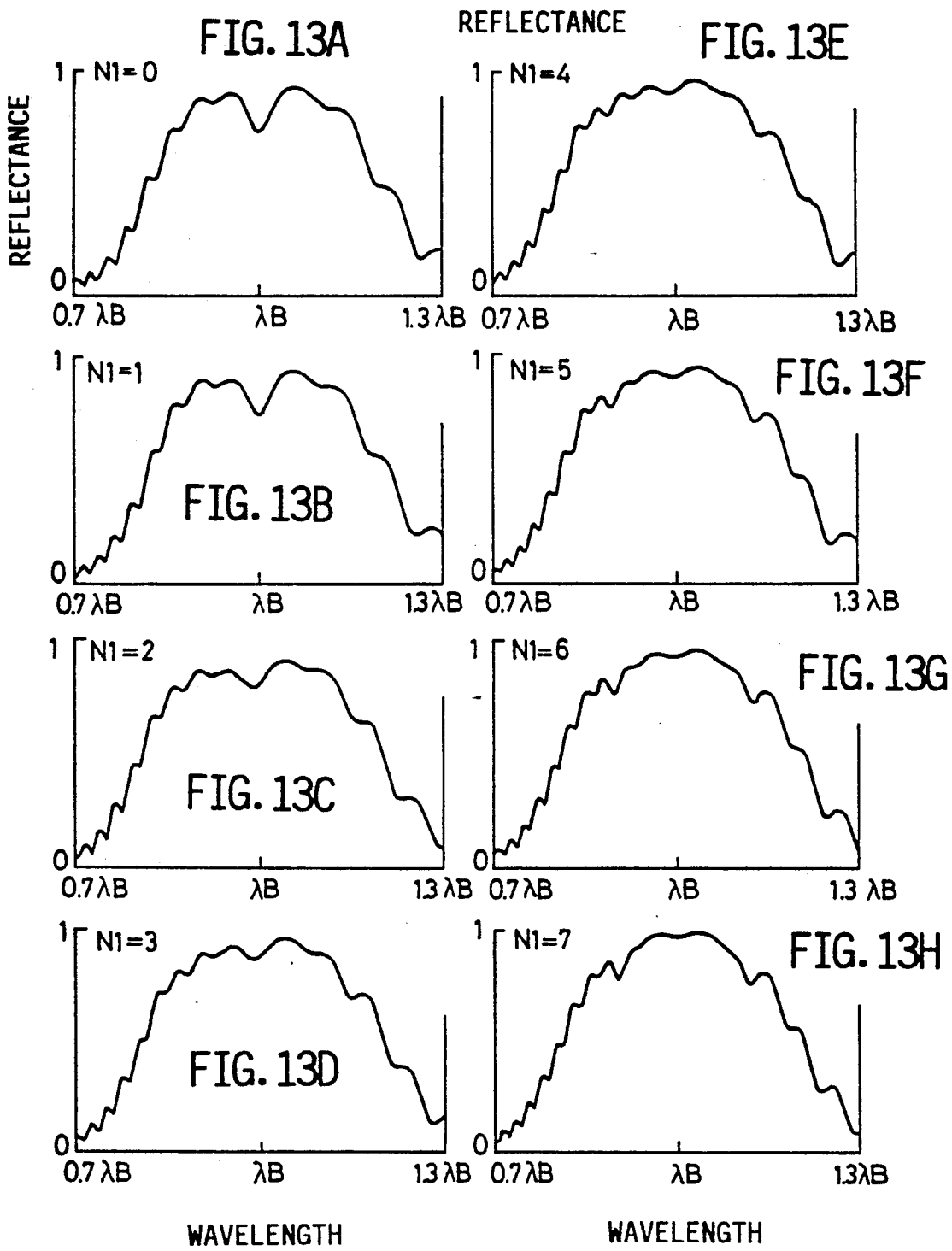

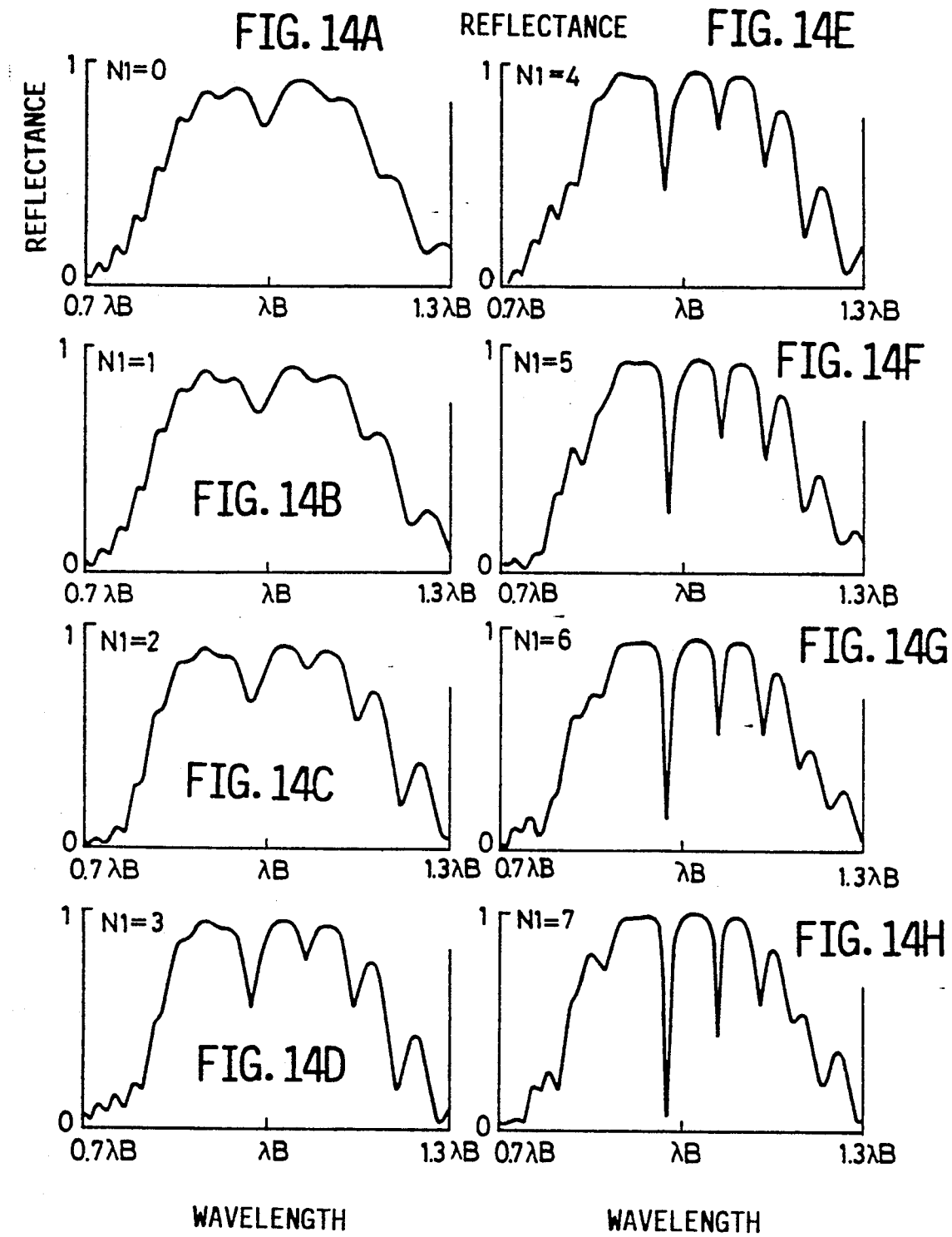

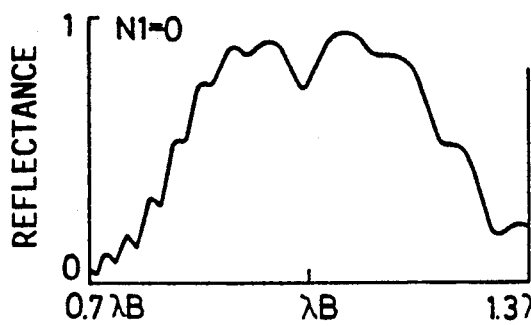
FIG. 15A
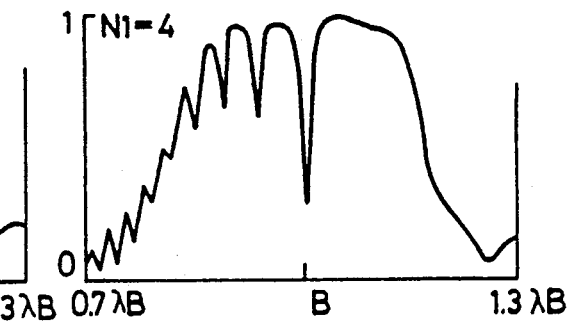
FIG. 15E
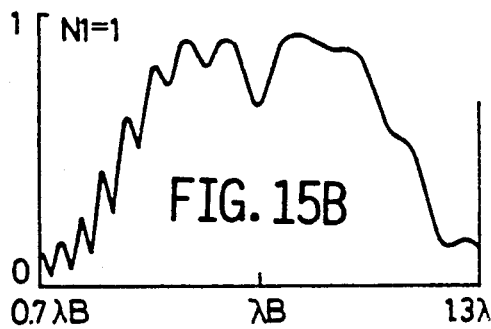
FIG. 15B
FIG. 15F
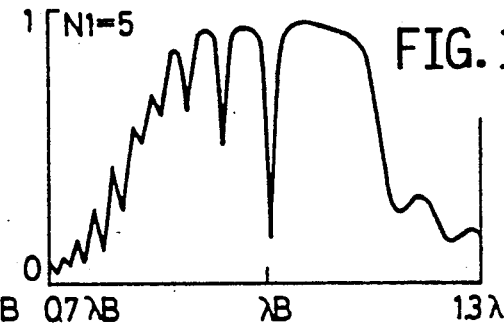
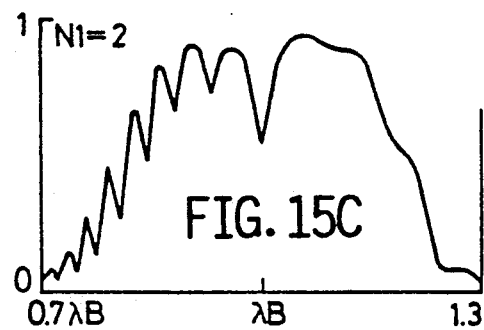
FIG. 15C
FIG. 15G
FIG. 15D
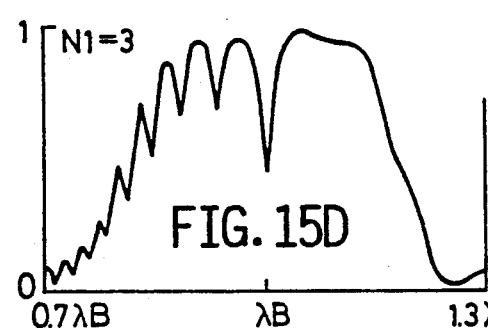
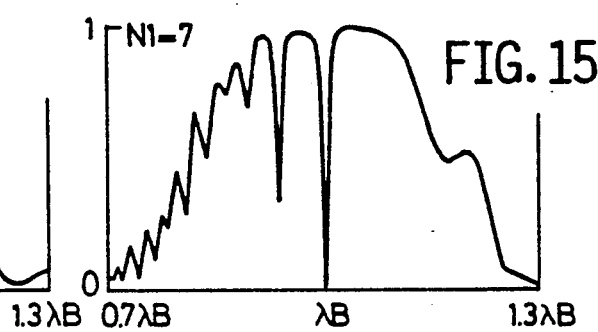
FIG. 15H
WAVELENGTH            WAVELENGTH

THICKNESS OF UNIT SEMICONDUCTOR 230

N=10
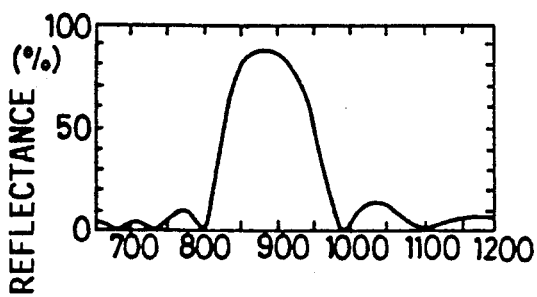
FIG. 26A DD=0
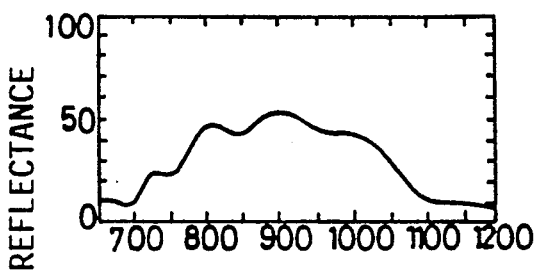
FIG. 26E DD=0.2
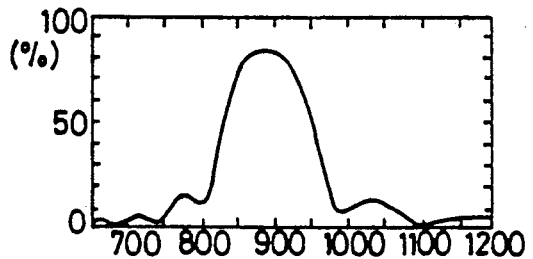
FIG. 26B DD=0.05
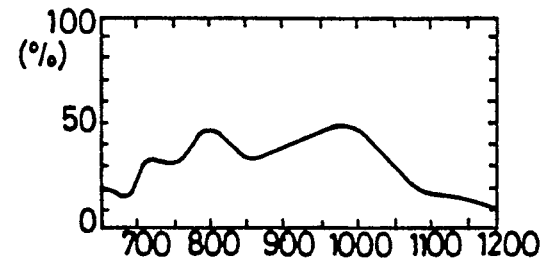
FIG. 26F DD=0.25
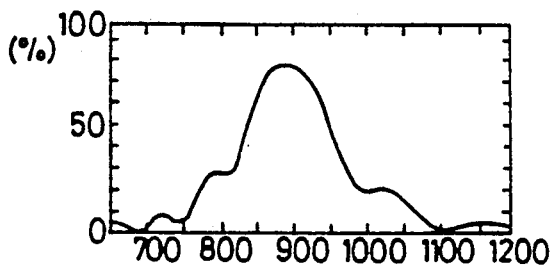
FIG. 26C DD=0.1
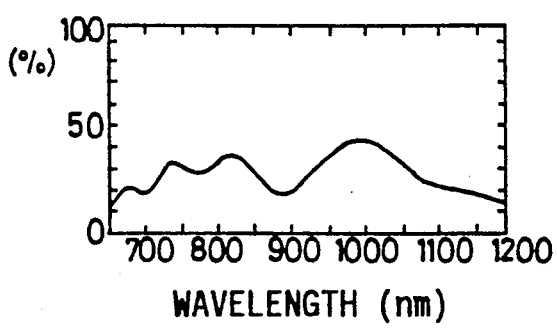
FIG. 26G DD=0.3
WAVELENGTH (nm)
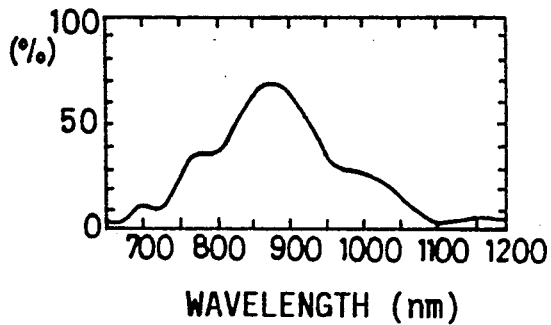
FIG. 26D DD=0.15
WAVELENGTH (nm)

N=15
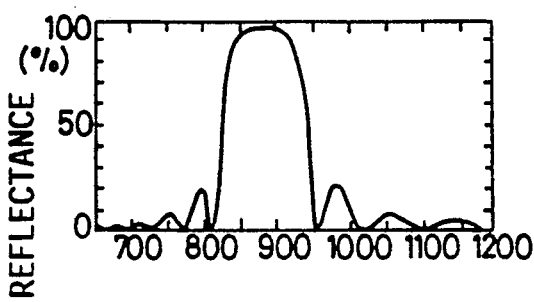
FIG. 27A (DD=0)
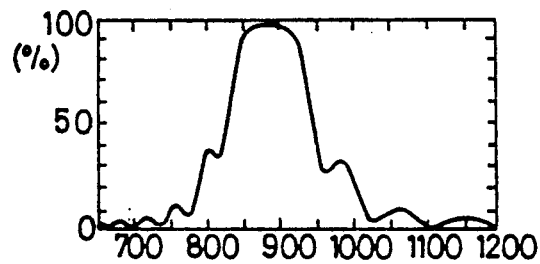
FIG. 27B (DD=0.05)
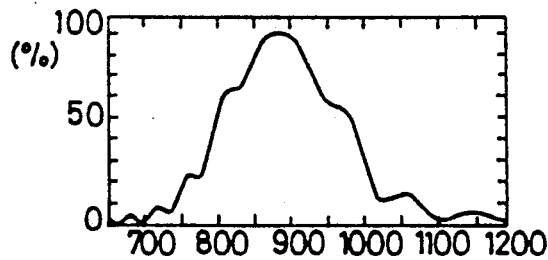
FIG. 27C (DD=0.1)
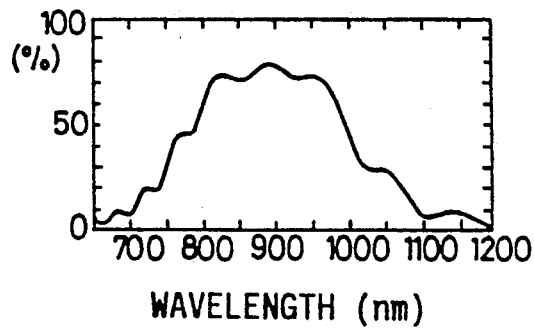
FIG. 27D (DD=0.15)
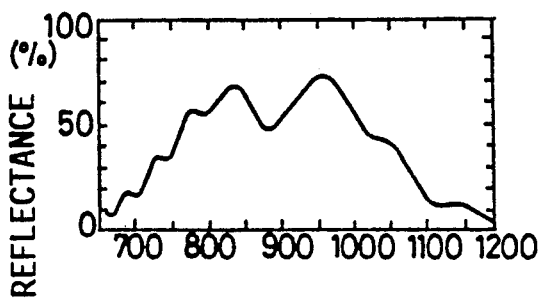
FIG. 27E (DD=0.2)
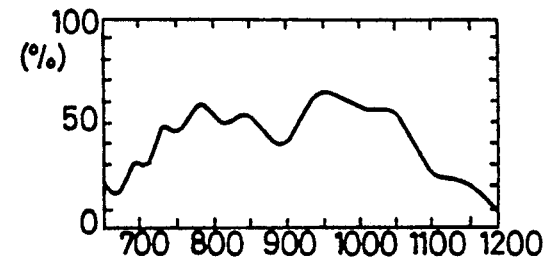
FIG. 27F (DD=0.25)
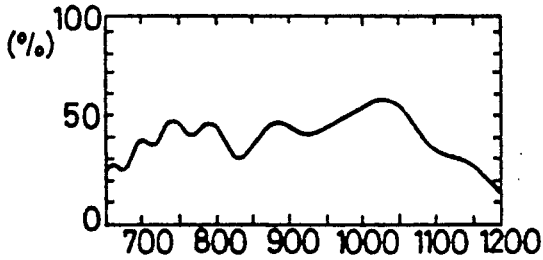
FIG. 27G (DD=0.3)

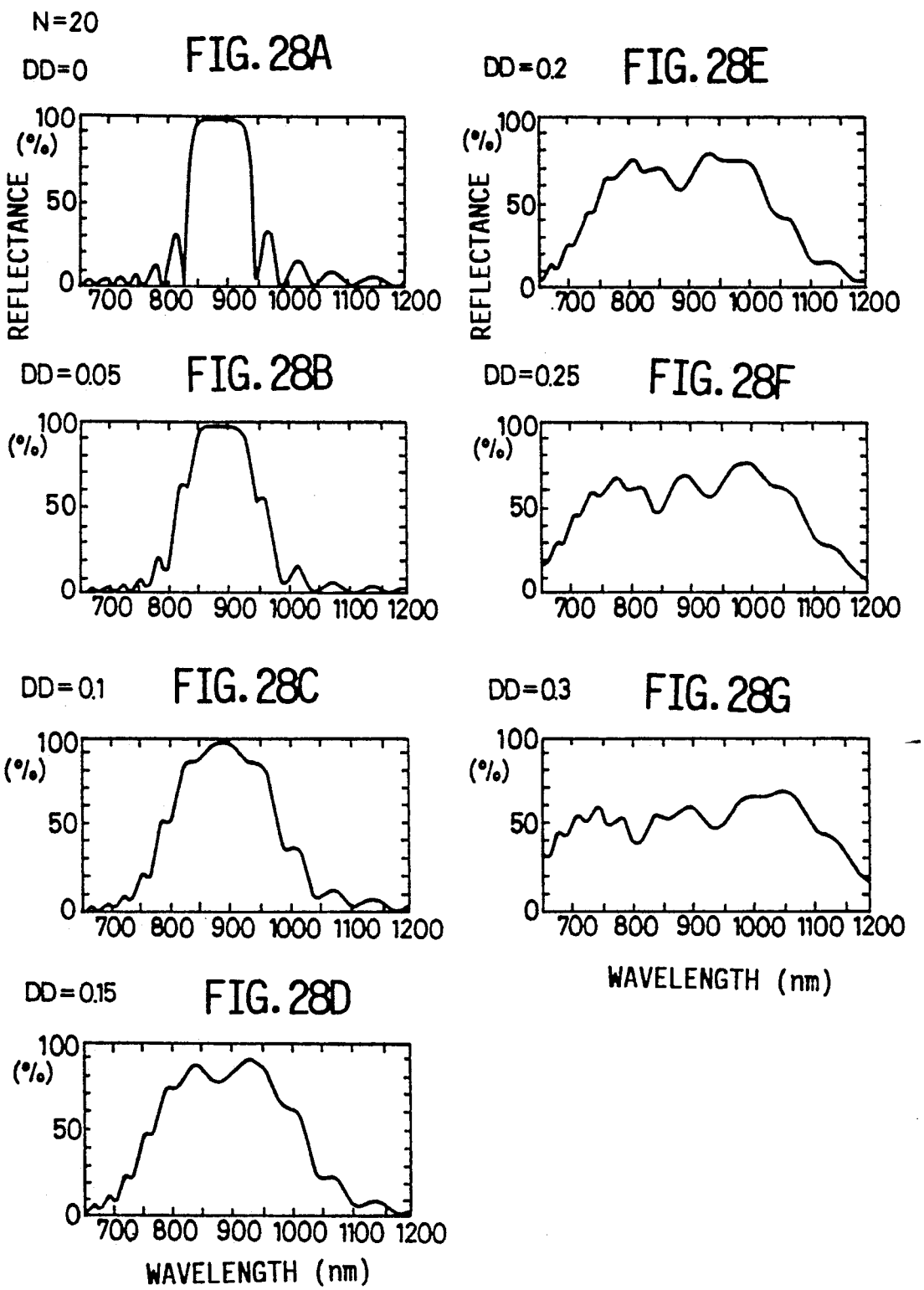

N=25
DD=0  FIG. 29A
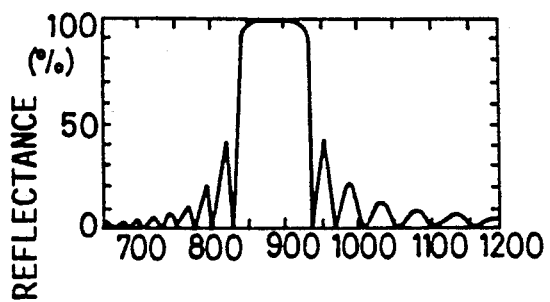
DD=0.05  FIG. 29B
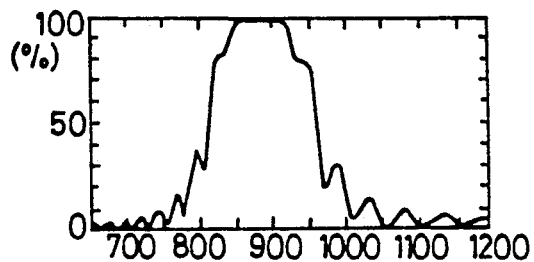
DD=0.1  FIG. 29C
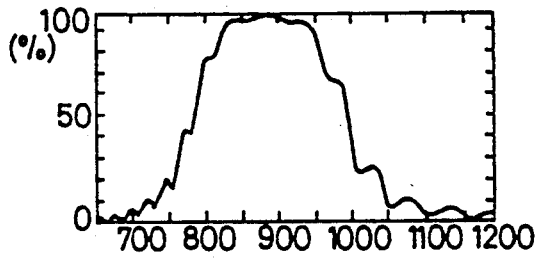
DD=0.15  FIG. 29D
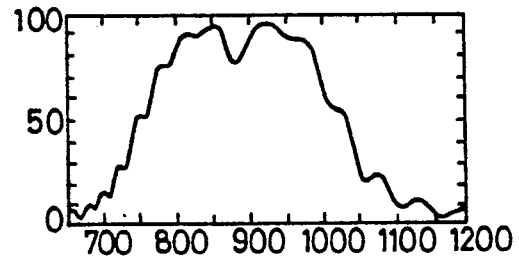
DD=0.2  FIG. 29E
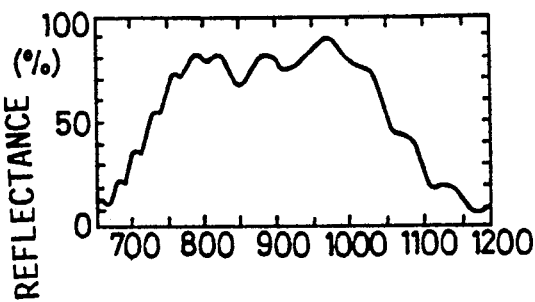
DD=0.25  FIG. 29F
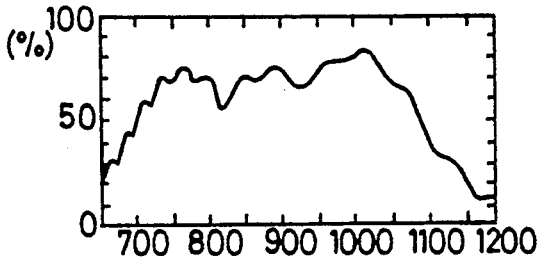
DD=0.3  FIG. 29G
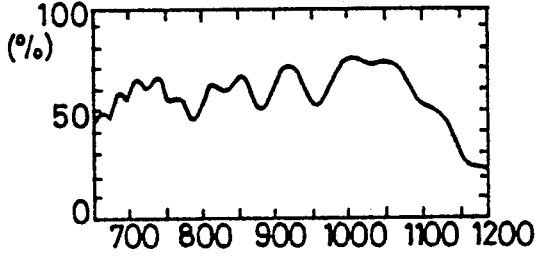

N=30
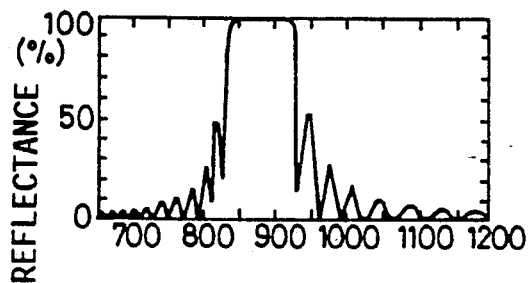
FIG. 30A  DD=0
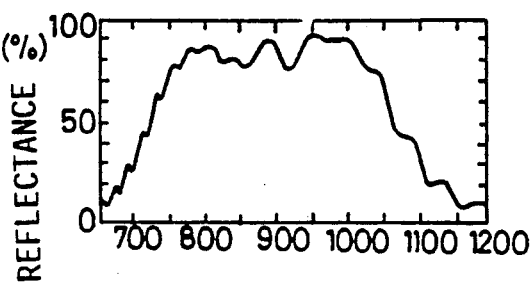
FIG. 30E  DD=0.2
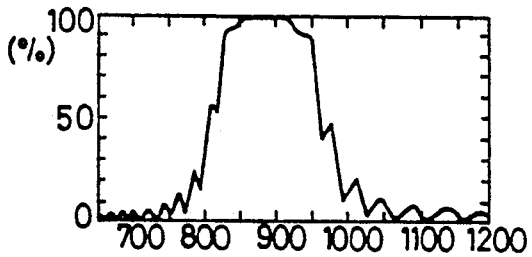
FIG. 30B  DD=0.05
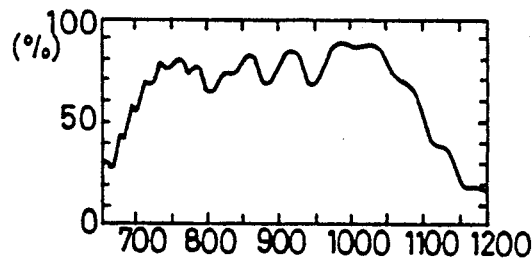
FIG. 30F  DD=0.25
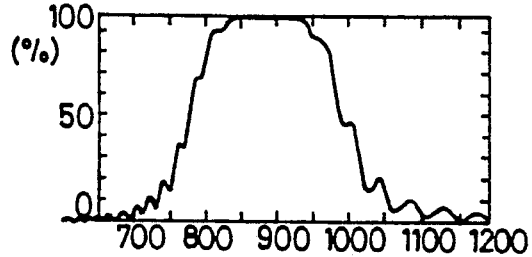
FIG. 30C  DD=0.1
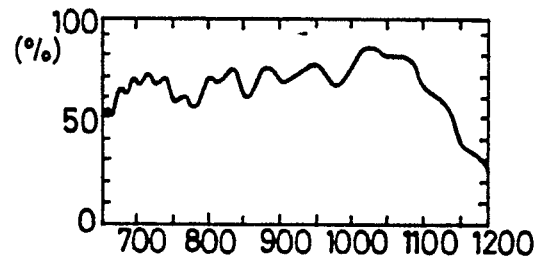
FIG. 30G  DD=0.3
WAVELENGTH (nm)
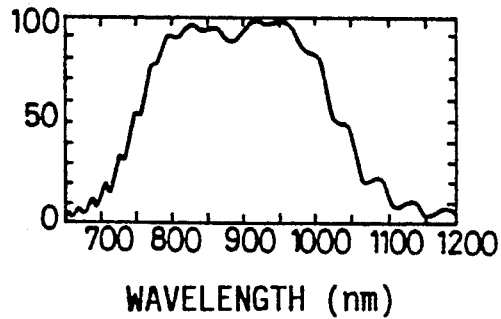
FIG. 30D  DD=0.15
WAVELENGTH (nm)

THICKNESS OF UNIT SEMICONDUCTOR 330

THICKNESS OF UNIT SEMICONDUCTOR 330

THICKNESS OF UNIT SEMICONDUCTOR 330

THICKNESS OF UNIT SEMICONDUCTOR 330

THICKNESS OF UNIT SEMICONDUCTOR 330

SEMICONDUCTOR DEVICE HAVING REFLECTING LAYERS MADE OF VARYING UNIT SEMICONDUCTORS

BACKGROUND OF THE INVENTION

1. Field of the Invention

The present invention relates to a semiconductor device, a surface emitting diode and an array of surface emitting diodes, which use a light reflecting layer consisting of unit semiconductors whose thickness continuously varies in a direction of thickness of the reflecting layer.

2. Discussion of the Prior Art

A light emitting diode is widely used for optical data communication equipment, displays and sensors. Such light emitting diode includes an active layer for producing light, which is formed on a semiconductor substrate by epitaxy, such as liquid phase epitaxy or vapor phase epitaxy. As one type of light emitting diode, there is known a surface emitting diode adapted to emit light produced by an active layer, from a light emitting surface which is formed substantially parallel to the active layer.

The optical output of a light emitting diode is determined by the internal quantum efficiency upon conversion of an electric energy into an optical energy, and the external quantum efficiency upon emission of light outside the diode. In the surface emitting diode, the reflecting layer is disposed on one side of the active layer which is remote from the light emitting surface, so that the reflecting layer reflects a portion of the light produced by the active layer, by optical wave interference known as Bragg reflection, back toward the active layer, in order to increase the external quantum efficiency for thereby improving the optical output of the diode. The reflecting layer is generally a laminar structure consisting of a plurality of unit semiconductors which are superposed on each other and each of which consists of two or more semiconductor films having different compositions. The specific wavelength of light to be reflected by the reflecting layer is determined by the particular refractive indices of the semiconductor films. Such a reflecting layer is also used in a semiconductor laser. An example of a unit semiconductor of the reflecting layer consists of a AlAs semiconductor film and a $Al_xGa_{1-x}As$ semiconductor film. Thicknesses $T_A$ and $T_G$ of these AlAs and $Al_xGa_{1-x}As$ semiconductor films are calculated according to the following equations (1) and (2), respectively:

$$T_A = \lambda B/4n_A \quad (1)$$

$$T_G = \lambda B/4n_G \quad (2)$$

where,

λB: center wavelength of light to be reflected
$n_A$: refractive index of the AlAs semiconductor film
$n_G$: refractive index of the $Al_xGa_{1-x}As$ semiconductor film The thickness of the unit semiconductor is therefore equal to $T_A + T_G$.

There is also known a surface emitting diode array which has a common substrate, a plurality of active layers formed on the common substrate, and a plurality of light emitting surfaces each formed on one side of the corresponding active layer which is remote from the substrate. This surface emitting diode array is used as a light source for an image-wise exposing head for a printer, and a display device. Generally, the surface emitting diode array is fabricated by forming p-n junctions on the common substrate, by vapor or liquid phase epitaxy or other epitaxial crystal growth techniques.

The wavelength of the light that can be reflected by the reflecting layer by optical wave interference is limited to a specific wavelength range which satisfies the condition of the optical wave interference. That is, the wavelength range of the light reflected by the reflecting layer is relatively narrow, and depends upon the thickness (calculated according to the above equations) and refractive index of each unit semiconductor. Accordingly, even small amounts of variation in the thickness and change in the composition of the unit semiconductors will cause deviation of the wavelength range of the light reflected by the reflecting layer, from the nominal wavelength of the light produced by the active layer, whereby the optical output of the diode is lowered. This means considerable difficulty in fabricating the diode so as to strictly meet the requirements. In the case of an infrared emitting diode using a GaAs active layer, for example, the ultraviolet radiation produced by the active layer has a wavelength range of about ±35 nm whose center is 880 nm. To completely cover this wavelength range, the thickness of the reflecting layer should be extremely accurately controlled. Further, it is difficult to precisely control the epitaxial growth on a large substrate, so as to assure constant thickness of the reflecting layer over its entire surface area. Thus, the yield ratio of the known diode is considerably lowered due to local thickness variation of the reflecting layer.

It is also noted that where each unit semiconductor of the reflecting layer consists of two superposed semiconductor films having different compositions, different lattice constants of the two semiconductor films may cause crystal defects due to lattice mismatch, resulting in an increase in the number of crystal defects such as dislocation of the active layer formed by epitaxy on the reflecting layer. The dislocation of the active layer may grow under heat during operation of the relevant semiconductor device (e.g., surface emitting diode), leading to so-called "dark line deterioration" of the active layer, thereby shortening the expected service life of the device. The use of the two semiconductor films has another drawback that the discontinuity of bands at the interface of the two semiconductor films increases an electrical resistance value, requiring the device to be operated with a higher voltage, as compared with a device which does not have a reflecting layer.

The conventional surface emitting diode has only one active layer, and is not capable of emitting lights having different center wavelengths. For permitting the diode to emit radiations having respective different center wavelengths, it is considered to provide the diode with two or more active layers that are superposed on each other. In this arrangement, however, a radiation produced by one of the active layers is more or less absorbed by another active layer, and a radiation is produced by this active layer upon absorption of the radiation produced by the above one active layer. Consequently, the output level of the emitted light having the desired wavelength is not sufficiently high.

The conventional surface emitting diode array may suffer from difference in the intensity of the radiations emitted by the individual diodes. This difference may result in undesired variation in the density of images printed by a print head if the diode array is used as a light source of the print head for image-wise exposing a recording medium or a photosensitive medium (such as a photoconductive drum). To solve this problem, it is considered to use suitable resistors in the driver circuit for the diode array, so that the radiations emitted by the individual diodes have the same intensity. However, this solution inevitably makes the print head complicated. Moreover, the solution requires an increased power consumption to assure output uniformity of all the diodes, since the resistors are used to lower the original output values of the diodes except one diode whose original output value is the smallest, to the smallest output value.

The conventional surface emitting diode array also suffers from reduction in the intensity of the emitted radiations, because portions of the radiations produced by the diodes are absorbed by the substrate or other elements. This problem is serious particularly where the surface area of the light emitting surface for each diode is extremely small, as in the case of a surface emitting diode array used as a light source for a print head as indicated above, wherein multiple diodes are arranged on the substrate. If the intensity of the emitted radiations is not sufficiently high, the amount of image-wise exposure of a recording or photosensitive medium is insufficient, whereby the resolution of printed images such as characters is accordingly lowered.

SUMMARY OF THE INVENTION

It is therefore a first object of the present invention to provide a semiconductor device such as a surface emitting diode, which has a reflecting layer capable of reflecting incident light over a sufficiently wide range of the wavelength of the light.

A second object of the invention is to provide a surface emitting diode whose active layer is free from crystal defects and which has prolonged service life and is operated with a comparatively low voltage.

It is a third object of the invention to provide a surface emitting diode capable of emitting radiations having respective wavelengths, at a sufficiently high output level.

It is a fourth object of the present invention to provide a surface emitting diode array wherein the intensities of the radiations emitted by the individual diodes are uniform and sufficiently high.

The first object may be achieved according to one aspect of the present invention, which provides a semiconductor device having a reflecting layer for reflecting incident light, by optical wave interference, the reflecting layer consisting of a plurality of unit semiconductors which are superposed on each other and each of which consists of a plurality of semiconductor films having different compositions superposed on each other, the semiconductor device being characterized in that the reflecting layer includes at least one varying-thickness portion which consists of a plurality of unit semiconductors whose thickness continuously varies in a direction of thickness of the reflecting layer.

In the semiconductor device of the present invention constructed as described above, the reflecting layer has a varying-thickness portion or portions consisting of unit semiconductors whose thickness continuously changes in a direction from the lowermost unit semiconductor toward the uppermost unit semiconductor. In this arrangement, the wavelength range of light reflected by each unit semiconductor having a given thickness slightly differs from the wavelength ranges of light reflected by the other unit semiconductors having different thicknesses. As a result, the overall wavelength range of light reflected by the reflecting layer as a whole is enlarged, so that the wavelength range of the reflecting layer always covers the entire wavelength range of the light incident upon the reflecting layer, even if the thickness and composition of each unit semiconductor of the reflecting layer deviate from the nominal specifications due to errors in the controllable and/or uncontrollable factors or parameters of the fabricating condition. It is also noted that the present reflecting layer is capable of reflecting not only light beams incident in the direction normal to the plane of the reflecting layer, but also light beams incident in the oblique directions. In this respect, too, the optical output of the device is improved. Thus, the reflecting layer of the instant semiconductor device significantly contributes to an improvement in the optical output of the device. Further, the present reflecting layer is effective to avoid a decrease in the yield ratio of the device due to local thickness variation of the layer and consequent local variation of the wavelength of the reflected light, even if the reflecting layer is formed by epitaxy on a large substrate.

It is noted that the reflectance of the reflecting layer may be lowered locally at some specific wavelength points within the wavelength range of the reflected light, where the amount of variation of the thickness of the unit semiconductors is excessively large. In this respect, it is desirable to determine the amount of thickness variation of the reflecting layer so as to avoid such local lowering of the reflectance.

The reflecting layer may further includes an iso-thickness portion consisting of unit semiconductors which are superposed on each other and each of which has a nominal thickness determined so as to reflect light whose wavelength is equal or close to the nominal wavelength of the light to be incident upon the reflecting layer. In this case, two varying-thickness portions are suitably formed so as to sandwich the iso-thickness portion. Namely, a first varying-thickness portion and a second varying-thickness portion are formed on opposite sides of the iso-thickness portion. The first varying-thickness portion consists of unit semiconductors whose thickness continuously decreases from the nominal thickness in a direction away from the iso-thickness portion, while the second varying-thickness portion consists of unit semiconductors whose thickness continuously increases from the nominal thickness in the direction away from the iso-thickness portion.

The semiconductor device of the present invention is suitably used as a surface emitting diode, which has an active layer for producing a radiation a portion of which is incident upon the reflecting layer, and a light emitting surface provided on one side of the active layer remote from the reflecting layer, for emitting the light from the active layer.

The surface emitting diode as described above enjoys the same advantages as described above. In this case, too, the reflecting layer preferably consists of the iso-thickness portion and the two varying-thickness portions formed on the opposite sides of the iso-thickness portion.

Each of the unit semiconductors of the reflecting layer may consist of an AlAs semiconductor film and an $Al_xGa_{1-x}As$ semiconductor film. In this case, the thickness of the unit semiconductors preferably continuously linearly varies between a largest thickness of $T(1+DD)$ and a smallest thickness T(1−DD), where T represents a nominal thickness which is a sum of a thickness $T_A$ of the AlAs semiconductor film determined according to the following equation (1) based on a center wavelength λB of the incident light and a refractive index $n_A$ of the AlAs semiconductor film, and a thickness $T_G$ of the $Al_xGa_{1-x}As$ semiconductor film determined according to the following equation (2) based on the center wavelength λB and a refractive index $n_G$ of the $Al_xGa_{1-x}As$ semiconductor film, and DD represents a predetermined ratio of variation of the thickness of the unit semiconductors to the nominal thickness T, a ratio $T_A/T_G$ being maintained constant for all of the unit semiconductors, $$T_A = \lambda B/4n_A \quad (1)$$

$$T_G = \lambda B/4n_G \quad (2).$$

According to this aspect of the invention, the smallest and largest thickness values of the unit semiconductor layers are suitably determined by the nominal thickness T and the desired thickness variation ratio DD.

In this connection, the wavelength range of the light reflected by the reflecting layer and the reflectance value of the reflecting layer change with the thickness variation ratio DD, number N of the unit semiconductors, and a ratio x of the $Al_xGa_{1-x}As$ semiconductor film. With a given combination of these parameters DD, N and x, the obtained reflecting layer may not be practically satisfactory in terms of the wavelength range and reflectance value indicated above. For instance, although the wavelength range of the reflected light is enlarged as the ratio DD is increased, the reflectance is generally lowered, or there arise local low-reflectance areas within the reflected wavelength range. If the number N of the unit semiconductors is made relatively large, the reflectance is increased, but the required time for forming the reflecting layer is elongated, leading to an increased cost of manufacture of the semiconductor device. It is also noted that the smaller the ratio x of the $Al_xGa_{1-x}As$ semiconductor film, the larger a difference between the refractive indices $n_A$ and $n_G$ of the two films of each unit semiconductor, whereby the optical wave interference effect of the reflecting layer is improved, thereby increasing the reflectance of the reflecting layer. In this respect, a change in the ratio x requires corresponding changes in the ratio DD and number N.

For obtaining practically satisfactory results in terms of the wavelength range of the reflected light and the reflectance, in view of the above, it is desirable that the number N, ratio DD and ratio x be determined so as to satisfy the following equations (3) and (4):

$$N \geq 10 + 25x \quad (3)$$

$$N \geq 100DD + (100x - 10)/2 \quad (4)$$

The reflecting layer whose parameters N, DD and x are determined according to above equations assures the wavelength width as large as about 100 nm, within which the reflectance is about 70% or higher. The ratio x can be easily changed by appropriately changing the number N and ratio DD according to the above equations. Further, a suitable combination of the ratios DD and x permits the number N to be reduced for lowering the cost of fabrication of the reflecting layer. If the parameters N, DD and x are determined according to the following equations (5) and (6), the wavelength width of the reflected light and the reflectance can be further improved.

$$N \geq 15 \quad (5)$$

$$N \geq 200DD + (100x - 20)/2 \quad (6)$$

Alternately, each of the unit semiconductors of the reflecting layer may consist of an $Al_xGa_{1-x}As$ semiconductor film and an $Al_yGa_{1-y}As$ semiconductor film. In this case, the thickness of the unit semiconductors preferably continuously linearly varies between a largest thickness of T(1+DD) and a smallest thickness T(1−DD), where T represents a nominal thickness which is a sum of a thickness $T_A$ of the $Al_yGa_{1-y}As$ semiconductor film determined according to the following equation (1) based on a center wavelength λB of the incident light and a refractive index $n_A$ of the $Al_yGa_{1-y}As$ semiconductor film, and a thickness $T_G$ of the $Al_xGa_{1-x}As$ semiconductor film determined according to the following equation (2) based on the center wavelength λB and a refractive index $n_G$ of the $Al_xGa_{1-x}As$ semiconductor film, and DD represents a predetermined ratio of variation of the thickness of the unit semiconductors to the nominal thickness T, a ratio $T_A/T_G$ being maintained constant for all of the unit semiconductors, $$T_A = \lambda B/4n_A \quad (1)$$

$$T_G = \lambda B/4n_G \quad (2).$$

According to this aspect of the invention, the smallest and largest thickness values of the unit semiconductor layers are suitably determined by the nominal thickness T and the desired thickness variation ratio DD.

In this connection, the wavelength range of the light reflected by the reflecting layer and the reflectance value of the reflecting layer change with the thickness variation ratio DD, number N of the unit semiconductors, a ratio x of the $Al_xGa_{1-x}As$ semiconductor film and a ratio y of the $Al_yGa_{1-y}As$ semiconductor film. With a given combination of these parameters DD, N, x and y, the obtained reflecting layer may not be practically satisfactory in terms of the wavelength range and reflectance value indicated above. For instance, although the wavelength range of the reflected light is enlarged as the ratio DD is increased, the reflectance is generally lowered, or there arise local low-reflectance areas within the reflected wavelength range. If the number N of the unit semiconductors is made relatively large, the reflectance is increased, but the required time for forming the reflecting layer is elongated, leading to an increased cost of manufacture of the semiconductor device It is also noted that the higher the ratio x of the $Al_xGa_{1-x}As$ semiconductor film and the ratio y of the $Al_yGa_{1-y}As$ semiconductor film, the larger a difference between the refractive indices $n_A$ and $n_G$ of the two films of each unit semiconductor, whereby the optical wave interference effect of the reflecting layer is improved, thereby increasing the reflectance of the reflecting layer. In this respect, a change in the ratios x and y requires corresponding changes in the ratio DD and number N.

For obtaining practically satisfactory results in terms of the wavelength range of the reflected light and the reflectance, in view of the above, it is desirable that the number N, ratio DD, ratio x and ratio y be determined so as to satisfy the following equations (7) and (8):

$$N \geq 10 + 25(x + y - 1) \tag{7}$$

$$N \geq 100DD + \{100(x + y - 1) - 10\}/2 \tag{8}$$

The reflecting layer whose parameters N, DD, x and y are determined according to above equations assures the wavelength width as large as about 100 nm, within which the reflectance is about 70% or higher. The ratios x and y can be easily changed by appropriately changing the number N and ratio DD according to the above equations. Further, a suitable combination of the ratios DD, x and y permits the number N to be reduced for lowering the cost of fabrication of the reflecting layer. If the parameters N, DD, x and y are determined according to the following equations (5) and (9), the wavelength width of the reflected light and the reflectance can be further improved.

$$N \geq 15 \tag{5}$$

$$N \geq 200DD + \{100(x + y - 1) - 20\}/2 \tag{9}$$

The first object indicated above may also be achieved according to another aspect of this invention, which provides a semiconductor device having a reflecting layer for reflecting incident light by optical wave interference, said reflecting layer consisting of a plurality of unit semiconductors which are superposed on each other and each of which consists of a plurality of semiconductor films having different compositions superposed on each other, characterized in that a thickness of the unit semiconductors is smaller on a side of the reflecting layer adjacent to a surface of light incidence thereof through which the incident light is incident upon the reflecting layer, than on a side of the reflecting layer remote from the surface of light incidence, as viewed in a direction of thickness of the reflecting layer.

The above aspect of the invention was developed as a result of a further study on the light reflecting characteristic of the reflecting layer of the semiconductor device according to the first aspect of the invention described above. In particular, it was found that the mere change in the thickness of the unit semiconductors of the reflecting layer does not necessarily assure sufficiently high reflectance of the reflecting layer with respect to a comparatively short wavelength band of the incident light. In other words, the present aspect of the invention was made in an effort to avoid reduction in the reflectance value for the comparatively short wavelengths. This reduction is considered to arise from the absorption of the incident light by the semiconductor materials of the reflecting layer. More specifically, a semiconductor material has a light absorption lower limit wavelength $\lambda c$, and absorbs wavelengths of light which are shorter than the lower limit wavelength $\lambda c$, but does not absorb wavelengths of light which are longer than the wavelength $\lambda c$. Consequently, the semiconductor materials tend to lower the reflectance with respect to the short wavelengths. In the case of the reflecting layer whose unit semiconductor consists of a GaAs semiconductor film and an AlAs semiconductor film, the light absorption lower limit wavelength $\lambda c$ of the GaAs semiconductor film is 880 nm, the lower half of the wavelength range of $880 \pm 35$ nm of light produced by a GaAs active layer is more or less absorbed by the reflecting layer, and the reflectance of the reflecting layer is lowered for that lower half. Although it is considered to replace the GaAs semiconductor film with an $Al_{0.2}Ga_{0.8}As$ semiconductor film whose light absorption lower limit wavelength $\lambda c$ is shorter than the shortest wavelength of 845 nm of the incident light, it is difficult to accurately control the proportion of Al and Ga, and a deviation of this proportion from the nominal value (0.2:0.8) will cause fluctuation of the refractive indices of the two semiconductor films, which may lead to an insufficient difference between their refractive indices, resulting in an adverse influence on the optical wave interference effect of the reflecting layer.

It will be understood from the above equations (1) and (2) that the wavelength of light reflected by a semiconductor material is shortened as the thickness of the semiconductor material is reduced. Therefore, the provision of comparatively thin unit semiconductors on the light incidence side of the reflecting layer will prevent a portion of the incident light having comparatively short wavelengths, from reaching the unit semiconductors remote from the light incidence surface of the reflecting layer, since the short wavelengths are reflected by the thin unit semiconductors. Thus, the reflectance of the reflecting layer with respect to the short wavelength band of the incident light is improved. Although a portion of the incident light having comparatively long wavelengths reaches the relatively thick unit semiconductors remote from the light incidence surface, the long wavelength band is not absorbed by the semiconductor materials, and the reflectance reduction is not caused for the long wavelength band. It will therefore be understood that the thickness arrangement according to the above aspect of the present invention permits significant improvement in the reflectance value of the reflecting layer with respect to the comparatively short wavelengths, without adversely influencing the reflectance value with respect to the comparatively long wavelengths. That is, the reflecting layer assures high reflectance over a wide range of wavelength of the incident light.

The thickness arrangement of the reflecting layer described above simply requires the unit semiconductors on the light incidence side to have comparatively small thickness values, and does not suffer from difficult control of the proportion of the components of the semiconductor film whose light absorption lower limit wavelength $\lambda c$ is shorter than the wavelength range of the incident light. Since the present arrangement assures accurate control of the refractive index difference of the semiconductor films, the reflecting layer can be readily formed for high stability in the light reflecting characteristic.

The reflecting layer according to the above aspect of the present invention may have at least one varying-thickness portion in which the thickness of the unit semiconductors continuously decreases in a direction from the side of the reflecting layer remote from the surface of light incidence, toward the side of the reflecting layer adjacent to the surface of light incidence. Alternatively, the reflecting layer may consist of a plurality of iso-thickness portions which consist of respective predetermined numbers of unit semiconductors, all of the unit semiconductors of each iso-thickness portions having a same thickness, and a thickness value of the unit semiconductors of one of the iso-thickness portions differing from a thickness value of the unit semiconductor of another of the iso-thickness portions such that the thickness of the unit semiconductors of the iso-thickness portions decreases in steps in the direction.

The second object indicated above may be accomplished according to a further aspect of the present invention, which provides a semiconductor surface emitting diode having a reflecting layer formed of different semiconductor materials for reflecting incident light by optical wave interference, an active layer formed by epitaxy for producing the light upon the reflecting layer, and a light emitting surface through which light produced by the active layer is emitted, characterized in that the reflecting layer includes semiconductor films having different compositions superposed on each other, a composition of the reflecting layer changing continuously or in steps, in a direction of thickness of the reflecting layer, at least at each interface between the adjacent semiconductor films.

In the surface emitting diode constructed according to the above aspect of the invention, the composition of the reflecting layer at each interface between the adjacent semiconductor films changes continuously or in steps in the direction of thickness of the reflecting layer, whereby the difference in the lattice constant between the adjacent films is reduced to accordingly mitigate the lattice mismatch, which causes crystal defects of the reflecting layer, thereby reducing the crystal defects of the active layer which is formed by epitaxy on the reflecting layer. As a result, the so-called dark line deterioration caused by the dislocation due to the crystal defects of the active layer is minimized, whereby the service life of the diode can be elongated. Further, the change in the composition of the reflecting layer at the interfaces of the semiconductor films is effective to mitigate the discontinuity of bands of the reflecting layer, thus lowering the electrical resistance of the reflecting layer, permitting the diode to be operated with a reduced voltage applied thereto.

The third object indicated above may be attained according to a still further aspect of this invention, which provides a surface emitting diode having a light emitting surface from which a plurality of radiations having different wavelengths are emitted, characterized by comprising: (a) a first active layer substantially parallel to the light emitting surface, for producing a first radiation having a first wavelength; (b) a second active layer disposed on one of opposite sides of the first active layer which is remote from said light emitting surface, the second active layer producing a second radiation having a second wavelength longer than the first wavelength; (c) a selective reflecting layer consisting of a multiplicity of semiconductor films and disposed between the first and second active layers, the selective reflecting layer reflecting the first radiation by optical wave interference, and transmitting the second radiation.

In the surface emitting diode constructed according to the above aspect of the invention, the selective reflecting layer is disposed between the first active layer substantially parallel to the light emitting surface, and the second active layer disposed on one side of the first active layer remote from the light emitting surface. The reflecting layer reflects by optical wave interference the first radiation produced by the first active layer, and transmits the second radiation produced by the second active layer. In addition, the wavelength of the second radiation is determined to be longer than that of the first radiation. According to this arrangement, a portion of the first radiation which travels from the first active layer toward the second active layer is reflected by the selective reflecting layer, and is emitted from the light emitting surface. Thus, the second active layer is prevented from absorbing the first radiation, which causes the second active layer to produce the second radiation. Further, a portion of the second radiation which is produced by the second active layer and which travels toward the reflecting layer is transmitted through the reflecting layer and emitted from the light emitting surface, without being absorbed by the first active layer because the wavelength of the second radiation is longer than that of the first radiation. Namely, the first active layer is prevented from absorbing the second radiation, which causes the first active layer to produce the first radiation. Thus, the present surface emitting diode is capable of emitting a selected one of the first and second radiations, with the nominal output efficiency.

Since the multiple semiconductor films of the selective reflecting layers may be formed by successive epitaxial growth operations within a common chamber, like the first and second active layers, the diode can be easily and economically fabricated.

The fourth object may be achieved according to a yet further aspect of the present invention, which provides a surface emitting diode array having a plurality of surface emitting diodes each including a common substrate, an active layer for producing a radiation, and a light emitting surface which is disposed on one of opposite sides of the active layer and from which the radiation is emitted, characterised in that each of the diodes includes a reflecting layer which consists of semiconductor films superposed on each other and which is disposed between the active layer and the common substrate, for reflecting a portion of the radiation by optical wave interference.

In the present surface emitting diode array, the reflecting layer consisting of the GaAs/AlAs semiconductor superlattice is disposed between the active layer of each diode and the common substrate. This arrangement assures uniform intensities of the radiations emitted from the individual diodes. Described in detail, the substrate usually has many dislocations, which are defects occurring along certain lines in the crystal structure. When the dislocations of the substrate propagate toward the active layer, the dislocations are released along the interfaces of the semiconductor films of the superlattice of the reflecting layer, whereby the dislocations of the substrate will not propagate to the active layer. If dislocations would occur in the active layer due to the propagation of the dislocations of the substrate, the electrons and holes are coupled together without producing light. It is assumed that the reflecting layer which prevents the propagation of the dislocations of the substrate to the active layers of the diodes serves to prevent the otherwise possible reduction in the optical output of each active layer. Thus, the reflecting layer appears to also function to assure uniform intensities of the radiations emitted from the individual diodes, and suitably prevent local density variation of the printed image.

The semiconductor films of the reflecting layer which has the auxiliary function as indicated above can be easily formed by successive crystal growth operations within a common chamber, together with the active layer and other layers. The presence of this reflecting layer eliminates resistors which are provided in the driver circuit for the diode array, to assure uniform optical outputs of the individual diodes. Consequently, the print head using the diode array is comparatively simplified. Further, the present diode array does not suffer from an increase in the required power consumption, as in the arrangement wherein the resistors are used to lower the different optical outputs of the diodes to the smallest output. In the present surface emitting diode array, the intensities of the radiations emitted by the individual diodes are substantially equal to each other, and maintained at a high level without an increase in the power consumption.

It is also noted that any portion of the radiation which is produced by the active layer is not absorbed by the substrate. Namely, the portion of the radiation which travels toward the substrate is reflected by the reflecting layer and is also emitted from the light emitting surface, assuring high optical outputs of the diodes. Since the intensity of the radiation emitted by each diode is high even where the light emitting surface of each diode is very small, the print head assures sufficiently high image reproduction resolution, with relatively small local areas of a photosensitive medium being selectively exposed to high-intensity beams.

BRIEF DESCRIPTION OF THE DRAWINGS

The above and optional objects, features and advantages of the present invention will become more apparent by reading the following detailed description of presently preferred embodiments of the invention, when considered in conjunction with the accompanying drawings, in which:

FIGS. 9A–9J are graphs showing light reflecting characteristics of the reflecting layer of FIG. 3, when the thickness variation ratio DD is changed in nine steps, where the number N of the unit semiconductors is equal to 20, FIGS. 10A–10I 10 are graphs showing light reflecting characteristics of the reflecting layer of FIG. 3, when the thickness variation ratio DD is changed in ten steps, where the number N of the unit semiconductors is equal to 30;

FIGS. 12A–12H are graphs indicating light reflecting characteristics of the reflecting layer of FIG. 5, when the number $N_1$ of the unit semiconductors is changed in eight steps, where the number $N_2$ of the unit semiconductors and the ratio DD are 10 and 0.2, respectively;

FIGS. 13A–13H are graphs similar to those of FIGS. 12A–12H, of the reflecting layer of FIG. 6;

FIGS. 14A–14H are graphs indicating light reflecting characteristics of the reflecting layer of FIG. 6, when the number $N_1$ is changed in eight steps, where the number $N_3$ and the ratio DD are 20 and 0.2, respectively;

FIGS. 15A–15H are graphs similar to those of FIGS. 14A–14H, of the reflecting layer of FIG. 8;

FIGS. 26A–26G are graphs indicating results of simulation tests of the light reflecting characteristics of the reflecting layer of FIG. 25, when the thickness variation ratio DD is changed in seven steps, where the number N of unit semiconductors is equal to 10;

FIGS. 27A–27G are graphs similar to those of FIGS. 26A–26J, where the number N is equal to 15;

FIGS. 28A–28G are graphs similar to those of FIGS. 26A–26J, where the number N is equal to 20;

FIGS. 29A–29G are graphs similar to those of FIGS. 26A–26J, where the number N is equal to 25;

FIGS. 30A–30G are graphs similar to those of FIGS. 26A–26J, where the number N is equal to 30;

DETAILED DESCRIPTION OF THE PREFERRED EMBODIMENTS

Figure 1:
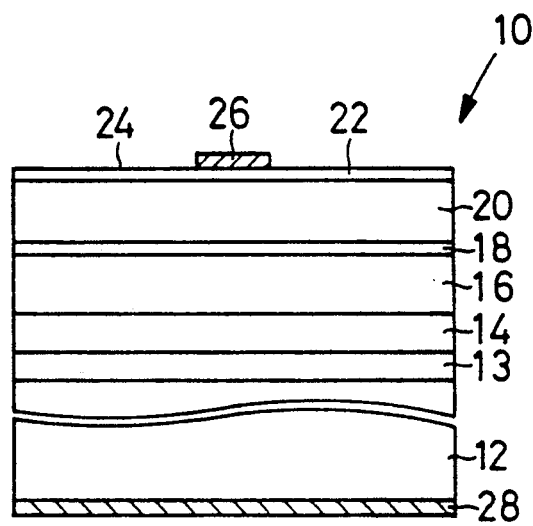
FIG. 1 is an elevational view in cross section of one embodiment of a surface emitting diode of the present invention.

Referring first to FIG. 1, there is shown a semiconductor device in the form of a surface emitting diode 10, which has an n-GaAs substrate 12. On this substrate 12, the following layers are formed one on another, in the order of description: $Al_xGa_{1-x}As$ buffer layer 13; n-AlAs/n-GaAs reflecting layer 14; $n-Al_xGa_{1-x}As$ clad layer 16; p-GaAs active layer 18; $p-Al_xGa_{1-x}As$ clad layer 20; and p-GaAs cap layer 22. The clad layer 16, active layer 18 and clad layer 20 constitute a double heterostructure. The cap layer 22 has a top surface which serves as a light emitting surface 24, on which a positive electrode 26 is formed. A negative electrode 28 in the form of a layer is formed on a lower surface of the substrate 12. With a forward voltage applied between the electrodes 26, 28, the active layer 18 of the double heterostructure produces light, which is emitted from the light emitting surface 24 of the cap layer 22. The reflecting layer 14 receives a portion of the light which is emitted from the active layer 18 toward the substrate 12, and functions to cause optical wave interference, thereby reflecting the incident light back toward the active layer 18 and the light emitting surface 24, whereby the optical output of the diode 10 is improved by the provision of the reflecting layer 14.

Figure 2:
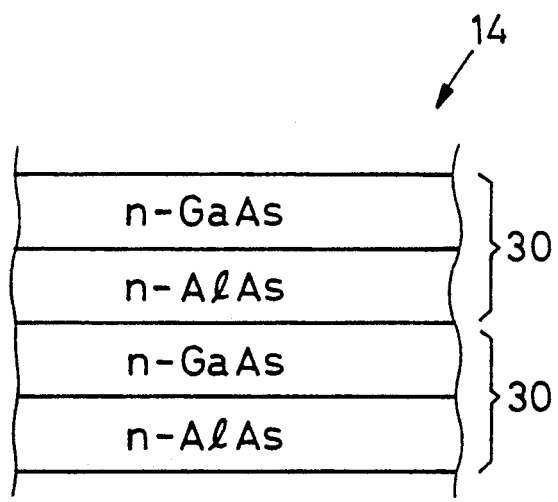
FIG. 2 is a fragmentary view for explaining a reflecting layer of the surface emitting diode of FIG. 1.

Each semiconductor element of the surface emitting diode 10 is formed by epitaxy using a MOCVD (metalorganic chemical vapor deposition) device. The layers 16, 18, 20 and 22 have approximate thickness values of 2 μm, 0.1 μm, 2 μm and 0.1 μm, respectively. The reflecting layer 14 consists of a multiplicity of unit semiconductors 30 superposed on each other, each semiconductor 30 consisting of an n-AlAs semiconductor film and an n-GaAs semiconductor film, as shown in FIG. 2. These two semiconductor films are alternately laminated to form the multiple unit semiconductors 30. The thicknesses of the n-AlAs and n-GaAs semiconductor films are determined depending upon the wavelength of the light produced by the active layer 18. The compositions of these semiconductor films of the unit semiconductors 30 are controlled by material gases introduced into a reaction furnace of the MOCVD device, and a proportion of these gases. The thicknesses of the semiconductor films are controlled by the flow rate of the material gases and the length of time during which the gases are introduced. It is noted that FIGS. 1 and 2 do not accurately represent the relative thickness ratios of the various semiconductor elements of the diode 10.

In a conventional surface emitting diode, all unit semiconductors 30 of a reflecting layer have a predetermined constant thickness, which is a sum of a thickness $T_A$ of the n-AlAs semiconductor film obtained from the above equation (1), and a thickness $T_G$ of the n-GaAs obtained from the above equation (2). Namely, the constant thickness is equal to $(T_A+T_G)$. The unit semiconductors 30 each having the thus determined thickness are superposed on each other to form the reflecting layer of the conventional diode. In the surface emitting diode 10 according to the present invention, the reflecting layer 14 includes a varying-thickness portion which consists of the unit semiconductors 30 having different thicknesses, so that the varying-thickness portion has a continuously varying thickness. FIGS. 3 through 8 show different forms of the reflecting layer, which have different varying-thickness portions. In each form of the reflecting layer, the thickness of the unit semiconductors 30 changes over a suitable range whose upper and lower limits are $T(1+DD)$ and $T(1-DD)$, where T represents the nominal thickness which is equal to $(T_A+T_G)$ determined as described above, while DD represents a ratio of a variation of the thickness of the unit semiconductors 30 from the nominal thickness T, that is, DD=(thickness variation)/T. Therefore, the overall amount of variation of the thickness of the semiconductors 30 of the reflecting layer 14 is equal to $\{T(1+DD)-\{T(1-DD)\}$, which is equal to 2T·DD. As indicated above, the ratio $T_A/T_G$ is fixed and the same for all unit semiconductors 30.

Referring to FIGS. 3-8, the reflecting layers 14 having the different thickness changing arrangements will be discussed in detail.

Figure 3:
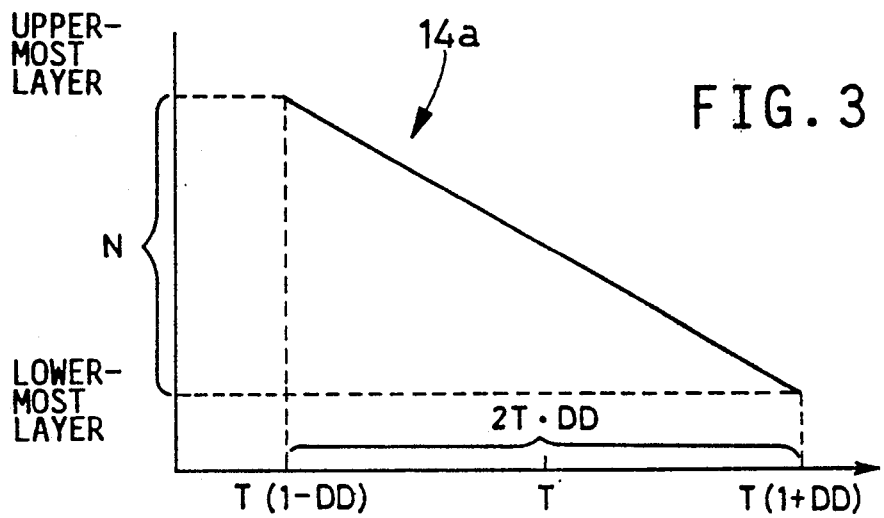
FIG. 3 is a view indicating a change in the thickness of unit semiconductors of one form of the reflecting layer of FIG. 2.

The reflecting layer 14a of FIG. 3 consists solely of a varying-thickness portion, in which the unit semiconductors 30 have a continuously varying thickness from its uppermost unit semiconductor 30 having the smallest thickness $T(1-DD)$, to its lowermost unit semiconductor 30 having the largest thickness $T(1+DD)$. The thickness of the unit semiconductors 30 linearly decreases in the direction from the lowermost unit semiconductor 30 toward the uppermost unit semiconductor 30. The light reflecting characteristics of the reflecting layer 14a whose number N of the unit semiconductors 30 is equal to 20 were obtained by simulation by changing the thickness variation ratio DD. The results of the simulation are shown in FIGS. 9A–9J. Similarly, FIGS. 10A–10J show the light reflecting characteristics of the reflecting layer 14a whose number N is equal to 30. In the simulation, a light was incident upon the reflecting layer 14a in a direction normal to the plane of the layer 14a, and it was assumed that the reflecting layer 14a does not absorb any portion of the incident light. The reflecting layer 14a was interposed between two layers of $Al_{0.5}Ga_{0.5}As$, which are equivalent the clad and buffer layers 16, 13, the clad layer 16 being a light incident medium through which the light is incident upon the layer 14a.

The light reflecting characteristics shown in FIGS. 9A and 10A are those of the conventional reflecting layer whose thickness variation ratio DD is zero, i.e., reflecting layer in which all the unit semiconductors 30 have the same nominal thickness T. In FIGS. 9 and 10, λB represents the wavelength of the reflected light corresponding to the nominal thickness T, which is equal to that of the light produced by the active layer 18. It will be understood from FIGS. 9 and 10 that the wavelength range of the light reflected by the reflecting layer 14a is widened or enlarged as the thickness variation ratio DD is increased, irrespective of whether the number N is 20 or 30. This arrangement is effective to prevent the wavelength range of the light produced by the active layer 18, from falling outside the wavelength range of the light reflected by the reflecting layer 14a, even if the thickness and composition of the semiconductor films of the unit semiconductors 30 vary due to errors in controlling the various parameters during formation of the reflecting layer 14a. Accordingly, the present reflecting layer 14a provides a considerable improvement in the optical output of the surface emitting diode 10, and allows easier fabrication of the diode 10. Further, the reflecting layer 14a thus arranged effectively minimizes a reject ratio of the diode 10 due to an excessive local variation in the wavelength of the reflected light, which may be caused by local variation in the thicknesses of the elements formed on the substrate 12.

Table 1 indicates the wavelength width of the light reflected by the different forms of the reflecting layers 14a, over which the reflectance is 80% or higher. The values of the wavelength width in Table 1 are determined such that the wavelength width is equal to a reference value of "1" where the thickness variation ratio DD is zero (FIGS. 9A and 10A). Table 2 indicates the wavelength width over which the reflectance is 90% or higher. As indicated in Table 1, a central portion of the wavelength range in which the reflectance is generally higher than the other portion has local wavelength areas in which the reflectance is lower than 80%, when the thickness variation ratio DD is 0.2 or higher, where the number N is equal to 20. In the case of Table 2, the reflectance is generally lower than 90%, where when the thickness variation ratio DD is 0.18 or higher, where the number N is equal to 20. Further, a central portion of the wavelength range has local wavelength areas in which the reflectance is lower than 90%, when the ratio DD is 0.2 or higher, where the number N is equal to 30.

TABLE 1

| Thickness Variation Ratio DD | Number N of Unit Semiconductors 30 | |
|---|---|---|
| | N = 20 | N = 30 |
| 0 | 1 | 1 |
| 0.1 | 1.39 | 1.69 |
| 0.15 | 1.63 | 2.30 |
| 0.2 | Central local wavelength areas of lower than 80% reflectance | 2.70 |
| 0.25 | Central local wavelength areas of lower than 80% reflectance | 3.11 |

TABLE 2

| Thickness Variation Ratio DD | Number N of Unit Semiconductors 30 | |
|---|---|---|
| | N = 20 | N = 30 |
| 0 | 1 | 1 |
| 0.05 | 0.96 | 1.24 |
| 0.07 | 0.90 | 1.28 |
| 0.1 | 1.24 | 1.59 |
| 0.15 | 1.30 | 1.86 |
| 0.18 | Substantially zero | 2.21 |
| 0.20 | Substantially zero | Central local wavelength areas of lower than 90% reflectance |

These phenomena appear to be derived from an increase in the amount of variation 2T·DD/N of the unit semiconductors 30 as the ratio DD increases. The local wavelength areas in which the reflectance is lower than those in the adjacent central areas can be avoided if the ratio DD and number N are selected so that the value 2T·DD/N is not larger than about 0.01 T.

Figure 4:
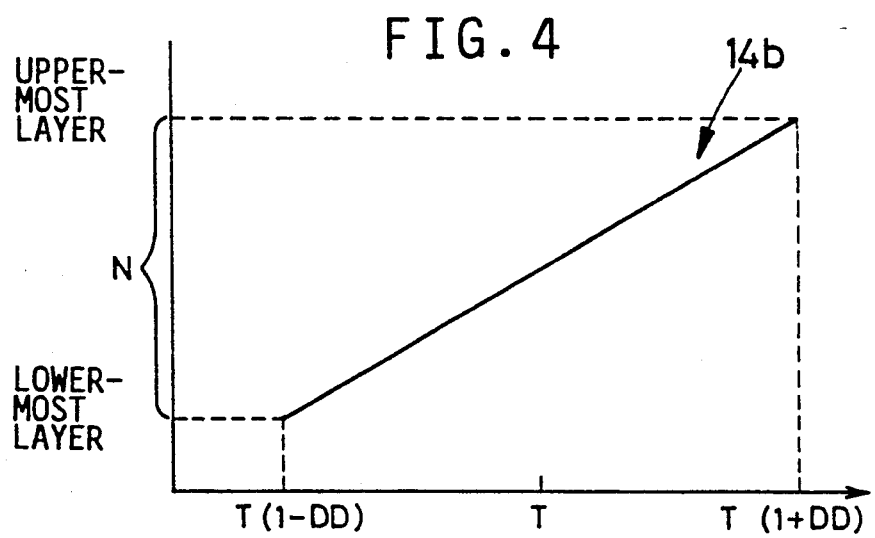
FIGS. 4–8 are views indicating changes in the thickness of unit semiconductors of other forms of the reflecting layer.
Figure 5:
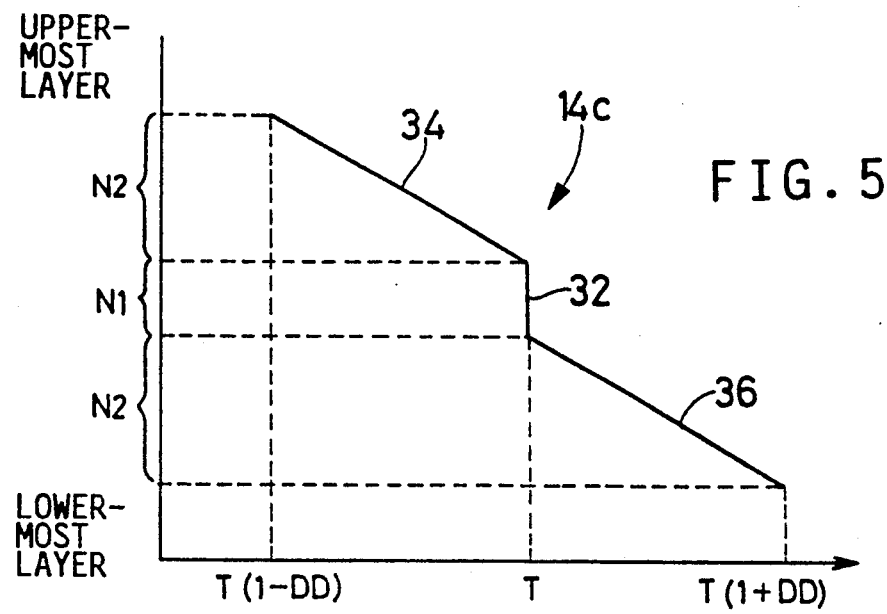
Figure 11:
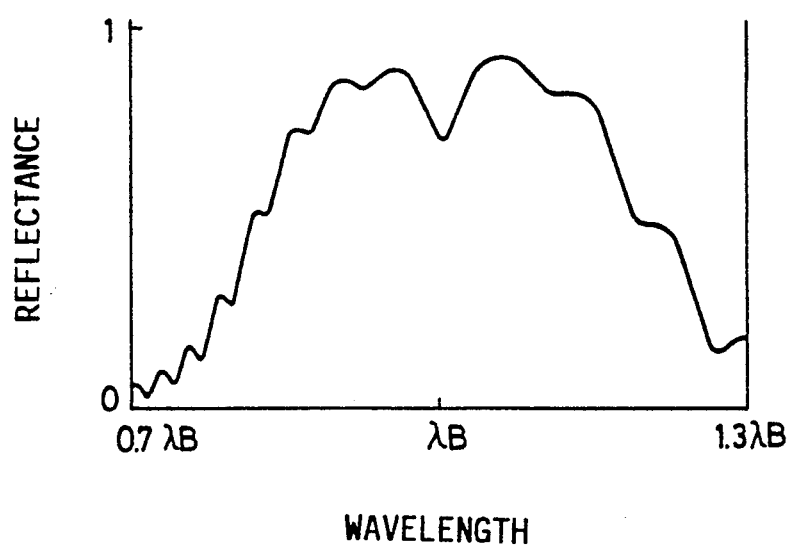
FIG. 11 is a graph indicating light reflecting characteristic of the reflecting layer of FIG. 4, where the number and ratio N and DD are 20 and 0.2, respectively.

Like the reflecting layer 14a of FIG. 3, the reflecting layer 14b of FIG. 4 consists solely of a varying-thickness portion, in which the unit semiconductors 30 have a continuously linearly varying thickness. However, the thickness of the unit semiconductors 30 of this reflecting layer 14b linearly increases from the lowermost unit semiconductor 30 having the smallest thickness T(1−DD), to the uppermost unit semiconductor 30 having the largest thickness T(1+DD). The light reflecting characteristics of the reflecting layers 14b whose number N of the unit semiconductors 30 is equal to 20 and 30 were investigated by simulation under the same condition as described above with respect to the reflecting layers 14a, by changing the thickness variation ratio DD. The results of the simulation of these reflecting layers 14b are similar to those of the reelecting layers 14a. FIG. 11 shows the light reflecting characteristic of the layer 14b whose number N and thickness variation ratio DD are equal to 20 and 0.2, respectively.

The reflecting layer 14c consists of a central iso-thickness portion 32, an upper first varying-thickness portion 34, and a lower second varying-thickness portion 36. The iso-thickness portion 32 consists of unit semiconductors 30 which all have the nominal thickness T. The first varying-thickness portion 34 formed on the iso-thickness portion 32 consists of unit semiconductors 30 whose thickness continuously linearly decreases in the direction toward the uppermost unit semiconductor 30. The second varying-thickness portion 36 on which the iso-thickness portion 32 is formed consists of unit semiconductors 30 whose thickness continuously linearly increases in the direction toward the lowermost unit semiconductor 30. Namely, the thickness of the unit semiconductors 30 of the reflecting layer 14c continuously linearly decreases from the largest thickness T(1+DD) of the lowermost unit semiconductor 30 formed first on the substrate 12, to the nominal thickness T, which is the thickness of each unit semiconductor 30 of the iso-thickness portion 32. The thickness of the reflecting layer 14c further continuously linearly decreases from the nominal thickness T down to the smallest thickness T(1−DD), which is the thickness of the uppermost unit semiconductor 30. The number of the unit semiconductors 30 of the iso-thickness portion 32 is equal to N1, while the numbers of the unit semiconductors 30 of the first and second varying-thickness portions 34, 36 are both equal to N2. Thus, the reflecting layer 14c is a modification of the reflecting layer 14a, which is obtained by forming the iso-thickness portion 32 in the middle of the entire thickness of the reflecting layer 14a.

The simulation was conducted on the reflecting layer 14c having the first and second varying-thickness portions 34, 36 whose numbers N2 are both equal to 10 (20 in total) and whose thickness varying ratio DD is 0.2. Graphs in FIGS. 12A-12H show the results of the simulation, in which the number N1 of the iso-thickness portion 32 was changed in eight steps. The light reflecting characteristic shown in FIG. 12A is that of the reflecting layer which does not have the iso-thickness portion 32 (whose number N1 is zero), i.e., that of the reflecting layer 14a whose number N and ratio DD are 20 and 0.2, respectively. It will be understood from the graphs that the reflecting layer of FIG. 12A suffers from a central wavelength area in which the reflectance is lower than the adjacent central wavelength areas, but the light reflectance characteristic of the reflecting layers 14c is gradually improved, with such central wavelength area of lower reflectance being eliminated, as the number N1 of the unit semiconductors 30 of the iso-thickness portion 32 increases. Table 3 indicates the wavelength width over which the reflectance is 80% or higher, and the wavelength width over which the reflectance is 90% or higher. The wavelength width is equal to 1 where the number N1 is zero. It will be understood from Table 3 that the reflecting layer 14c exhibits excellent light reflecting characteristic when the number N1 is 4 or larger. In this embodiment, the restriction on the number N and ratio DD as imposed on the reflecting layer 14a is considerably mitigated.

TABLE 3

| Number N1 of Iso-thickness Portion 32 | Reflectance | |
|---|---|---|
| | 80% or higher | 90% or higher |
| 0 | 1 | 1 |
| 1 | Central local wavelength area of lower than 80% (90%) reflectance | |
| 2 | 1.87 | 1 |
| 3 | 1.78 | 1 |
| 4 | 1.71 | 1.36 |
| 5 | 1.65 | 1.36 |
| 6 | 1.58 | 1.36 |

Figure 6:
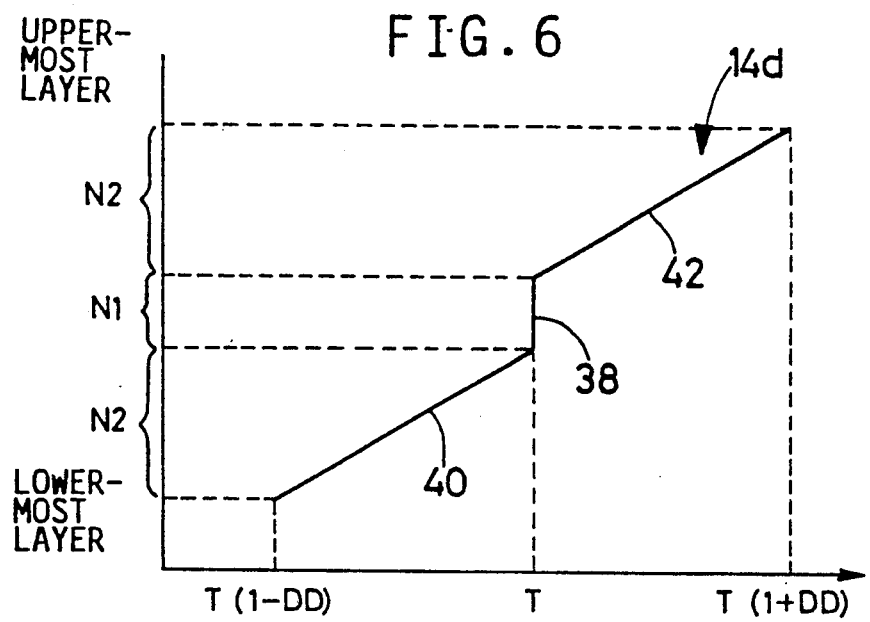

The reflecting layer 14d of FIG. 6 consists of a central iso-thickness portion 38, a lower first varying-thickness portion 40, and an upper second varying-thickness portion 42. The iso-thickness portion 38 consists of unit semiconductors 30 which all have the nominal thickness T. The first varying-thickness portion 40 on which the iso-thickness portion 38 is formed consists of unit semiconductors 30 whose thickness continuously linearly decreases in the direction toward the lowermost unit semiconductor 30. The second varying-thickness portion 42 formed on the iso-thickness portion 38 consists of unit semiconductors 30 whose thickness continuously linearly increases in the direction toward the uppermost unit semiconductor 30. Namely, the thickness of the unit semiconductors 30 of the reflecting layer 14d continuously linearly increases from the smallest thickness T(1−DD) of the lowermost unit semiconductor 30 formed first on the substrate 12, to the nominal thickness T, which is the thickness of each unit semiconductor 30 of the iso-thickness portion 38. The thickness of the reflecting layer 14d further continuously linearly increases from the nominal thickness T up to the largest thickness T(1+DD), which is the thickness of the uppermost unit semiconductor 30. The numbers of the unit semiconductors 30 of the iso-thickness portion 38 and the two varying-thickness portions 40, 42 are N1 and N2, respectively.

The simulation was conducted on the reflecting layer 14d having the first and second varying-thickness portions 40, 42 whose numbers N2 are both equal to 10 (20 in total) and whose thickness varying ratio DD is 0.2. Graphs in FIGS. 13A-13H show the results of the simulation, in which the number N1 of the iso-thickness portion 38 was changed in eight steps. It will be understood from the graphs that, like the reflecting layer 14c, the reflecting layer 14d exhibits excellent light reflecting characteristic, without a central local low-reflectance wavelength area, when the number N1 is 4 or larger.

Figure 7:
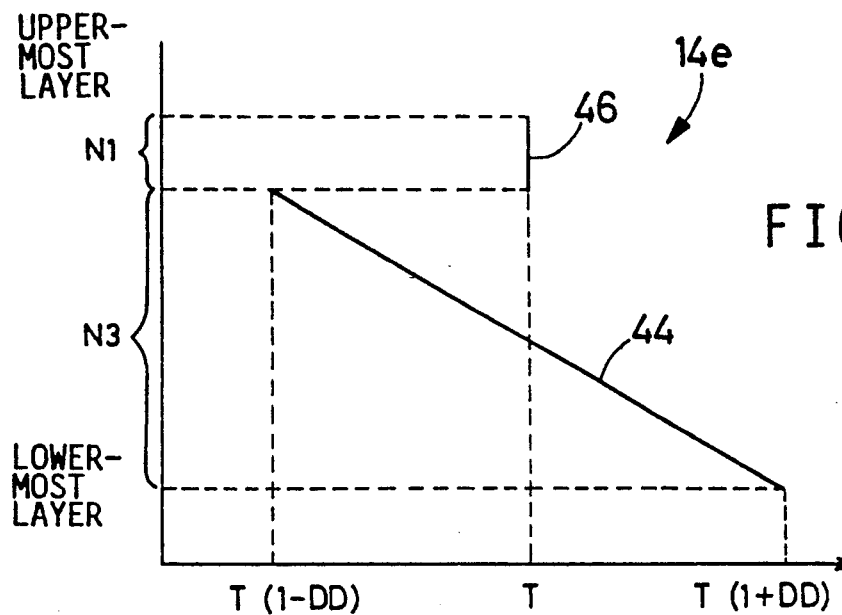

The reflecting layer 14e of FIG. 7 consists of a varying-thickness portion 44 similar to the varying-thickness portion of the reflecting layer 14a, and an iso-thickness portion 46 formed on the varying-thickness portion 44. The thickness of the unit semiconductors 30 of the varying-thickness portion 44 continuously linearly decreases in the direction from the lowermost unit semiconductor 30 toward the uppermost unit semiconductor 30. All the unit semiconductors 30 of the iso-thickness portion 46 have the nominal thickness T. The simulation was conducted to investigate the light reflecting characteristic of the reflecting layer 14e whose number N3 and ratio DD of the varying-thickness portion 44 are 20 and 0.2, respectively. FIGS. 14A-14H show the results of the simulation in which the number N1 of the iso-thickness portion 46 was changed in eight steps. It will be understood from the graphs of FIGS. 14A-14H that, unlike the reflecting layers 14c and 14d having the iso-thickness portion 32, 38, the reflecting layer 14e having the iso-thickness portion 46 suffers from deteriorated light reflecting characteristic, with a central local wavelength area of lower reflectance appearing to an increasing extent with an increase in the number N1.

Figure 8:
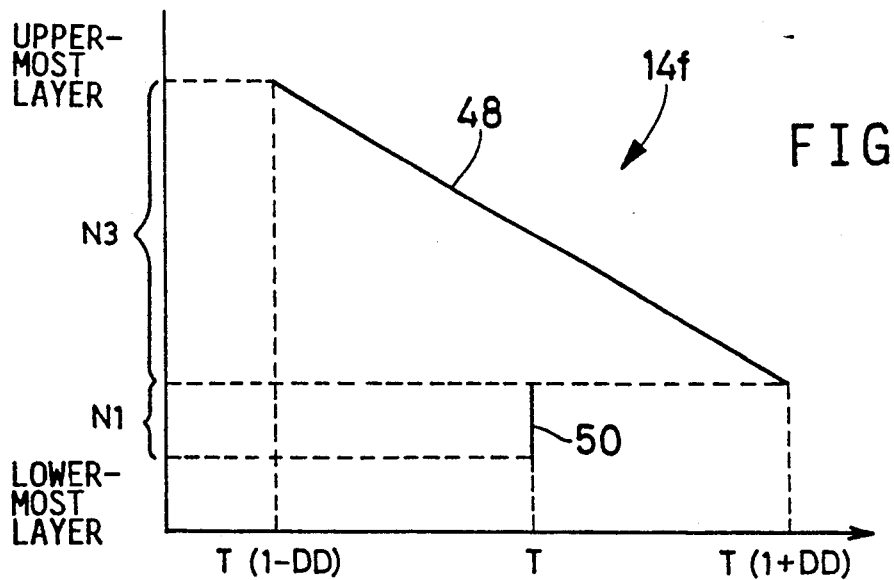

The reflecting layer 14f of FIG. 8 consists of a varying-thickness portion 48 similar to the portion 44 of the reflecting layer 14a, and an iso-thickness portion 50 which is formed on the substrate 12, unlike the iso-thickness portion 46 of the reflecting layer 14e. Results of the simulation effected on the reflecting layer 14f whose number N3 and ratio DD of the varying-thickness portion 48 are 20 and 0.2, respectively, are shown in FIGS. 15A-15H, which correspond to different values of the number N1. The results of FIGS. 15A-15H are similar to those of FIGS. 14A-14H.

While various forms of the reflecting layer 14 each having a varying-thickness portion whose unit semiconductors 30 have changing thickness values have been described above, it will be understood that the reflecting layers 14a-14d exhibit high reflectance over a wide wavelength range of the light reflected thereby, while the reflecting layers 14e and 14f whose iso-thickness portion 46, 50 does not constitute a middle portion thereof do not exhibit excellent light reflecting characteristic. In particular, the reflecting layers 14c and 14d whose iso-thickness portion 32, 38 constitutes a middle portion thereof enjoy superior light reflecting characteristic without a central local low-reflectance wavelength area, even if the amount of change of the thickness of the unit semiconductors 30 of the varying-thickness portions is comparatively large.

Figure 16:
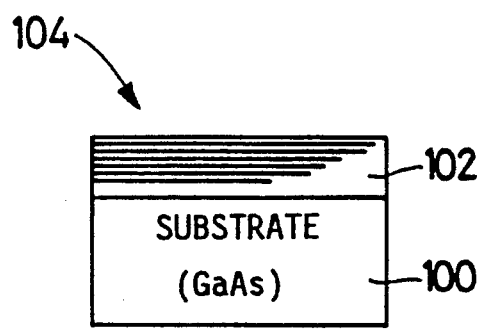
FIG. 16 is a view showing a test piece whose light reflecting characteristic of the reflecting layer is measured, for testing purpose.

There will next be considered a matching between the actually required light reflecting characteristics and the results of the simulation referred to above. To this end, a test piece 104 as shown in FIG. 16 was prepared. The test piece 104 consists of a GaAs substrate 100 and a reflecting layer 102 which consists solely of a varying-thickness portion. The reflecting layer 102 consists of 30 unit semiconductors (N=30), each consisting of an AlAs semiconductor film and an $Al_{0.2}Ga_{0.8}As$ semiconductor film. These two semiconductor films were alternately superposed on each other such that the AlAs semiconductor film of the lowermost unit semiconductor is formed on the GaAs substrate 100. The thickness of the unit semiconductors of the layer 102 continuously decreases in the direction toward the uppermost unit semiconductor, as in the reflecting layer 14a of FIG. 3, with the thickness variation ratio DD of 0.15. The thicknesses of the AlAs and $Al_{0.2}Ga_{0.8}As$ semiconductor films were determined based on the center wavelength $\lambda B$ of the light to be reflected by the layer 102, and assuming that the refractive indices of the AlAs and $Al_{0.2}Ga_{0.8}As$ semiconductor films were 2.97 and 3.47, respectively. Two specimens of the test piece 104 were prepared, one for the wavelength $\lambda B = 880$ nm, and the other for the wavelength $\lambda B = 850$ nm. In the first specimen for the wavelength $\lambda B$ 880 nm, the thickness of the AlAs semiconductor film corresponding to the nominal thickness T of the layer 102 was calculated as $880/(4 \times 2.97) = 74.1$ (nm), while the thickness of the $Al_{0.2}Ga_{0.8}As$ semiconductor film was calculated as $880/(4 \times 3.47) = 63.4$ (nm). Namely, the nominal thickness T is equal to $74.1 + 63.4 = 137.5$ (nm). In the second specimen for the wavelength $\lambda B = 850$ nm, the thickness of the AlAs semiconductor film corresponding to the nominal thickness T of the layer 102 was calculated as $850/(4 \times 2.97) = 71.5$ (nm), while the thickness of the $Al_{0.2}Ga_{0.8}As$ semiconductor film was calculated as $850/(4 \times 3.47) = 61.2$ (nm). Namely, the nominal thickness T is equal to $71.5 + 61.2 = 132.7$ (nm). It is noted that the $Al_{0.2}Ga_{0.8}As$ semiconductor film was used in place of the GaAs semiconductor film as used in the embodiment of FIGS. 1-2, in order to avoid an adverse effect of the GaAs of absorbing the incident light.

The reflecting layer 102 was formed by using an MOCVD device. While the prepared GaAs substrate 100 was maintained at 850° C. in a reaction furnace of the device, crystals of AlAs and $Al_{0.2}Ga_{0.8}As$ semiconductor films were alternately grown on the substrate 100, with appropriate material gases were alternately introduced into the furnace through a valve device. The thickness values of the individual semiconductor films were controlled by changing the gas introduction period. More specifically, the AlAs semiconductor films were formed by a $1.9 \times 10^{-5}$ mole/min. flow of TMA (trimethyl-aluminum) gas, a 400 cc/min. flow of 10% $AsH_3$ gas, and a 90 cc/min. flow of 20 ppm $H_2Se$ gas, while the $Al_{0.2}Ga_{0.8}As$ semiconductor films were formed by a $3.1 \times 10^{-5}$ mole/min. flow of TMG (trimethyl-gallium) gas, a $4.0 \times 10^{-5}$ mole/min. flow of TMA gas, a 400 cc/min. flow of 10% $AsH_3$ gas, and a 90 cc/min. flow of 20 ppm $H_2Se$ gas. Upon switching between the introduction of the material gases for each AlAs semiconductor film and the introduction of the material gases for the corresponding $Al_{0.2}Ga_{0.8}As$ semiconductor film, $AsH_3$ gas was introduced into the furnace for ten seconds.

Figure 17:
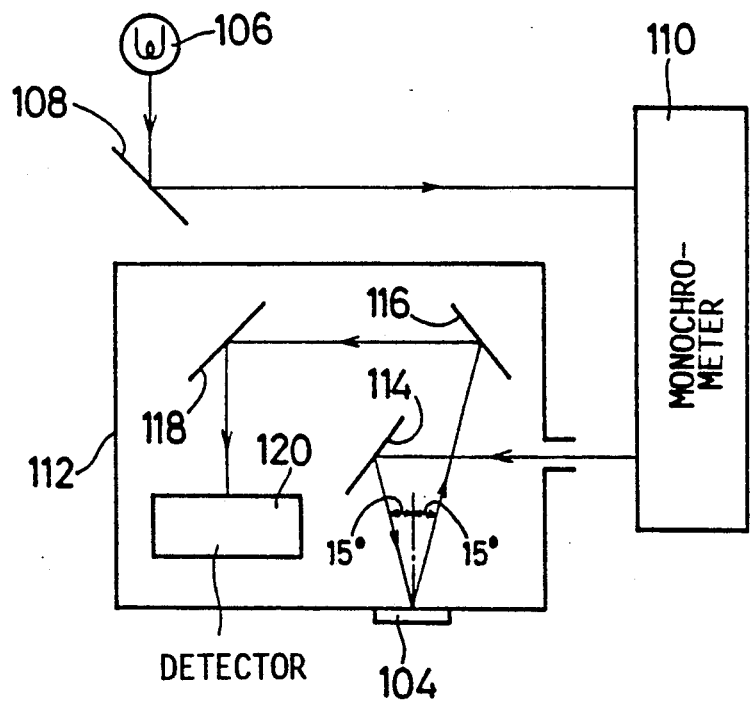
FIG. 17 is a schematic view illustrating an optical measuring apparatus for measuring the light reflecting characteristic of the test piece of FIG. 16.

The specimens of the test piece 104 thus prepared were set in a measuring apparatus as shown in FIG. 17, to measure the light reflecting characteristics of the specimens. The apparatus uses a tungsten lamp 106 for generating a radiation, which is reflected by a mirror 108 and received by a monochromator 110. The radiation is converted by the monochromator into a monochromatic radiation, which is then admitted into a black box 112. The black box 112 is adapted to admit only the monochromatic radiation from the monochromator 110. The monochromatic radiation is reflected by a mirror 114 so as to impinge upon the test piece 104. The angle of incidence of the monochromatic radiation upon the test piece 104 is about 15°. The radiation reflected by the test piece 104 is reflected by mirrors 116 and 118, and is received by a detector 120. The reflectance of the test piece 104 was determined based on the intensity of the radiation received by the detector 120, as compared with the intensity of a radiation reflected by an aluminum plate whose reflectance wa known to be 90%.

Figure 18:
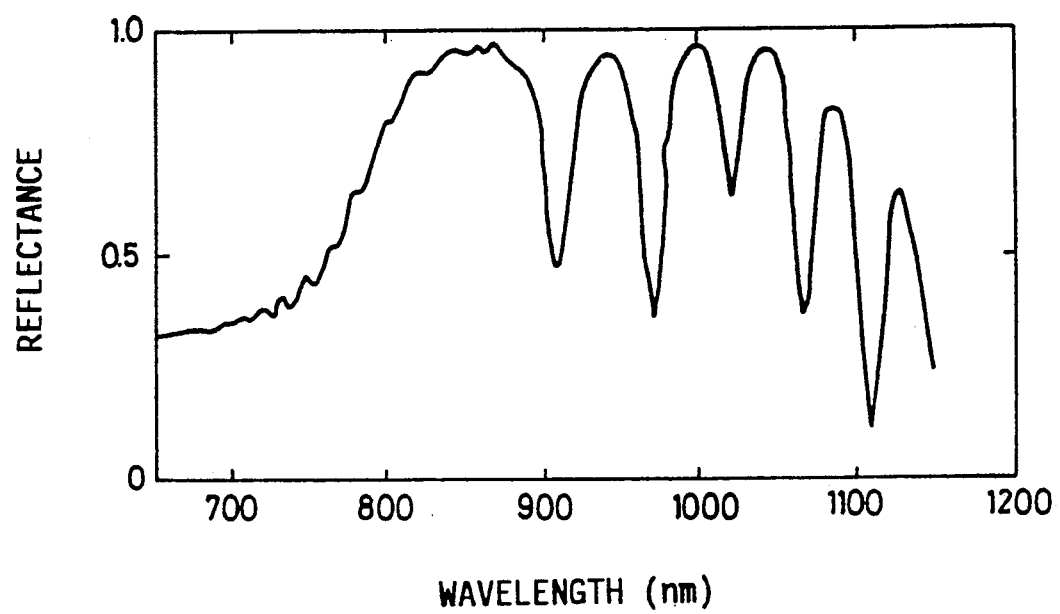
FIG. 18 is a graph indicating a result of measurement of the light reflecting characteristic of the test piece of FIG. 16, where the central wavelength of the reflected light is 880 nm.
Figure 19:
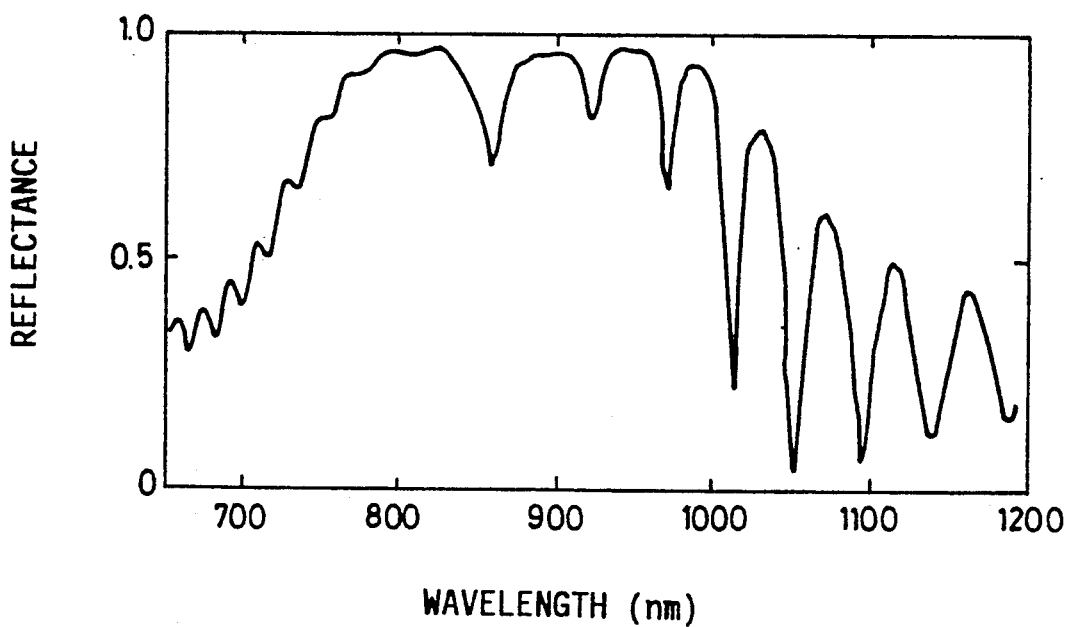
FIG. 19 is a graph indicating a result of a simulation test of the reflecting layer similar to that of the test piece of FIG. 16.

FIG. 18 shows the reflecting characteristic of the specimen for the center wavelength $\lambda B = 880$ nm, while FIG. 19 shows a result of the simulation on the specimen for the center wavelength $\lambda B = 880$ nm, wherein the specimen is placed on a GaAs material and the radiation is incident upon the specimen through the ambient air, at the incident angle normal to the plane of the specimen. The absorption of the radiation by the specimen is ignored in the simulation result of FIG. 19. A difference (about 15°) of the incident angle between the actual measurement and the simulation is considered to have substantially no influence on the results on the measurement and simulation of FIGS. 18 and 19. It will be understood from these figures that the reflecting characteristics of the measurement and simulation are highly consistent with each other. This proves sufficiently high accuracy of the simulations discussed above with respect to the reflecting layers 14a-14f.

Figure 20:
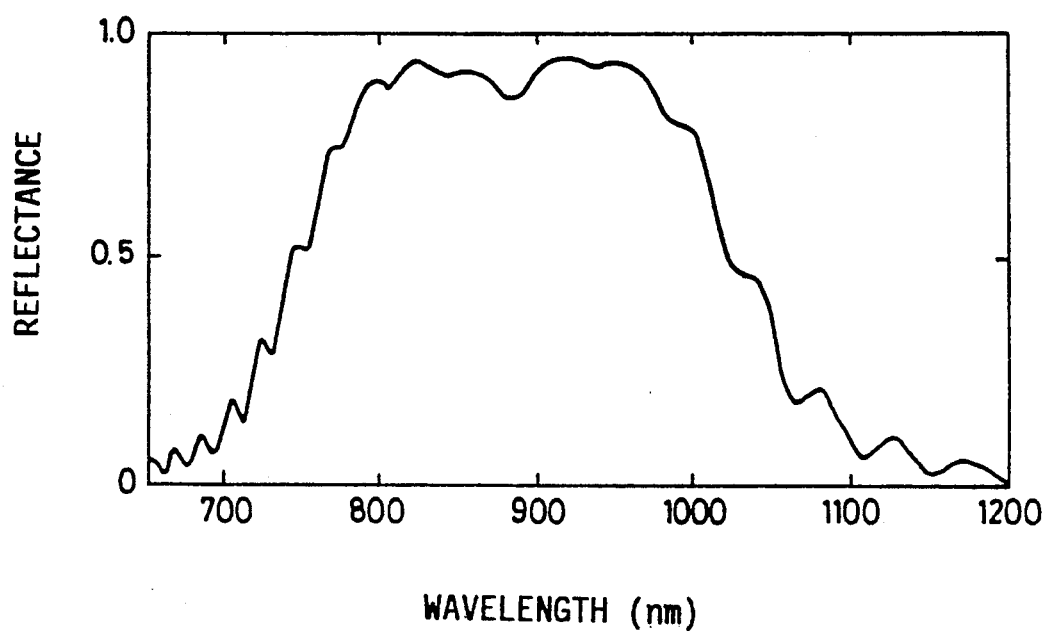
FIG. 20 is a graph indicating a result of a simulation test in which a layer of $Al_{0.45}Ga_{0.55}As$ is used as a light incident medium.

It is noted that the high-reflectance wavelength range as obtained by the simulation is more or less shifted to the short wavelength side, as compared with that as obtained by the actual measurement. This shift is considered to arise from a slight deviation of the thickness values of the AlAs and $Al_{0.2}Ga_{0.8}As$ semiconductor crystals during their growth by MOCVD, or from erroneous values of the refractive index of these semiconductor crystal films. It is also noted that the amount of the local drops of the reflectance differs between the actual measurement and the simulation. This difference is considered to be caused by the thickness errors of the semiconductor crystal films. Further, the amount of the drops of the reflectance in the central high-reflectance wavelength area is larger in the simulation of FIG. 19, than in the simulations described above. This is caused by the use of the ambient air as the medium through which the radiation is incident upon the specimen. FIG. 20 shows a spectrum obtained from the simulation in which the radiation is incident upon the specimen through Al$_{0.45}$Ga$_{0.55}$As. This spectrum is similar to that in FIG. 10F wherein the thickness variation ratio DD is 0.15.

Figure 21:
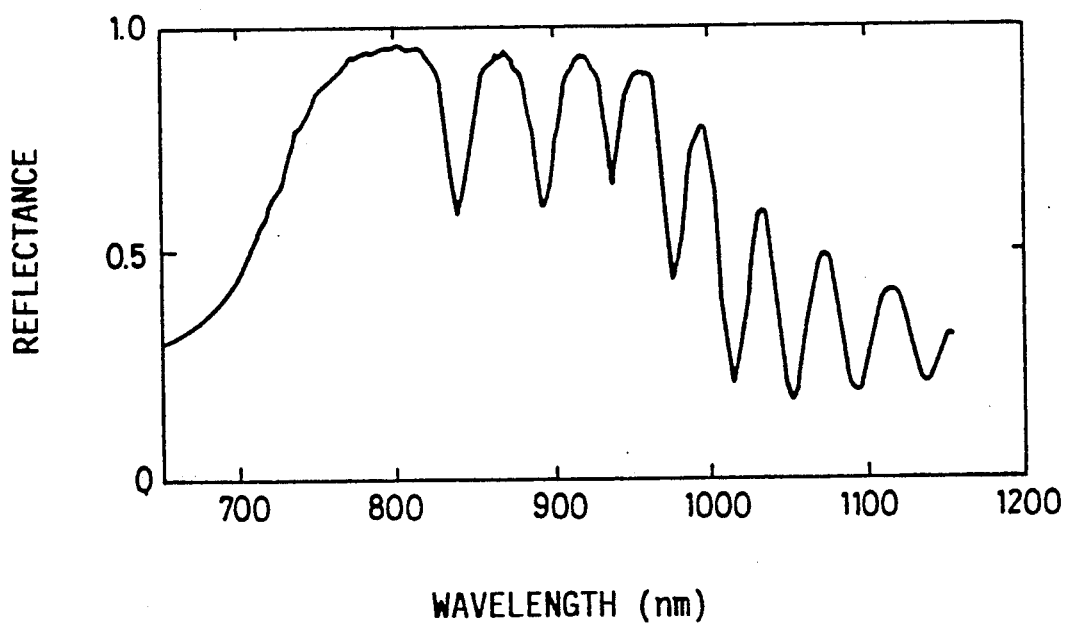
FIG. 21 is a graph indicating a result of measurement of the light reflecting characteristics of the test piece of FIG. 16, where the central wavelength of the reflected light is 850 nm.
Figure 22:
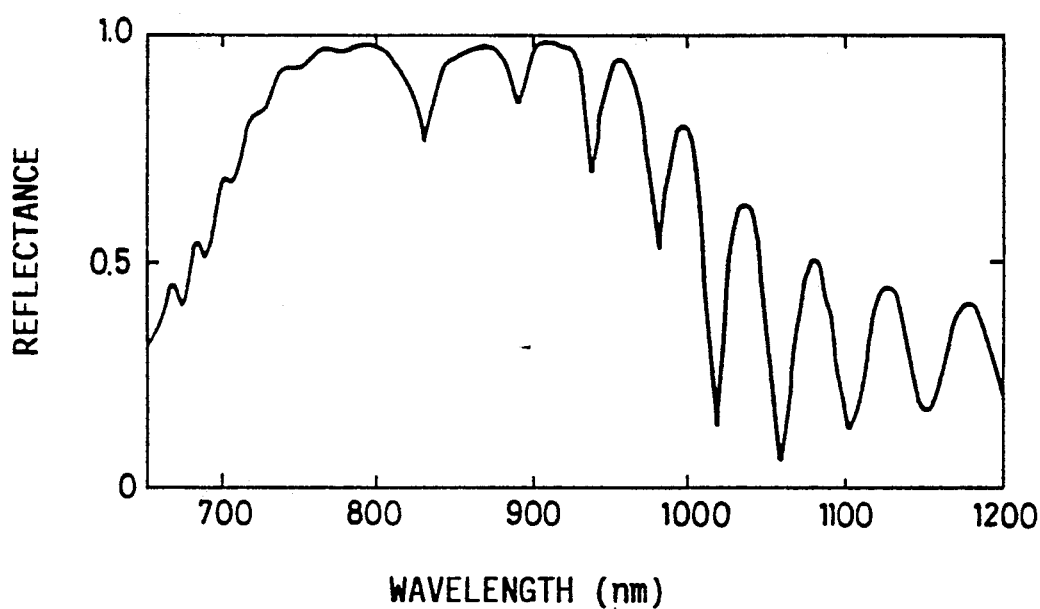
FIG. 22 is a graph indicating a result of a simulation test of the reflecting layer similar to that of the test piece of FIG. 21.

FIGS. 21 and 22 show results of the simulation on the specimens for the center wavelength λB=850 nm, which results are almost similar to those of the specimens for the center wavelength λB=880 nm.

While the surface emitting diode 10 has a double heterostructure including the p-GaAs active layer 18, the principle of the present invention associated with the reflecting layer 14 is applicable to a surface emitting diode whose double heterostructure includes an active layer of other compound semiconductor such as GaP, InP and InGaAsp. The present invention is also applicable to a surface emitting diode having a single heterostructure or a homostructure, and to a surface emitting laser.

Although the embodiment of FIGS. 1 and 2 uses the n-GaAs/n-AlAs reflecting layer 14 as described above, the compositions and thickness values of the semiconductor crystal films constituting the reflecting layer may be suitably selected depending upon the refractive indices of the crystals, and the desired wavelength of a light to be emitted by the diode.

In the surface emitting diode 10 of FIGS. 1 and 2, the light emitting surface 24 is provided as a top surface remote from the substrate 12. However, the present invention is applicable to a surface emitting diode in which the light emitting surface is provided on the substrate. In this case, the reflecting layer 14 is disposed on one side of the active layer 18 remote from the substrate 12.

While the thickness of the unit semiconductors 30 of the various forms of the reflecting layer 14 continuously linearly varies from the lowermost unit semiconductor 30 toward the uppermost unit semiconductor 30, the variation in the thickness is not necessarily linear, and may follow a smooth curve.

The illustrated reflecting layers 14c and 14d have only one iso-thickness portion 32, 38 whose unit semiconductors 30 all have the nominal thickness T. However, the reflecting layer 14 may have two or more iso-thickness portions as needed, for example, where two or more active layers for emitting lights having different wavelengths are provided. It will be understood that the nominal thickness T of each unit semiconductor 30 need not strictly correspond to the nominal wavelength of the light to be emitted, but may be determined so as to reflect light whose wavelength is in the neighborhood of the nominal wavelength.

In the illustrated forms of the reflecting layer 14 of FIGS. 3-8, the amount of the thickness variation of the reflecting layer 14 is equal to 2T·DD, which is evenly distributed on the opposite sides of the nominal thickness portion in the middle of the entire thickness of the layer 14. However, the distribution of the thickness variation amount may be asymmetric with respect to the middle of the entire thickness of the layer 14, depending upon offset amount and direction of the high-reflectance wavelength range with respect to the nominal wavelength. For instance, the reflecting layer 14c of FIG. 5 may be modified such that the number N2 and thickness variation ratio DD of the first varying-thickness portion 34 are different from those of the second varying-thickness portion 36. In a radical modification, one of the two varying-thickness portions 34, 36 is eliminated.

Although the illustrated surface emitting diode 10 is prepared by MOCVD, molecular beam epitaxy and other epitaxial crystal growth techniques may be employed to form the surface emitting diode.

Figure 23:
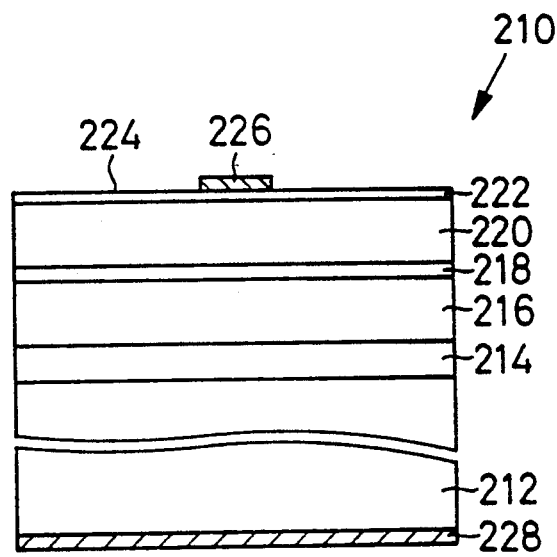
FIG. 23 is an elevational view of another embodiment of the surface emitting diode of the present invention having a light reflecting layer.
Figure 24:
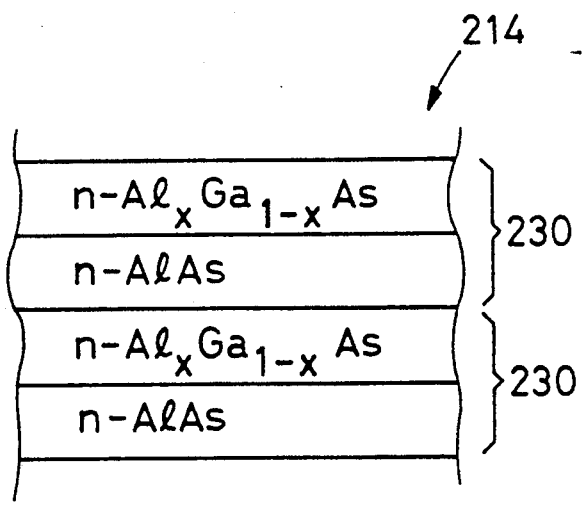
FIG. 24 is a fragmentary view for explaining the reflecting layer of FIG. 23.

Referring to FIGS. 23 and 24, there is shown another embodiment of the semiconductor device of this invention, in the form of a surface emitting diode 210 which has a n-GaAs substrate 212, and the following layers formed on the substrate 212 in the order of description: n-AlAs/n-Al$_x$Ga$_{1-x}$As reflecting layer 214; n-Al$_{0.45}$Ga$_{0.55}$As clad layer 216; p-GaAs active layer 218; p-Al$_{0.45}$Ga$_{0.55}$As clad layer 220; and p-GaAs cap layer 222. The clad layer 216, active layer 218 and clad layer 220 constitute a double heterostructure. A positive electrode 226 is formed on a part of a light emitting surface 224 which is the top surface of the cap layer 222, while a negative electrode 228 is formed over the entire area of the lower surface of the substrate 212. With a forward voltage applied to these electrodes 226, 228, the active layer 218 of the double heterostructure produces light, which is emitted from the light emitting surface 224. The reflecting layer 214 functions to reflect, by optical wave interference, a portion of the light which is produced by the active layer 218 and travels toward the substrate 212. The light reflected by the reflecting layer is also emitted from the light emitting surface 224, so that the optical output of the diode 210 is increased.

As in the first embodiment of FIGS. 1 and 2, each semiconductor element of the surface emitting diode 210 is formed by epitaxy using a MOCVD device. The layers 216, 218, 220 and 222 have approximate thickness values of 2 μm, 0.1 μm, 2 μm and 0.1 μm, respectively. The reflecting layer 214 consists of a multiplicity of unit semiconductors 230 superposed on each other, each semiconductor 230 consisting of an n-AlAs semiconductor film and an n-Al$_x$Ga$_{1-x}$As semiconductor film, as shown in FIG. 24. These two semiconductor films are alternately laminated to form the multiple unit semiconductors 230, with the n-AlAs film formed first on the substrate 212. The compositions of these semiconductor films of the unit semiconductors 230 are controlled by material gases introduced into a reaction furnace of the MOCVD device, a proportion of these gases, and a flow rate of the material gases, the Thicknesses of the semiconductor films are controlled by the flow rate of the material gases and the length of time during which the gases are introduced. It is noted that FIGS. 23 and 24 do not accurately represent the relative thickness ratios of the various semiconductor elements of the diode 10. For assuring a sufficient difference of the refractive index of the n-Al$_x$Ga$_{1-x}$As semiconductor film from that of the n-AlAs semiconductor film, it is desirable that a ratio x of Al to (Al+Ga) of the n-Al$_x$Ga$_{1-x}$As semiconductor film be held within a range of about 0-0.3.

Figure 25:
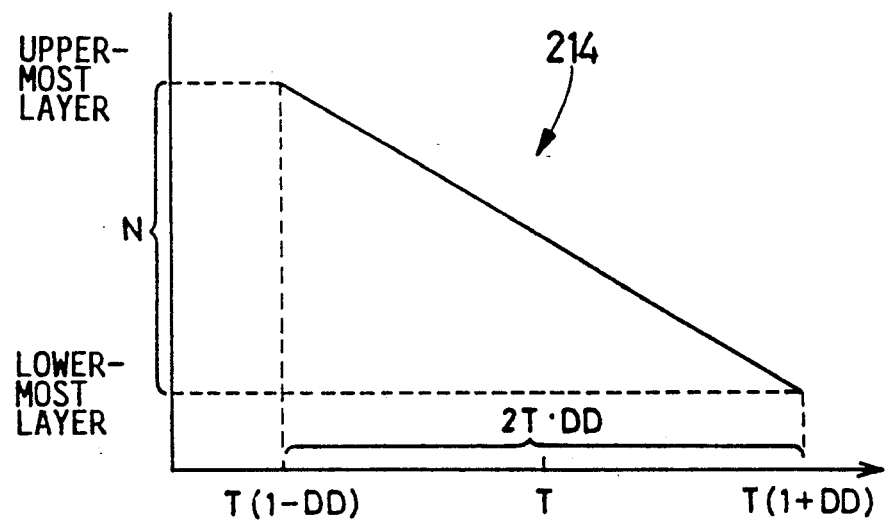
FIG. 25 view indicating a change in the thickness of unit semiconductors of the reflecting layer of FIG. 24.

As shown in FIG. 25, the thickness of the unit semiconductors 230 increases in the direction from the uppermost semiconductor 230 toward the lowermost semiconductor 230. As described above with respect to the first embodiment, the nominal thickness T is equal to a sum of the thickness T$_A$ of the n-AlAs semiconductor film obtained from the above equation (1), and the thickness T$_G$ of the n-Al$_x$Ga$_{1-x}$As obtained from the above equation (2). The thickness T$_A$ is determined by the center wavelength λB of the light to be reflected by the reflecting layer 214, and by the refractive index n$_A$ of the n-AlAs semiconductor film. The thickness T$_G$ is determined by the center wavelength λB and the refractive index $n_G$ of the n-Al$_x$Ga$_{1-x}$As semiconductor film. The thickness values of the individual unit semiconductors 230 are determined such that the unit semiconductor 230 in the middle of the entire thickness of the reflecting layer 214 has the nominal thickness $T=T_A+T_G$, and such that the thickness of the unit semiconductors 230 continuously linearly changes over a suitable range whose lower and upper limits are $T(1-DD)$ and $T(1+DD)$, where DD represents the thickness variation ratio (thickness variation/T). Namely, the thickness of the uppermost unit semiconductor 230 remote from the substrate 212 is equal to $T(1-DD)$ which is smaller by T·DD than the nominal thickness T, while that of the lowermost unit semiconductor 230 adjacent to the substrate 212 is equal to $T(1+DD)$ which is larger by T·DD by the nominal thickness T. The thickness of the unit semiconductors 230 continuously linearly decreases from the largest value of $T(1+DD)$ to the smallest value of $T(1-DD)$, in the direction from the substrate 212 toward the active layer 218. However, the ratio $T_A/T_G$ of each unit semiconductor 230 is maintained throughout the thickness of the reflecting layer 214. The total amount of variation of the thickness of the unit semiconductors 230 is equal to 2T·DD. The wavelength of light reflected by the thickest lowermost unit semiconductor 230 is equal to $\lambda B\cdot(1+DD)$, i.e., a product of $(1+DD)$ and the wavelength $\lambda B$ of light reflected by the unit semiconductor 230 having the nominal thickness T. On the other hand, the wavelength of light reflected by the thinnest uppermost unit semiconductor 230 is equal to $\lambda B\cdot(1-DD)$.

The light reflecting characteristics of the reflecting layer 214 as investigated by simulation are shown in FIGS. 26-30, where the number N of the unit semiconductors 230 is 10, 15, 20, 25 and 30, respectively. The thickness variation ratio DD was changed in seven steps (DD=0, 0.05, 0.1, 0.15, 0.2, 0.25 and 0.3). The condition of the simulation is as follows:

Ratio x=0.2 (i.e., n-Al$_{0.2}$Ga$_{0.8}$As semiconductor film)
Center wavelength $\lambda B=880$ nm
Refractive index $n_A$ of n-AlAs=2.97
Refractive index $n_G$ of n-Al$_{0.2}$Ga$_{0.8}$As=3.47
Incident angle of light: 90° (incident normal to the reflecting layer 214)
Light absorption by layer 214: Ignored
Incident medium: similar to clad layer 216 (Al$_{0.45}$Ga$_{0.55}$ semiconductor)
Opposite medium: similar to substrate 212 (n-GaAs semiconductor)

Table 4 indicates the wavelength width (nm) over which the reflectance as obtained from the simulation on the various specimens of the reflecting layer 214 is 70% or higher. Similarly, Table 5 indicates the wavelength width (nm) over which the reflectance is 90% or higher. The wavelength widths of the specimens whose ratio DD is zero are not indicated in these tables, since these specimens do not satisfy the condition required according to the principle of the present invention.

TABLE 4

| N   DD | 0.05  | 0.1   | 0.15    | 0.2     | 0.25    | 0.3     |
|--------|-------|-------|---------|---------|---------|---------|
| 10     | 88.0  | 70.2  |         |         |         |         |
| 15     | 100.5 | 94.3  | 150.9*1 | 33.1    |         |         |
| 20     | 101.9 | 156.3 | 186.1   | 221.2*3 | 49.6    |         |
| 25     | 136.5 | 168.7 | 223.3   | 277.1*1 | 310.2*3 | 55.0    |
| 30     | 135.1 | 182.8 | 246.1   | 300.6*2 | 337.0*3 | 293.6*3 |

TABLE 5

| N   DD | 0.05  | 0.1   | 0.15    | 0.2     | 0.25 | 0.3 |
|--------|-------|-------|---------|---------|------|-----|
| 10     |       |       |         |         |      |     |
| 15     | 66.2  | 31.0  |         |         |      |     |
| 20     | 81.1  | 55.8  | 0.0     |         |      |     |
| 25     | 84.8  | 119.9 | 103.4*3 | 0.0     |      |     |
| 30     | 115.2 | 138.5 | 160.5*2 | 14.5    | 0.0  |     |

In the above tables, numerical values with "*1" attached represent the wavelength width (nm) having a small local area or areas within which the reflectance is lower than 70% or 90%. Numerical values with "*2" represent the wavelength width having a relatively large local area or areas within which the reflectance is lower than 70% or 90%. Numerical values with "*3" represents the wavelength width having a considerably large local area or areas within which the reflectance is lower than 70% or 90%. Numerical values without an asterisk represent the wavelength width within which the reflectance is not lower than 70% or 90%.

In Tables 4 and 5, the wavelength widths indicated in the zone below and to the left of a single solid line satisfy the following equations (3) and (4):

$$N \geq 10+25x \quad (3)$$

$$N \geq 100DD+(100x-10)/2 \quad (4)$$

Since the ratio x is equal to 0.2, the wavelength widths in the lower left zones of the tables satisfy $N\geq 15$ and $N\geq 100DD+5$. In the case of Table 4 indicating the wavelength range in which the reflectance is 70% or higher, the wavelength widths in the lower left zone are about 100 nm or larger and do not include large low-reflectance areas. In other words, the combinations of the number N and the thickness variation ratio DD which correspond to the lower left zone of Table 4 permit the reflecting layer 214 to have a sufficiently large wavelength range of the reflected light and a practically high level of reflectance percentage. For minimizing the number N of the unit semiconductors 230 while maintaining a sufficiently large wavelength range of the reflected light, it is desirable to hold the ratio DD within a range between 0.1 and 0.15, and the number N within a range between about 20 and about 30.

In the case of Table 5 indicating the wavelength range in which the reflectance is 90% or higher, the wavelength widths (nm) are generally smaller than those in Table 4, and there exist considerably large low-reflectance areas in general. To assure such high reflectance level (90% or higher) over a sufficiently wide wavelength area, the number N and ratio DD are desirably selected according to the following equations (5) and (6). A zone of the table which is below and to the left of the double solid line correspond to the combinations N and DD which satisfy these equations (5) and (6).

$$N \geq 15 \quad (5)$$

$$N \geq 200DD + (100x - 20)/2 \quad (6)$$

Tables 6 and 7 indicate the wavelength widths(nm) as investigated by simulation on the reflecting layer 214 where the ratio x of the n-AlGaAs semiconductor film is zero, that is, where each unit semiconductor 230 consists of an n-AlAs semiconductor film and an n-AlGaAs semiconductor film. The condition of the simulation is the same as those of Table 3 and 4. Table 6 and 7 correspond to Table 4 and 5, namely, the lower reflectance values of 70% and 90%, respectively. A zone of Table 6 which is below and to the left of the single solid line satisfies the above equations (3) and (4), that is, $N \geq 10$, and $N \geq 100DD - 5$, where the ratio x is 0. In the case of Table 6 for the 70% or higher reflectance, the wavelength widths in the lower left zone are about 100 nm or larger, within which there exist relatively small low-reflectance areas, as in the case of Table 4. The combinations of N and DD corresponding to the above zone thus assure practically satisfactory wavelength width and sufficiently high reflectance of the reflecting layer 214. In the case of Table 7 for the 90% or higher reflectance, the wavelength widths are generally smaller than those in Table 6, and there exist relatively large low-reflectance areas within the wavelength widths indicated, as in the case of Table 5. To assure sufficiently high reflectance over a sufficiently large wavelength width, the number N and ratio DD are desirably selected so as to satisfy the above equations (5) and (6), as indicated in the zone of Table 7 which is below and to the left of the double solid line.

Thus, the ratio x of the $Al_xGa_{1-x}As$ semiconductor film of each unit semiconductor 230, the number N of the unit semiconductors 230 and the thickness variation ratio DD of the reflecting layer 214 are determined so as to satisfy the above equations (3) and (4), for permitting the reflecting layer 214 to be practically satisfactory in terms of the wavelength width of the reflected light and the reflectance value. By suitably determining the combination of the number N and the ratio DD, the ratio x may be changed as desired. To reduce the cost of manufacture, the number N is minimized by suitably selecting the combination x and DD.

TABLE 6

| N \ DD | 0.05 | 0.1 | 0.15 | 0.2 | 0.25 | 0.3 |
|---|---|---|---|---|---|---|
| 10 | 122.7 | 114.4 | 87.4 | 0.0 | | |
| 15 | 124.5 | 155.8 | 197.9 | 223.8*2 | 222.9*3 | |
| 20 | 139.9 | 179.3 | 238.4 | 277.8 | 333.0*2 | |
| 25 | | | | | | |
| 30 | 149.7 | 212.8 | 267.9 | 335.7 | 394.0 | |

TABLE 7

| N \ DD | 0.05 | 0.1 | 0.15 | 0.2 | 0.25 | 0.3 |
|---|---|---|---|---|---|---|
| 10 | 41.6 | 0.0 | 0.0 | | | |
| 15 | 99.6 | 79.2 | 0.0 | 0.0 | | |
| 20 | 106.4 | 137.9 | 143.8 | 25.6 | 0.0 | |
| 25 | | | | | | |
| 30 | 137.9 | 178.5 | 206.9 | 250.2*1 | 291.6*3 | |

For 90% or higher reflectance over a wide wavelength range, the ratio x, number N and ratio DD are desirably selected so as to satisfy the above equations (5) and (6).

Accuracy and reliability of the simulation in the present embodiment can also be proved by a test similar to the test as described with respect to the first embodiment by reference to FIGS. 16-22.

The n-AlAs/n-$Al_xGa_{1-x}As$ reflecting layer 214 in the above embodiment of FIGS. 23 and 24 may be replaced by an n-$Al_xGa_{1-x}As$/n-$Al_yGa_{1-y}As$ reflecting layer. In this case, the thickness $T_A$ of the n-$Al_yGa_{1-y}As$ semiconductor film is determined so as to satisfy the above equation (1), while the thickness $T_B$ of the n-$Al_xGa_{1-x}As$ semiconductor film is determined so as to satisfy the above equation (2). For example, the n-$Al_xGa_{1-x}As$ semiconductor film is an n-$Al_{0.1}Ga_{0.9}As$ film, while n-$Al_yGa_{1-y}As$ semiconductor film is an n-$Al_{0.9}Ga_{0.1}As$ film. In this case, the thickness of the n-$Al_{0.1}Ga_{0.9}As$ film is smaller than that of the n-$Al_{0.2}Ga_{0.8}As$ film of the preceding embodiment, by an amount proportional to an increase in the amount of Ga from 0.8 to 0.9, and the thickness of the n-$Al_{0.9}Ga_{0.1}As$ film is smaller than that of the AlAs film of the preceding embodiment, by an amount proportional to an increase in the amount of Ga from 0 to 0.1. The number N, ratio DD, ratio x of the n-$Al_xGa_{1-x}As$ semiconductor film and ratio y of the n-$Al_yGa_{1-y}As$ semiconductor film are determined according to the above equations (7) and (8), and preferably according to the above equations (5) and (9).

The surface emitting diode 210 in the present second embodiment of FIGS. 23 and 24 has a double heterostructure using the p-GaAs active layer 218, the above aspect of the invention associated with the ratio x, number N and ratio DD is applicable to a surface emitting diode or semiconductor laser which has a double or single heterostructure or a homostructure using other compound semiconductor.

The nominal thickness T of each unit semiconductor 230 of the reflecting layer 214 need not strictly correspond to the wavelength of a radiation produced by the active layer 218, and the center wavelength λB of the light to be reflected by the layer 214 may be selected in the neighborhood of the wavelength of the light produced by the active layer.

In the illustrated examples of Tables 4-7, the number N is 30 or smaller, and the thickness variation ratio DD is 0.3 or lower, with the ratio x being 0.2 or 0. However, the above aspect of the invention is applicable to the reflecting layer 214 wherein the number N and ratio DD as well as the ratio x take any other values as desired.

In the embodiment of FIGS. 23 and 24, the thickness of the unit semiconductors 230 decreases in the direction from the substrate 212 toward the active layer 218, the thickness values of the semiconductors 230 may be determined such that the thickness increases in the direction toward the active layer 218, where the wavelength of the light produced by the active layer is larger than 880 nm as in a surface emitting diode using InGaAs active layer, where if the ratio x of the $Al_xGa_{1-x}As$ semiconductor film of the unit semiconductor 230 is 0.5 or larger and the absorption of light by the reflecting layer is almost negligible, even if the wavelength of the incident light is about 880 nm.

The surface emitting diode 210 can also be fabricated by epitaxy such as molecular beam epitaxy, as well as by MOCVD.

Referring to FIGS. 31-34, there is shown a surface emitting diode 310, which does not have a buffer layer as provided in the diode 10 of FIG. 1. The diode 310 has an n-GaAs substrate 312, and the following layers formed on the substrate 312 in the order of description: n-AlAs/n-GaAs reflecting layer 314; n-$Al_{0.45}Ga_{0.55}As$ clad layer 316; p-GaAs active layer 318; p-$Al_{0.45}Ga_{0..55}As$ clad layer 320; and p-GaAs cap layer 322. The clad layer 316, active layer 318 and clad layer 320 constitute a double heterostructure. The cap layer 322 has a top surface which serves as a light emitting surface 324, on which a positive electrode 326 is formed. A negative electrode 328 in the form of a layer is formed on a lower surface of the substrate 312. With a forward voltage applied between the electrodes 326, 328, the active layer 318 of the double heterostructure produces light, which is emitted from the light emitting surface 324 of the cap layer 322. The reflecting layer 314 is provided for achieving the same function as described above with respect to the reflecting layers 14, 214.

Figure 32:
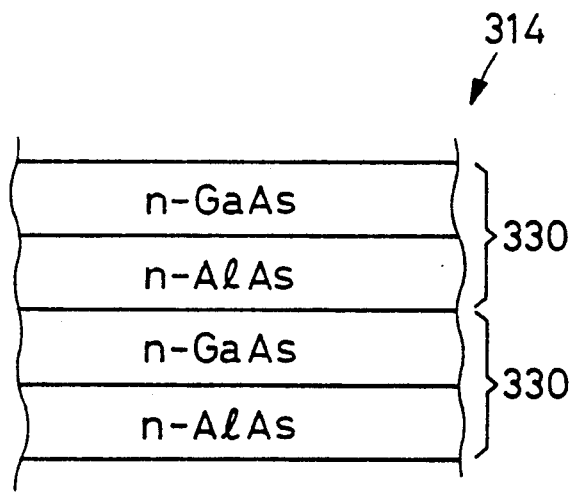
FIG. 32 is a fragmentary view showing the reflecting layer of the diode of FIG. 31.

The layers 316, 318, 320 and 322 formed by MOCVD have the same thickness values as the layers 16, 18, 20 and 22 of FIG. 1. The reflecting layer 314 consists of a multiplicity of unit semiconductors 330 superposed on each other. Like the unit semiconductor 30, each unit semiconductor 330 consisting of an n-AlAs semiconductor film and an n-GaAs semiconductor film, as shown in FIG. 32. These two semiconductor films are alternately laminated, with their thickness values being determined depending upon the wavelength range (880±35 nm) of the light produced by the active layer 318. The compositions and thicknesses of these semiconductor films of the unit semiconductors 330 are controlled by the MOCVD conditions as described above.

Figure 33:
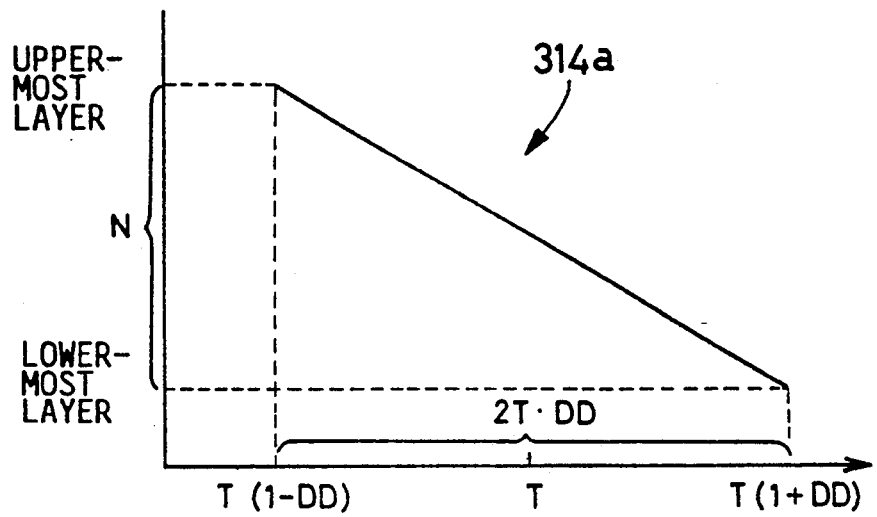
FIG. 33 is a view indicating a change in the thickness of unit semiconductors of one form of the reflecting layer of FIG. 32.
Figure 34:
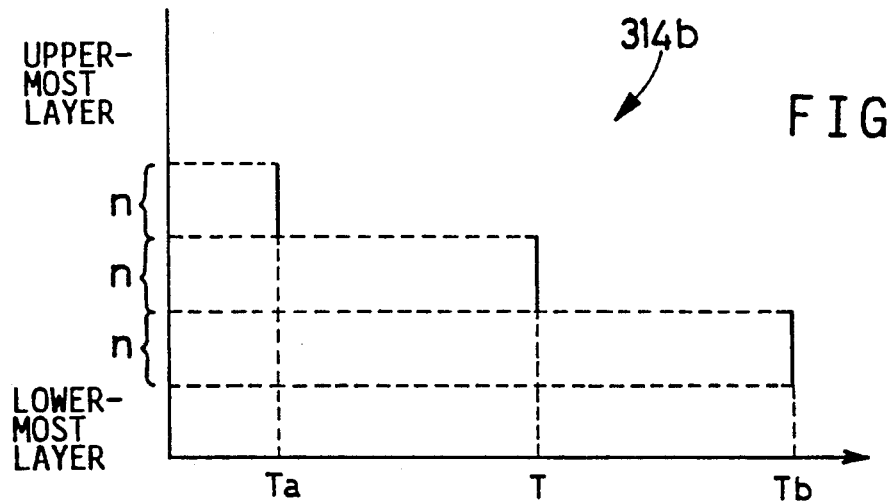
FIG. 34 is a view indicating a change in the thickness of unit semiconductors of another form of the reflecting layer of FIG. 32.

Two forms of the reflecting layer 314 are shown at 314a and 314b in FIGS. 33 and 34. The thickness values of the individual unit semiconductors 330 are determined based on the nominal thickness $T = T_A + T_G$ according to the above equations (1) and (2), where the wavelength λB is 880 nm. $T_A$ represents the thickness of the n-AlAs semiconductor film, while $T_G$ represents the thickness of the n-GaAs semiconductor film. The ratio $T_A/T_G$ is maintained at a predetermined value, for all the unit semiconductors 330.

The reflecting layer 314a of FIG. 33 is identical with the reflecting layer 14a of FIG. 3, in that the thickness of the unit semiconductors 30 continuously linearly decreases from the largest value of $T(1+DD)$ of the lowermost semiconductor 330 formed directly on the substrate 312, to the smallest value $T(1-DD)$ of the uppermost semiconductor 330 which is nearest to the active layer 318.

Figure 35A:
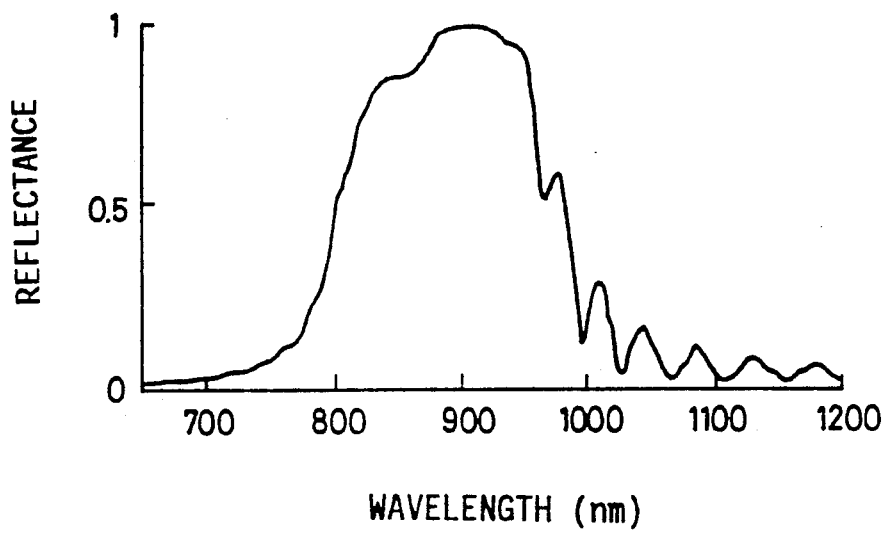
FIG. 35A is a graph indicating a light reflecting characteristic of the reflecting layer of FIG. 33, where the number N of unit semiconductors and the thickness variation ratio DD are equal to 30 and 0.05, respectively.
Figure 35B:
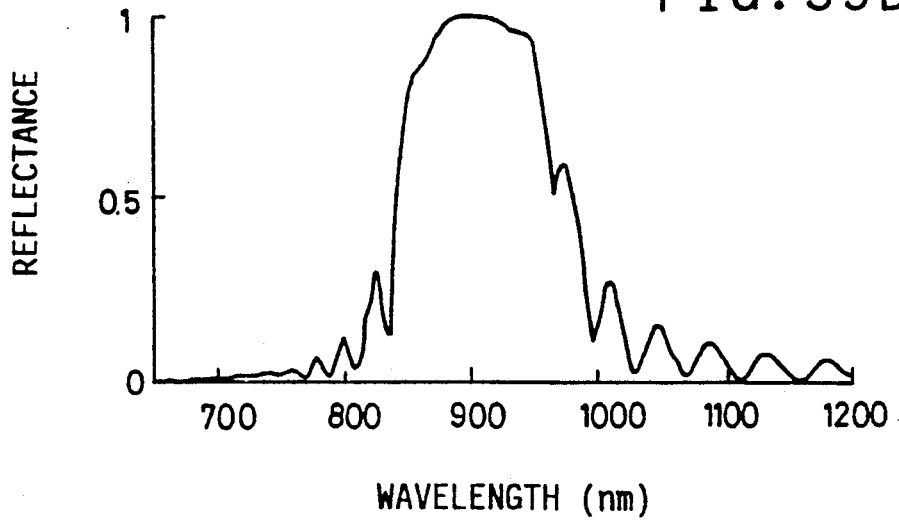
FIG. 35B is a graph similar to that of FIG. 35A, of a reflecting layer of FIG. 39.
Figure 39:
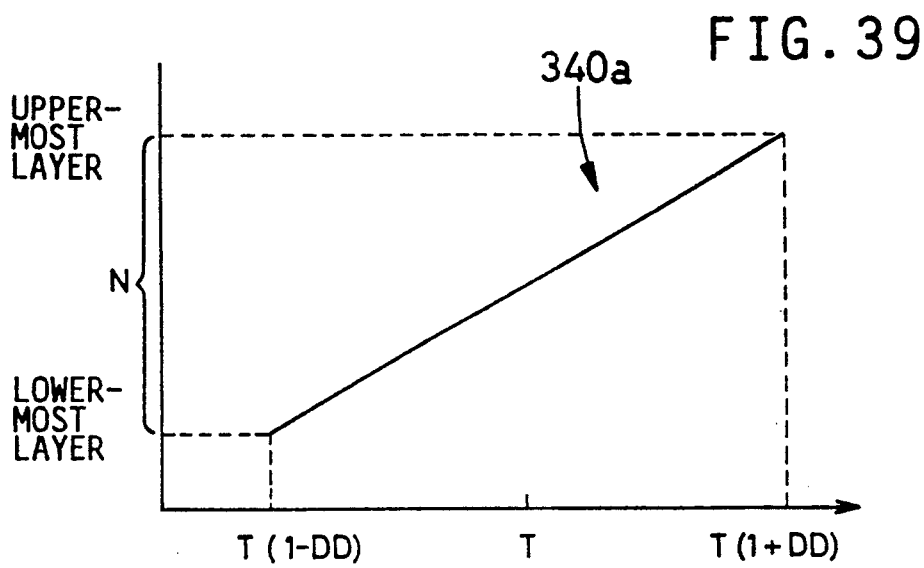
FIG. 39 is a view similar to that of FIG. 38, in which the direction of variation in the thickness of the unit semiconductors is opposite to that in FIG. 33.

The light reflecting characteristic of the reflecting layer 314a of FIG. 33 as investigated by simulation is shown in FIG. 35A. The simulation is effected on the reflecting layer 314a wherein the number N of the unit semiconductors 330 is 30, and the thickness variation ratio DD is 0.05 so that the wavelengths of the light reflected by the lowermost and uppermost unit semiconductors 330 are (880 nm + 44 nm), and (880 nm − 44 nm), respectively. For comparison, FIG. 35B shows the light reflecting characteristic of a reflecting layer 340a of FIG. 39 wherein the thickness of the unit semiconductors 330 increases from the smallest thickness value of the lowermost unit semiconductor 330 to the largest thickness value of the uppermost unit semiconductor 330. In the simulation, light was incident upon the reflecting layer 314a, 340a, in a direction normal to the plane of the layer, and the absorption of light by the reflecting layer was taken into account. The incident medium through which the light was incident upon the reflecting layer 314a, 340a is $Al_{0.45}Ga_{0.55}As$ (same material as the clad layer 316), while the medium on the other side of the reflecting layer is n-GaAs (same material as substrate 312). It will be understood from FIGS. 35A and 35B that the reflecting layer 314a is improved over the reflecting layer 340a, in its reflectance value at comparatively short wavelengths, and the wavelength range of the light reflected by the layer 314a encompasses the wavelength range of 880±35 nm of the incident light.

Figure 36A:
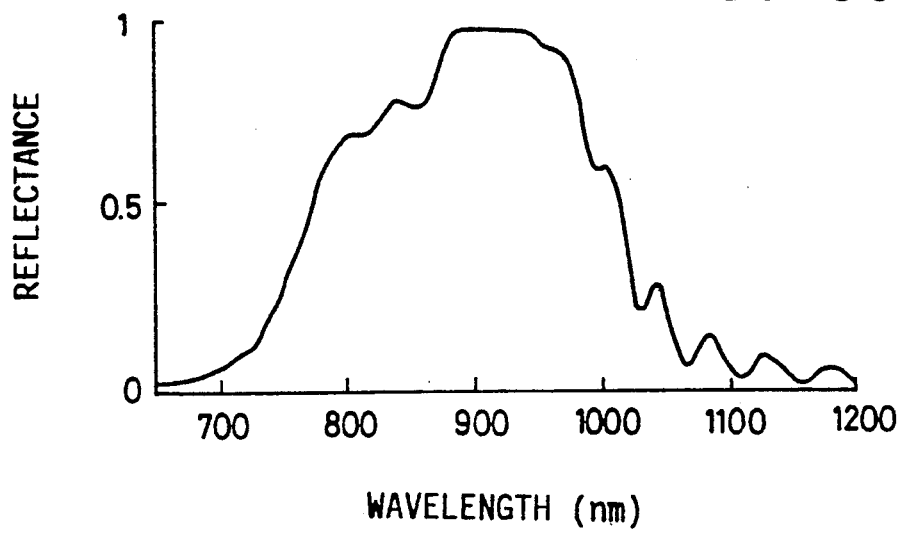
FIG. 36A is a graph similar to that of FIG. 35A, where the number N and the ratio DD are equal to 30 and 0.1, respectively.
Figure 36B:
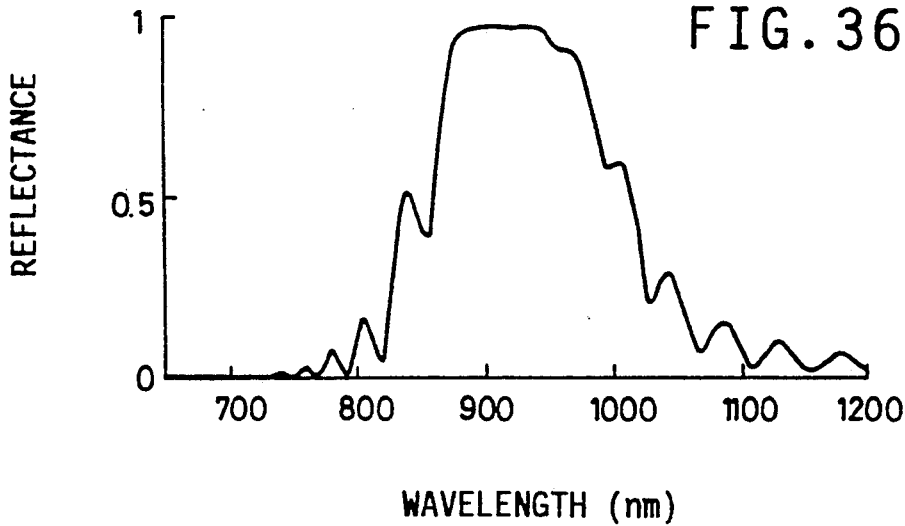
FIG. 36B is a graph similar to that of FIG. 36A, of the reflecting layer of FIG. 39.

FIG. 36A shows the light reflecting characteristic of the reflecting layer 314a as investigated by simulation in which the number N of the unit semiconductors 330 is 30, and the thickness variation ratio DD is 0.1 so that the wavelengths of the light reflected by the lowermost and uppermost unit semiconductors 330 are (880 nm + 88 nm), and (880 nm − 88 nm), respectively. For comparison, FIG. 36B shows the light reflecting characteristic of the reflecting layer 340 of FIG. 39 in which the number N and ratio DD are 30 and 0.1, respectively. In this case, too, the reflecting layer 314a is improved over the reflecting layer 340a, in its reflectance value at comparatively short wavelengths.

Figure 37A:
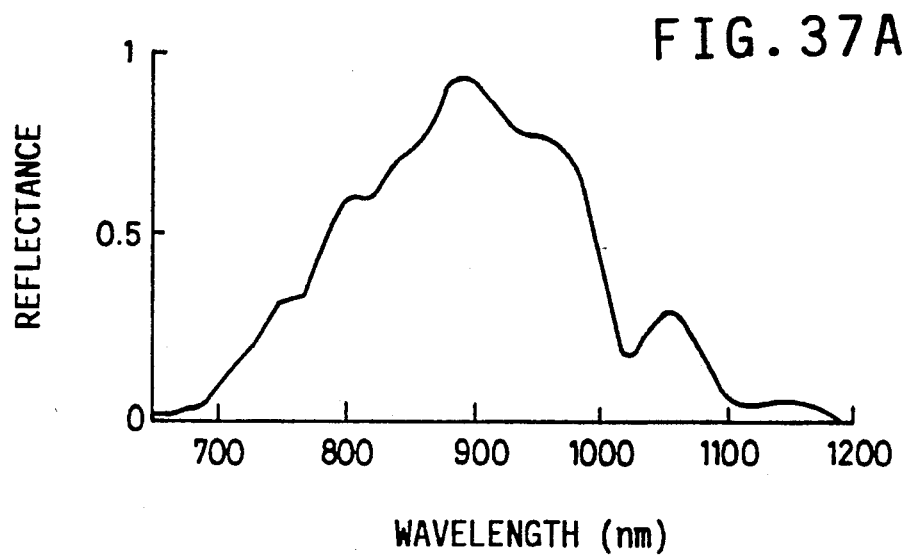
FIG. 37A is a graph indicating a light reflecting characteristic of the reflecting layer of FIG. 34.
Figure 37B:
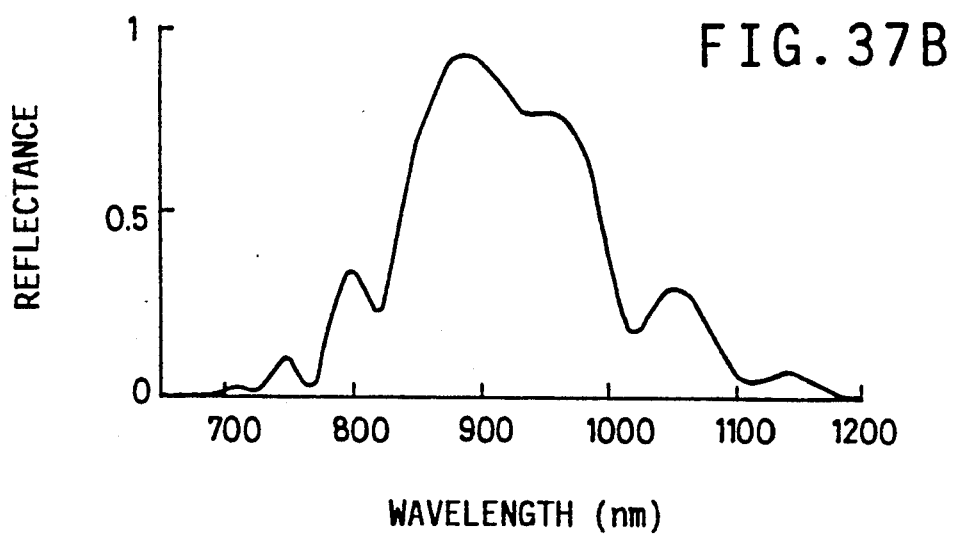
FIG. 37B is a graph similar to that of FIG. 37A, of a reflecting layer of FIG. 40.
Figure 40:
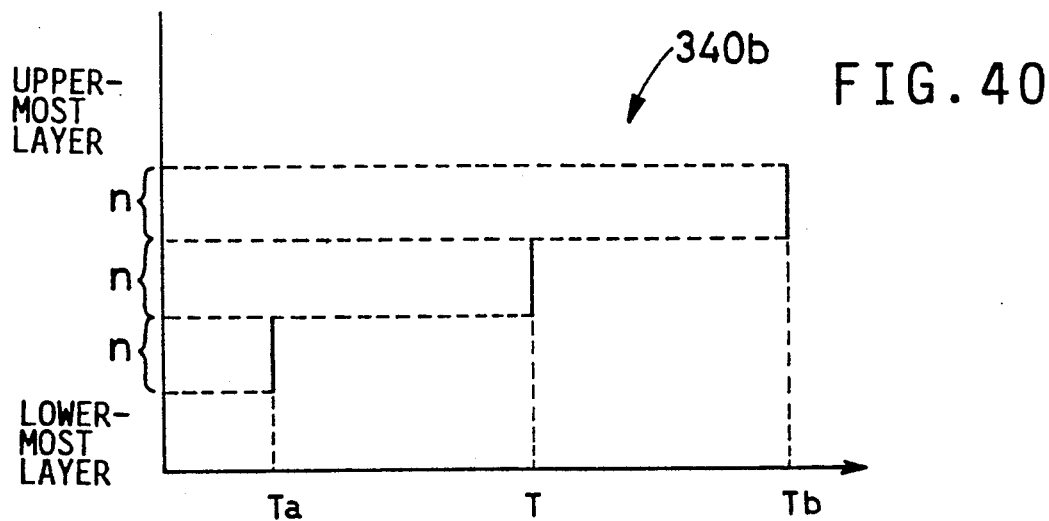
FIG. 40 is a view similar to that of FIG. 38, in which the direction of the thickness variation is opposite to that in FIG. 34.

The reflecting layer 314b of FIG. 34 consists of three iso-thickness portions each consisting of a predetermined number n of unit semiconductors 330. Each unit semiconductor 330 of the middle iso-thickness portion has a thickness equal to the nominal thickness T. The thickness of each unit semiconductor 330 of the lower iso-thickness portion is equal to Tb which is larger than the nominal thickness T, while the thickness of each unit semiconductor 330 of the upper iso-thickness portion is equal to Ta which is smaller than the nominal thickness T. FIG. 37A shows the light reflecting layer 314b as investigated by the simulation in which the number n is 5, and the thickness Tb is equal to T·(950/880) for reflecting 950 nm light, while the thickness Ta is equal to T·(800/880) for reflecting 800 nm light. For comparison, FIG. 37B shows the light reflecting characteristic of a reflecting layer 340b of FIG. 40 in which the thickness of the unit semiconductors 330 of the upper iso-thickness portion is equal to Tb, which is larger than the thickness Ta of the unit semiconductors 330 of the lower iso-thickness portion. It will be understood from FIGS. 37A and 37B that the reflecting layer 314b is improved over the reflecting layer 340b, in the reflectance value at comparatively short wavelengths.

In the surface emitting diode 310 according to the present embodiment of FIGS. 31-34, the thickness of the unit semiconductors 330 of the reflecting layer 314 decreases continuously or in steps in the direction from the substrate 312 toward the active layer 218. Namely, the thickness of the unit semiconductors 330 is smaller on the side of the light incidence upon the layer 314, than on the side remote from the side of the light incidence. According to this arrangement, the comparatively short wavelengths are reflected by the unit semiconductors 330 on the side of the light incidence, whereby the absorption of the incident light by the reflecting layer 314 is avoided, to thereby improve the reflectance value. Although the comparatively long wavelengths are reflected by the unit semiconductors 330 relatively remote from the incident surface of the layer 314, the reflectance will not be reduced since the long wavelengths are not absorbed by the layer 314. Thus, the present embodiment is effective to improve the reflectance with respect to the comparatively short wavelengths, without influencing the reflectance with respect to the comparatively long wavelengths, whereby the optical output of the surface emitting diode 310 is increased, with sufficiently high reflectance of the reflecting layer 314 over a wide wavelength range.

Since the unit semiconductors 330 having relatively small thickness values are provided only on the light incidence side of the reflecting layer 314, the layer 314 can be comparatively easily formed with high stability in the light reflecting characteristic, without conventionally experienced deterioration of the optical wave interference effect due to difficult control of the ratio x of n-Al$_{0.2}$Ga$_{0.8}$As semiconductor film if used in place of n-GaAs film for each unit semiconductor 330, for avoiding the absorption of the incident light from the active layer 318. While the n-Al$_{0.2}$Ga$_{0.8}$As semiconductor film whose light absorbing lower limit of wavelength λc is shorter than the wavelength range of the active layer 318 is effective to prevent the reflecting layer from absorbing the incident light, the difficulty of controlling the ratio x tends to cause fluctuation of the refractive index of the n-Al$_{0.2}$Ga$_{0.8}$As semiconductor film, or an insufficient difference of the refractive index of that film from that of the n-AlAs semiconductor film.

Figure 38:
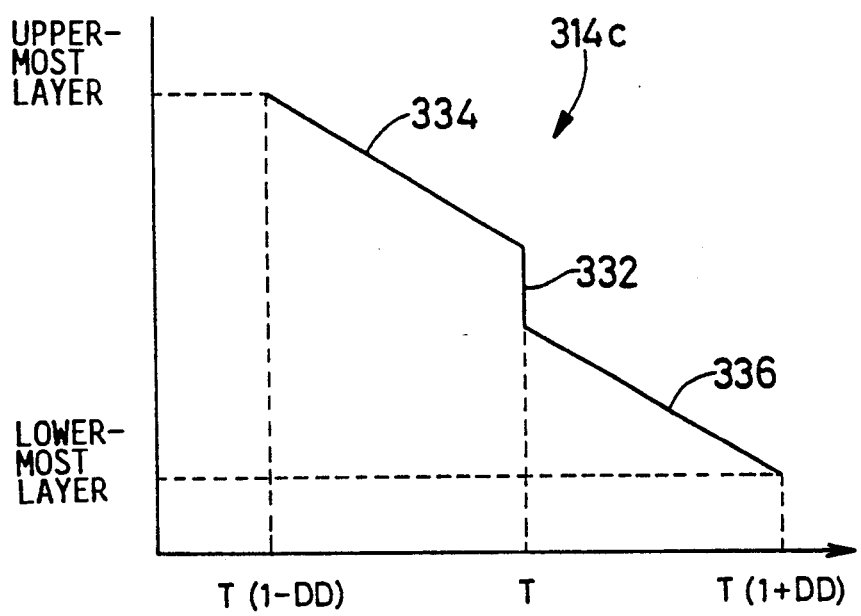
FIG. 38 is a view indicating a change in the thickness of unit semiconductors of a further form of the reflecting layer of FIG. 32.

The thickness of the unit semiconductors 330 of the reflecting layer 314a of FIG. 33 continuously varies, while the thickness of the unit semiconductors 330 of the reflecting layer 314b of FIG. 34 varies in steps. However, the reflecting layer 314a, 314b may be replaced by a reflecting layer 314c as shown in FIG. 38. The reflecting layer 314c consists of an iso-thickness portion 332, and a first and a second varying-thickness portion 334, 336 formed on opposite sides of the iso-thickness portion 332. The iso-thickness portion 332 consists of unit semiconductors 330 which all have the nominal thickness T. The first varying-thickness portion 334 is formed on the upper side of the iso-thickness portion 332 and consists of unit semiconductors 330 whose thickness continuously linearly decreases from the nominal thickness T in the direction from the iso-thickness portion 332 toward the uppermost unit semiconductor 330 of the layer 314c. The second varying-thickness portion 336 is formed on the lower side of the iso-thickness portion 332 and consists of unit semiconductors 330 whose thickness continuously linearly increases from the nominal thickness T in the direction toward the lowermost unit semiconductor 330 of the layer 314c.

While the surface emitting diode 310 has a double heterostructure including the p-GaAs active layer 318, Gap, InP, InGaAsp and other compound semiconductor may be used for the active layer, to form a double or single heterostructure or a homostructure, for providing a desired semiconductor device such as a surface emitting diode and a semiconductor laser, which is provided with the reflecting layer 314.

While each unit semiconductor 330 of the illustrated reflecting layer 314 consists of the n-GaAs and n-AlAs semiconductor films, the semiconductor materials, compositions and thickness values of the semiconductor films of the unit semiconductors 330 may be suitably selected depending upon the refractive indices of the semiconductor materials, wavelength of the light produced by the active layer 318, and other parameters.

The surface emitting diode 310 has the light emitting surface 324 on the cap layer 322 remote from the substrate 312, the light emitting surface may be provided on the substrate 312.

The thickness of the unit semiconductors 330 of the reflecting layer 314a of FIG. 33 linearly changes along a straight line, the thickness may change along a smooth curve.

Although the reflecting layer 314c has only one iso-thickness portion 332 consisting of unit semiconductors 330 which all have the nominal thickness T, the reflecting layer 314c may have two or more iso-thickness portions, for example, when the semiconductor device has two or more active layers for producing different wavelengths of light. The nominal thickness T does not necessarily strictly correspond to the nominal wavelength of the light produced by the active layer 318, but may be determined so as to reflect light whose wavelength is in the neighborhood of the nominal wavelength.

In the reflecting layers 314a and 314c, the amount of variation in the thickness of the unit semiconductors 330 is equal to ±T·DD which is evenly distributed on both sides of the thickness center of the layer. However, the thickness variation amount may be asymmetric with respect to the thickness center of the layer 314a, 314c, where the wavelength range of the actually reflected light deviates with respect to the nominal wavelength of the incident light, due to thickness control error during fabrication of the reflecting layer. In the reflecting layer 314c, for example, the thickness variation ratio DD and number of the unit semiconductors 330 of the first varying-thickness portion 334 may differ from those of the second varying-thickness portion 336, and one of the two varying-thickness portions 334, 336 may even be eliminated.

In the reflecting layer 314b, the thickness of the unit semiconductors 330 changes in three steps. However, the thickness may change in two steps or four or more steps. Further, the number n of one iso-thickness portion may differ from that of another iso-thickness portion. In this connection, the number n is desirably four or more.

The surface emitting diode 310 may also be fabricated by molecular beam epitaxy or other epitaxial crystal growth method other than MOCVD.

Figure 31:
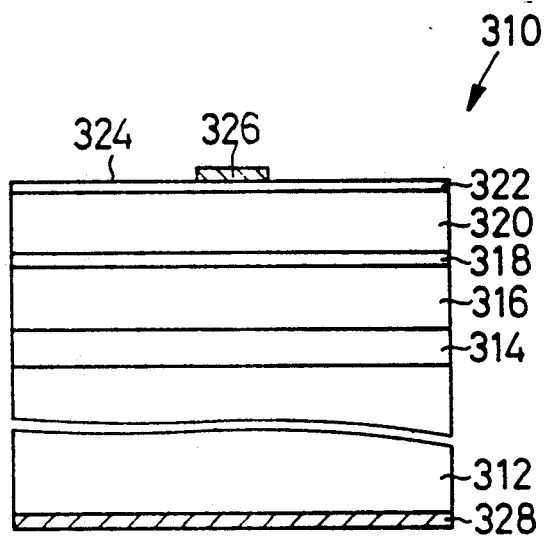
FIG. 31 is an elevational view of a further embodiment of the surface emitting diode of the present invention having a reflecting layer.
Figure 41:
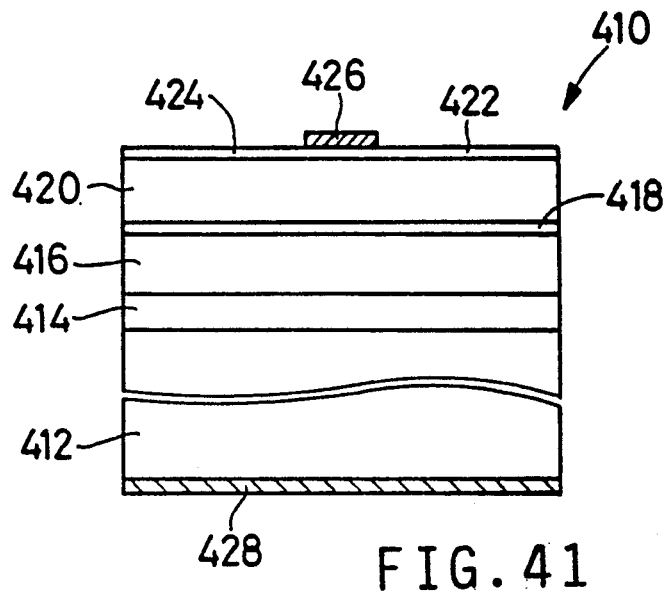
FIG. 41 is an elevational view in cross section of a still further embodiment of a surface emitting diode of this invention.

Referring next to FIG. 41, there is shown a surface emitting diode 410 similar in general arrangement to the diode 310 of FIG. 31. The diode 410 has an n-GaAs substrate 412, and the following layers formed on the substrate 412 in the order of description: n-GaAs/n-AlAs reflecting layer 414; n-AlGaAs clad layer 416; p-GaAs active layer 418; p-AlGaAs clad layer 420; and p-GaAs cap layer 422. The clad layer 416, active layer 418 and clad layer 420 constitute a double heterostructure. The cap layer 422 has a top surface which serves as a light emitting surface 424, on which a positive electrode 426 is formed. A negative electrode 428 in the form of a layer is formed on a lower surface of the substrate 412. With a forward voltage applied between the electrodes 426, 428, the active layer 418 of the double heterostructure produces light, which is emitted from the light emitting surface 424 of the cap layer 422. The reflecting layer 414 is provided for achieving the same function as described above with respect to the reflecting layers 14, 214, 314.

The layers 416, 418, 420 and 422 formed by MOCVD have the same thickness values as the layers 316, 318, 320 and 322 of FIG. 31. The reflecting layer 414 consists of 15 unit semiconductors superposed on each other. Each unit semiconductor consisting of an n-GaAs semiconductor film having a thickness of about 61 nm and an n-AlAs semiconductor film having a thickness of about 73 nm. These two semiconductor films of the 15 unit semiconductors are alternately superposed to form a laminar structure. The composition n-$Al_xGa_{1-x}As$ at the interface of the two n-GaAs and n-AlAs semiconductor films continuously change as indicated by solid line in FIG. 42, by continuously changing a proportion of the material gases which are introduced into a MOCVD furnace during formation of the reflecting layer 414. The thickness values of the n-GaAs and n-AlAs semiconductor films of the n-GaAs/n-AlAs reflecting layer 414 are determined by the desired refractive indices of these films, the wavelength of the light produced by the p-GaAs active layer 418, and the other factors.

Since the composition n-$Al_xGa_{1-x}As$ at the interface of the n-GaAs and n-AlAs films of the reflecting layer 414 continuously changes, a lattice mismatch due to a difference in the lattice constant between the adjacent two semiconductor crystal films is mitigated to minimize the crystal defects of the n-GaAs/n-AlAs reflecting layer 414, whereby the crystal defects of the n-AlGaAs clad layer 416, p-GaAs active layer 418 and p-AlGaAs clad layer 420 which are formed on the reflecting layer 414 by epitaxy are reduced. Accordingly, the surface emitting diode 410 is protected against the so-called dark line deterioration due to the growth of the dislocation caused by the crystal defects, during operation of the diode. Thus, the life expectancy of the diode 410 is prolonged.

Figure 43:
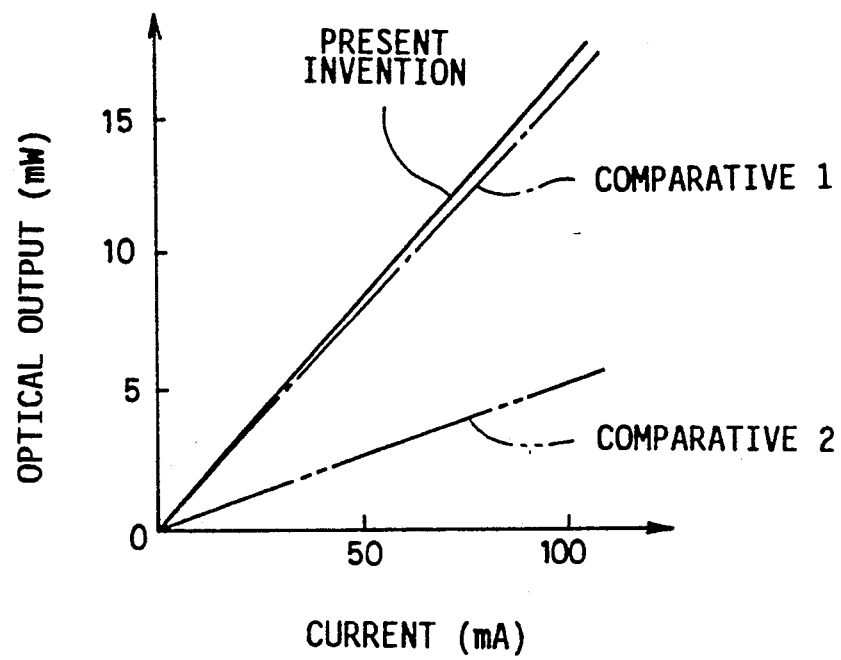
FIG. 43 is a graph indicating a current-optical output relationship of the diode of FIG. 41, as compared with those of comparative diodes.
Figure 44:
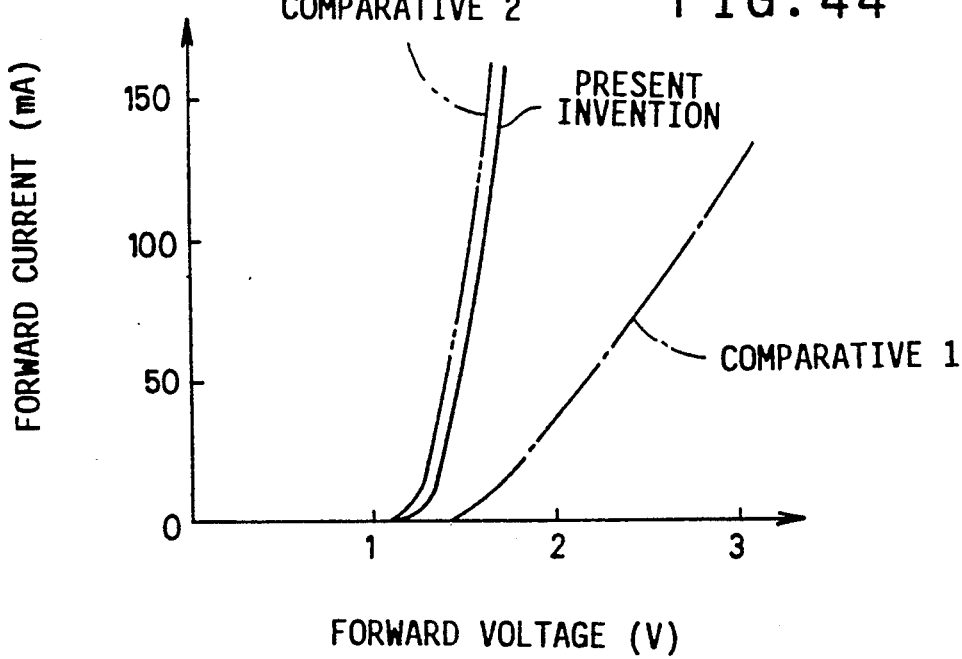
FIG. 44 is a graph indicating a current-voltage relationship of the diode of FIG. 41, as compared with those of comparative diodes.

The continuous change in the composition at the interface of the n-GaAs and n-AlAs semiconductor films of the reflecting layer 414 is also effective to mitigate the discontinuity of bands at the interface, as compared with that in a conventional reflecting layer whose unit semiconductor consists of an n-GaAs film and an n-AlAs semiconductor film which are superposed on each other, without an interposed composition. Accordingly, the electrical resistance of the reflecting layer is lowered, and the required operating voltage of the diode is accordingly reduced. Experiments were conducted on the surface emitting diode 410 according to the present embodiment, and two comparative examples, i.e., comparative examples 1 and 2. The comparative example 1 is a surface emitting diode using a reflecting layer which does not have a continuously varying composition interposed between the adjacent n-GaAs and n-AlAs semiconductor films. The comparative example 2 does not have any reflecting layer. In the comparative example 1, the composition of the semiconductor material abruptly changes at the interface of the two adjacent films, as indicated by dashed lines in FIG. 42. FIGS. 43 and 44 respectively show a current-output relationship and a current-voltage relationship, which were measured on the specimens. It will be understood from FIGS. 43 and 44 that the instant diode 410 exhibited substantially no difference in the current-output characteristic with respect to the comparative example 1, and provided considerably improved optical output as compared with the comparative example 2. It will be further understood that the present diode 410 exhibited considerably improved current-voltage characteristic as compared with the comparative example 1, and was operated with a low voltage almost equal to that of the comparative example 2 which does not have a reflecting layer.

Figure 42:
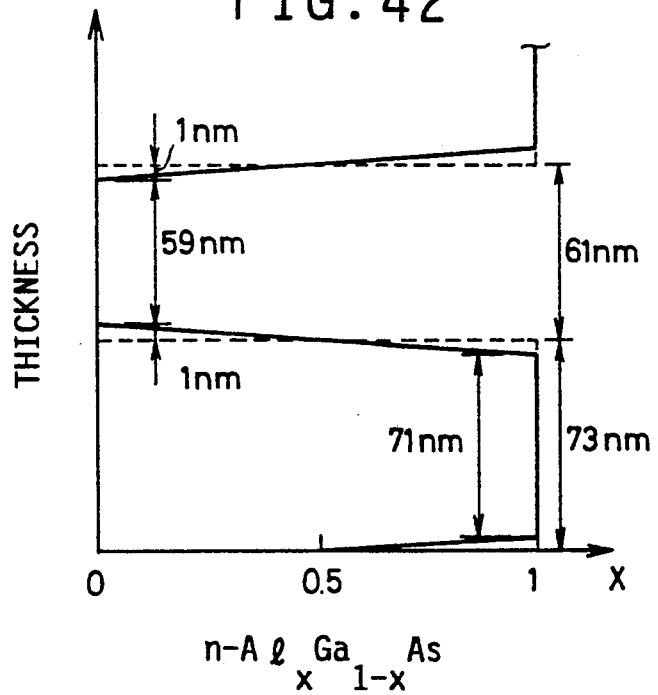
FIG. 42 is a graph for explaining a change in the composition of a reflecting layer of the diode of FIG. 41.
Figure 45:
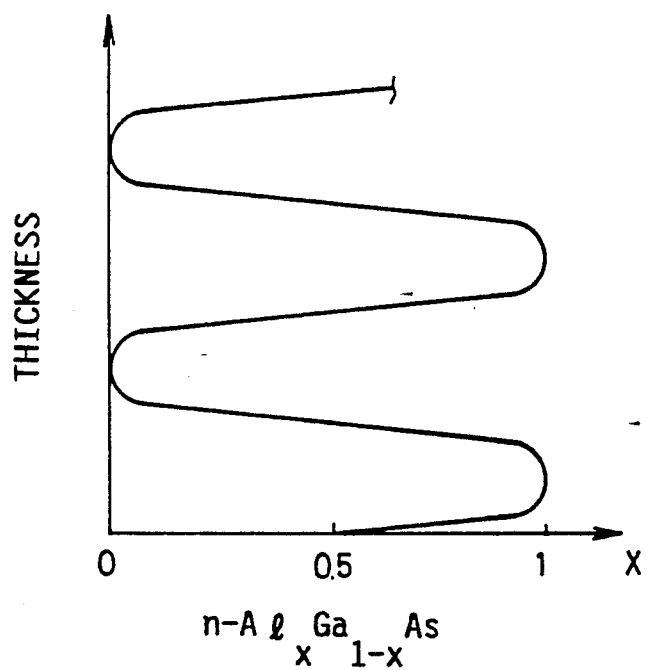
FIG. 45 is a graph indicating a change in the composition of the reflecting layer of the diode of FIG. 41.

In the illustrated embodiment, the composition of the n-GaAs/n-AlAs reflecting layer continuously changes only at and near the ends of the nominal thicknesses of the GaAs and AlAs films, as indicated by the solid line in FIG. 42. However, the composition of the reflecting layer, i.e., ratio x of the composition $Al_xGa_{1-x}As$ may continuously change throughout the entire thickness of the reflecting layer, in a cyclic manner, as indicated by solid line in FIG. 45. Further, the ratio x may change in steps in a cyclic manner.

As in the preceding embodiment, the p-GaAs active layer 418 may be replaced by any other compound semiconductor material, such as Gap, InP and InGaAsP, for providing a double or single heterostructure or a homostructure for a surface emitting diode or laser.

While the surface emitting diode 410 has the n-GaAs/n-AlAs reflecting layer 414, the semiconductor materials and the manner of changing the composition may be suitably selected, depending upon the desired refractive indices of the semiconductor materials and the wavelength of the light produced by the active layer.

The diode 410 may also be formed by epitaxy other than MOCVD, for example, by molecular beam epitaxy.

Figure 46:
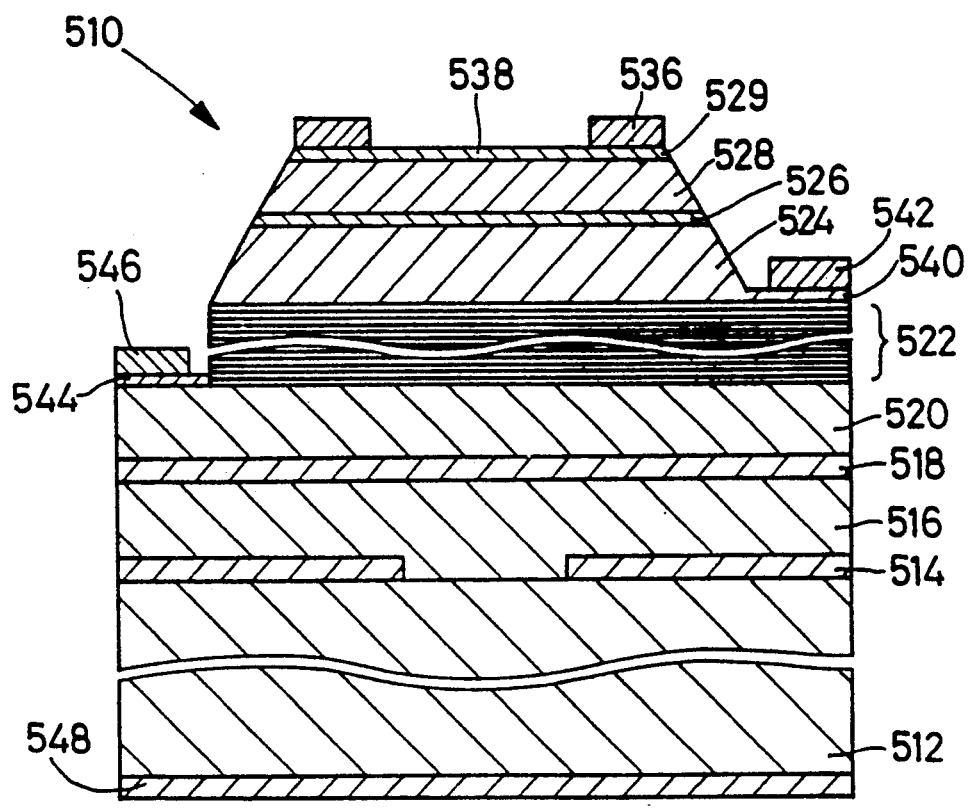
FIG. 46 is an elevational view in cross section of a yet another surface emitting diode of this invention.

Reference is now made to FIG. 46, which shows a further embodiment of the present invention in the form of a surface emitting diode 510, which has an n-GaAs single crystal substrate 512. On this single crystal substrate 512, there is formed an annular p-GaAs current blocking layer 514, such that a central portion of the substrate 512 is exposed through a center hole of the annular layer 514. The annular n-GaAs current blocking layer 514 and the central exposed portion of the substrate 512 are covered by an n-$Al_xGa_{1-x}As$ clad layer 516. On the clad layer 516, there are formed the following layers in the order of description: p-$Al_yGa_1$-

$-_y$As second active layer 518 for producing a second radiation whose wavelength is $\lambda_2$ (e.g., 830 nm); p-Al$_z$Ga$_{1-z}$As clad layer 520; selective reflecting layer 522; n-Al$_u$Ga$_{1-u}$As clad layer 524; p-Al$_v$Ga$_{1-v}$As first active layer 526 for producing a first radiation whose wavelength $\lambda_1$ (e.g., 780 nm) is shorter than the wavelength $\lambda_2$; p-Al$_w$Ga$_{1-w}$As clad layer 528; and p-GaAs contact layer 529. The clad layer 524, first active layer 526 and clad layer 528 constitute a first double heterostructure, while the clad layer 516, second active layer 518 and clad layer 520 constitute a second double heterostructure which is separated from the first double heterostructure by the selective reflecting layer 522. In this specific example, the current blocking layer 514 has a thickness of 0.5 μm, and the clad layers 516, 520, 524, 528 have a thickness of 2 μm. The active layers 518, 526 and the contact layer 529 have a thickness of about 0.1 μm. The ratios x, z, u and w of the clad layers 516, 520, 524 and 528 are 0.45, while the ratios y and v of the active layers 518, 526 are 0.06 and 0.13, respectively.

Figure 47:
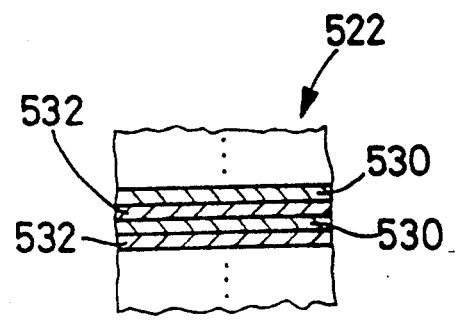
FIG. 47 is a fragmentary enlarged view showing a selective reflecting layer of the diode of FIG. 46.
Figure 48:
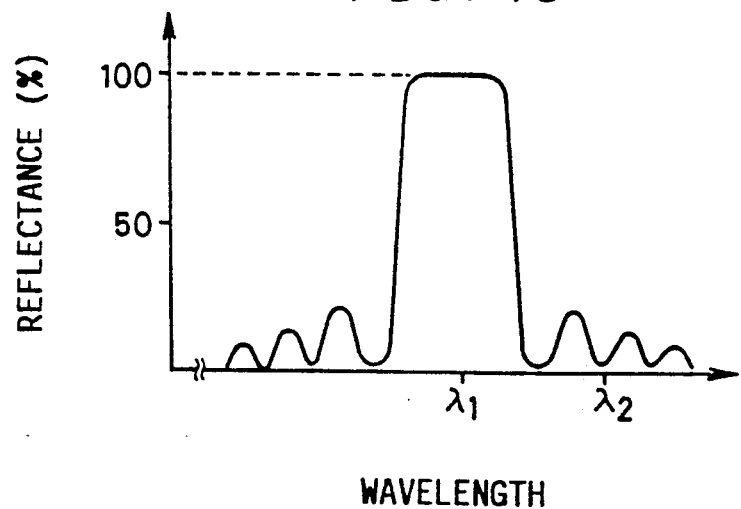
FIG. 48 is a graph indicating reflectance of the reflecting layer of FIG. 47, which varies with the wavelength of an incident light.

The selective reflecting layer 522 consists of unit semiconductors, for example, 20 unit semiconductors each consisting of an AlAs semiconductor film 530 and an Al$_p$Ga$_{1-p}$As semiconductor film 532, as shown in FIG. 47. These two semiconductor films 530 and 532 are alternately superposed on each other to form a laminar structure of the reflecting layer 522. The selective reflecting layer 522 reflects light in a predetermined wavelength range, by optical wave interference based on the Bragg reflection. More specifically described referring to the graph of FIG. 48, the reflecting layer 522 has 100% reflectance with respect to the first radiation having the wavelength $\lambda_1$ generated by the first active layer 526, but the reflectance is almost 0% with respect to the wavelength $\lambda_2$ of the second radiation generated by the second active layer 518. Therefore, the selective reflecting layer 522 reflects the entire portion of the first radiation produced by the active layer 526, and transmits substantially the entire portion of the second radiation produced by the second active layer 518. The thicknesses $T_A$ and $T_G$ of the AlAs layer 530 and Al$_p$Ga$_{1-p}$As layer 532 are determined according to the above equations (1) and (2), so as to give the selective reflecting layer 522 the light reflecting characteristic as shown in FIG. 48. The ratio p of the Al$_p$Ga$_{1-p}$As layer 532 is 0.45, for example.

The current blocking layer 514, clad layer 516, active layer 518, clad layer 520, selective reflecting layer 522, clad layer 524, active layer 526, clad layer 528 and contact layer 529 are successively formed as single crystals on the substrate 512, by MOCVD, for example. The annular current blocking layer 514 is formed by first growing an appropriate single crystal over the entire surface of the substrate 512, and then removing a central portion by photolithography. The clad layer 524, active layer 526, clad layer 528 and contact layer 529 are formed by first growing appropriate single crystal layers successively on the entire surface of the reflecting layer 522, and then removing the peripheral portions of the crystal layers by photolithography.

An annular first upper electrode 536 formed of Cr-Au is provided on the peripheral portion of the upper surface of the contact layer 529. A central portion of the upper surface of the contact layer 529 which is inside the annular electrode 536 serves as a light emitting surface 538 through which the first and second radiations produced by the first and second active layers 526, 518 are emitted. The clad layer 524 has a projection 540 which contacts a peripheral portion of the reflecting layer 522. On this projection 540, there is formed a first lower electrode 542 made of Au-Ge-Ni. On a peripheral portion of the clad layer 520 which is not covered by the reflecting layer 522, there is formed by vapor phase epitaxy a p-GaAs contact layer 544, on which a second upper electrode 546 is formed of Cr-Au. A second lower electrode 548 of Au-Ge-Ni is formed over the entire area of the lower surface of the substrate 512. The electrodes 536, 542, 546 and 548 are all ohmic electrodes.

In the surface emitting diode 510 constructed as described above, the first radiation having the wavelength $\lambda_1$ is produced by the first active layer 526 upon application of forward voltage between the first upper and lower electrodes 536, 542. A portion of the first radiation which travels upward (toward the clad layer 528) is emitted through the light emitting surface 538. On the other hand, a portion of the first radiation which travels downward (toward the substrate 512) is entirely reflected by the selective reflecting layer 522 toward the first active layer 526, and is thereby emitted from the light emitting surface 538 through the active layer 526, etc. Thus, the portion of the first radiation which first travels toward the substrate 512 is not absorbed by the second active layer 518. Upon application of a forward voltage between the second upper and lower electrodes 546, 548, the second radiation having the wavelength $\lambda_2$ is produced by the second active layer 518. A portion of the second radiation is transmitted through the selective reflecting layer 522, and is emitted from the light emitting surface 538 via the first active layer 526, etc. Since the wavelength $\lambda_2$ (e.g., 830 nm) of the second radiation produced by the second active layer 518 is longer than the wavelength $\lambda_1$ (e.g., 780 nm) of the first radiation produced by the first active layer 526, the optical energy produced by the second active layer 518, i.e., the electronic energy gap of the second active layer 518 is smaller than the optical energy produced by the first active layer 526, i.e., the electronic energy gap of the first active layer 526. Accordingly, the second radiation is emitted from the surface 538, without being absorbed by the first active layer 526. Since the annular current blocking p-GaAs layer 514 is embedded in the n-Al$_x$Ga$_{1-x}$As clad layer 516 and the n-GaAs substrate 512, a current will not flow from the clad layer 516 to the substrate 512 through the current blocking layer 514, so that the current will flow through only the central portions of the clad layer 516 and substrate 512 which are inside the annular current blocking layer 514. Accordingly, the second radiation is produced from only the central portion of the second active layer 518 right below the light emitting surface 538, so that the light emitting efficiency is increased.

In the present embodiment, the selective reflecting layer 522 is interposed between the first and second active layers 526, 518, so that the portion of the first radiation (wavelength $\lambda_1$) produced by the first active layer 526 and incident upon the reflecting layer 522 is entirely reflected by the reflecting layer 522, while the portion of the second radiation (wavelength $\lambda_2$) produced by the second active layer 518 and incident upon the reflecting layer 522 is substantially entirely transmitted through the reflecting layer 522. Further, the material of the second active layer 518 has an electronic energy gap smaller than that of the second active layer 526, so that the optical energy of the first radiation produced by the first active layer 518 is smaller than that of the second radiation produced by the first active layer 526, whereby the first radiation is prevented from being absorbed by the first active layer 18, namely, the first active layer 526 is prevented from absorbing the second radiation and thereby producing the first radiation. Therefore, the present surface emitting diode 510 is capable of selectively emitting the first or second radiation as needed, with high output efficiency. If a forward current is applied between the first electrodes 536, 542, and between the second electrodes 545, 548, at the same time, the first and second radiations are produced by the first and second active layers 526, 518, and are emitted as combined with each other, both at the nominal output efficiency.

The present surface emitting diode 510 can be easily and economically fabricated, since the multiple semiconductor films of AlAs/Al$_p$Ga$_{1-p}$As of the selective reflecting layer 522 can be formed by successive epitaxial crystal growth operations within a common chamber, like the other semiconductor elements such as the clad layers 516, 520, 524, 528 and active layers 518, 526.

The reflecting layer 522 consisting of the AlAs/Al$_p$Ga$_{1-p}$As films does not have a lattice mismatch with the adjacent p-Al$_y$Ga$_{1-y}$As and n-Al$_u$Ga$_{1-u}$As clad layers 520, 524, assuring excellent light emitting characteristics of the diode 510.

As in the preceding embodiment, the AlGaAs active layers 518, 526 of the diode 510 may be replaced by other compound semiconductor materials such as GaAs, GaP, InP and InGaAsP, for providing a double or single heterostructure or a homostructure for a surface emitting diode.

While the selective reflecting layer 522 consists of the multiple AlAs/Al$_p$Ga$_{1-p}$As semiconductor films, the selective reflecting layer may consist of multiple pairs of alternately superposed AlGaAs semiconductor films, the two films of each pair having different compositions. Semiconductor materials other than AlAs and AlGaAs may be used for the laminar structure of the selective reflecting layer.

In the present embodiment of FIG. 46, the two active layers 526, 518 are provided. However, three or more active layers may be provided. In this case, two or more selective reflecting layers are disposed between the adjacent active layers, so that a desired one of the radiations having respective wavelengths is emitted. The wavelengths of the radiations produced by the three or more active layers are determined such that the wavelength of the radiation produced by the active layer nearest to the light emitting surface is the shortest, and the wavelength increases with a distance of the appropriate active layer from the light emitting surface.

In the surface emitting diode 510, a third reflecting layer may be provided between the substrate 512 and the assembly of the current blocking and clad layers 514, 516, so that a portion of the second radiation which is produced by the second active layer 518 and which travels toward the substrate 512 is reflected toward the second active layer 518, so as to prevent the substrate 512 from absorbing the second radiation.

While the light emitting surface 510 is provided on the contact layer 529 remote from the substrate 512, a light emitting surface may be provided on the lower surface of the clad layer 516. In this case, the positions of the first and second active layers 526, 518 are reversed, and the appropriate surface of the substrate 512 is suitably ground or etched.

Figure 49:
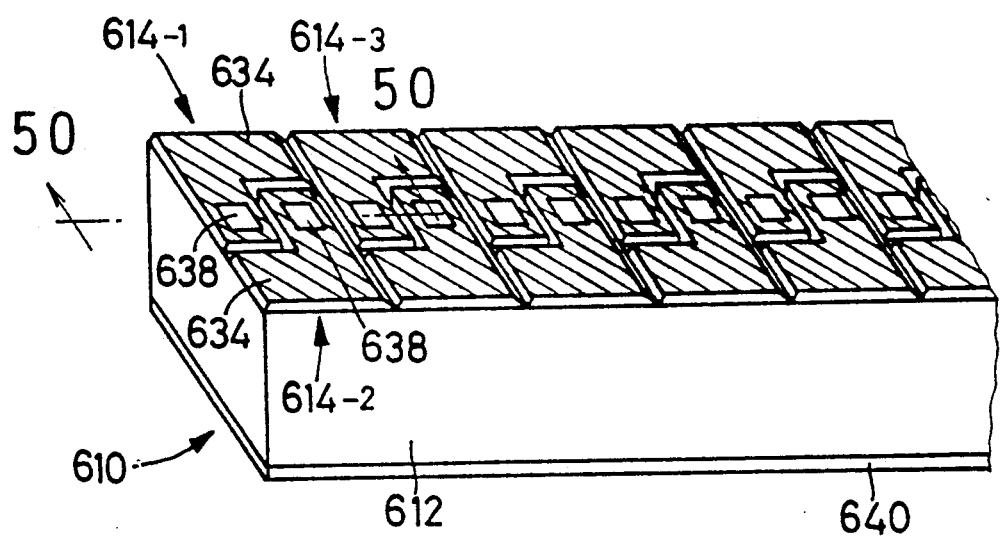
FIG. 49 is a perspective view of an array of surface emitting diodes according to a further aspect of the present invention.
Figure 50:
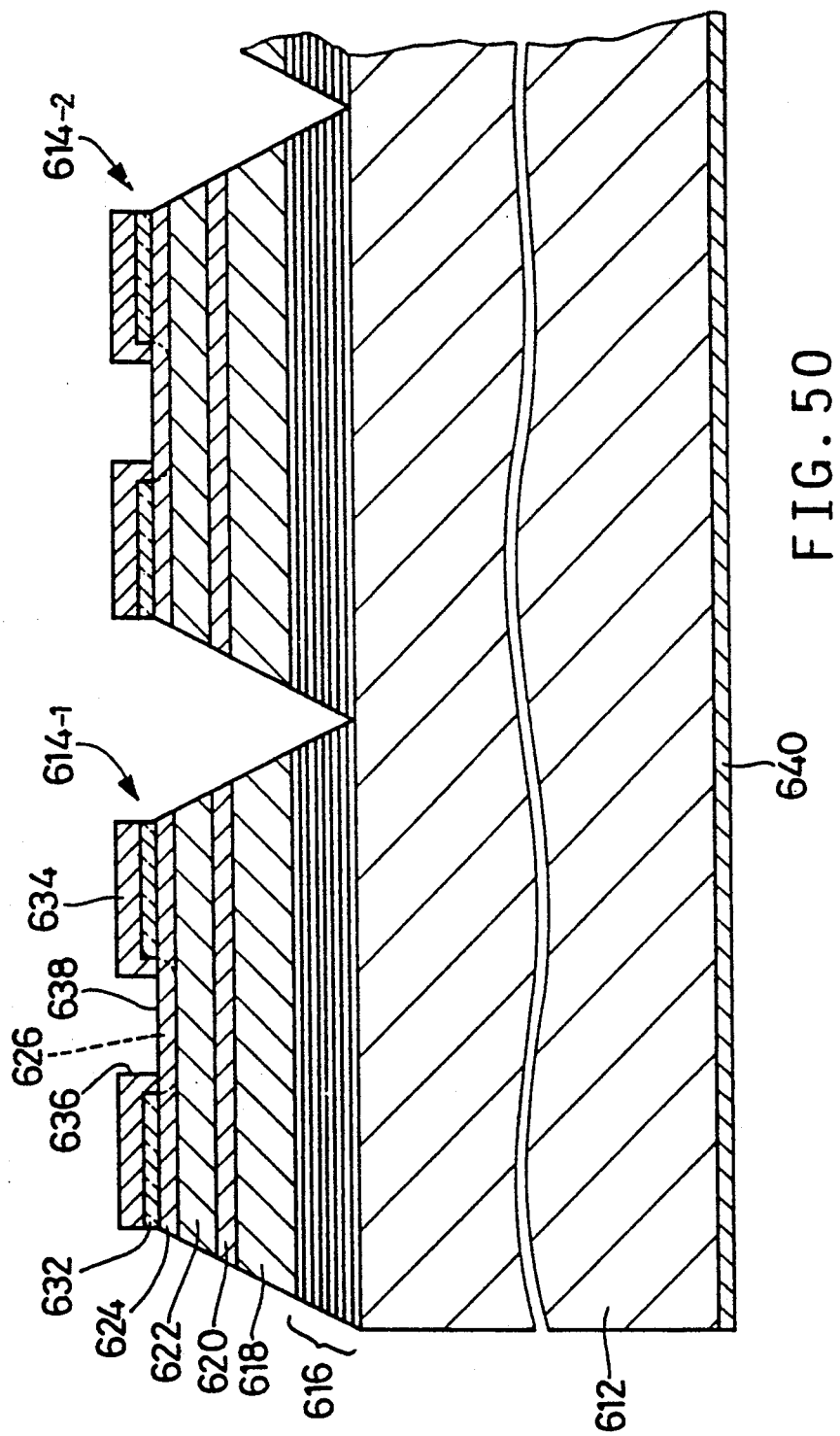
FIG. 50 is an enlarged cross sectional view taken along line 50—50 of FIG. 49.

Referring to a fragmentary perspective view of FIG. 49, there is shown a yet another embodiment of the present invention in the form of a surface emitting diode array adapted to be used as a light source for a print head for image-wise exposing a photoconductive drum. The surface emitting diode array, which is indicated generally at 610 in FIG. 49, has an n-GaAs single crystal substrate 612 having a generally elongate rectangular shape. The substrate 612 has a width of 0.7 mm, a length of 4.5 mm and a thickness of 0.5 mm. In the present embodiment, 128 surface emitting diodes 614 (614$_{-1}$ through 614$_{-128}$) are arranged on the substrate 612, in a row along the length of the substrate. The diodes 614 have the same construction, as shown in FIG. 50. More specifically, each diode 614 has the following layers formed on the substrate 612 in the order of description, so as to provide a double heterostructure reflecting layer 616; n-Al$_{0.45}$Ga$_{0.55}$As clad layer 618; p-GaAs active layer 620 for producing a radiation whose wavelength is 880 nm; p-Al$_{0.45}$Ga$_{0.55}$As clad layer 622; and p-GaAs cap layer 624. The cap layer 624 includes a p$^+$-GaAs light emitting portion 626 (indicated by broken line in FIG. 50), which is formed by impurity diffusion. In this embodiment, the substrate 612, clad layers 618, 622, active layer 620 and cap layer 624 (light emitting portion 626) have thicknesses of 500 µm, 2 µm, 0.2 µm and 1 µm, respectively.

Figure 51:
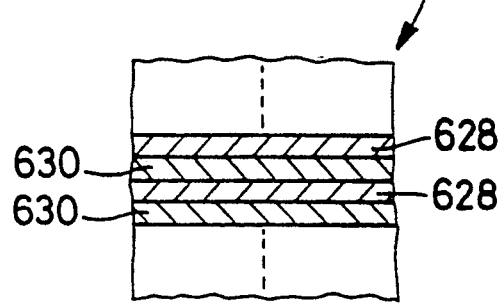
FIG. 51 is a fragmentary view in cross section of the reflecting layer of FIG. 50.

The reflecting layer 616 consisting of multiple semiconductor films functions to reflect by optical wave interference a radiation produced by the active layer 620 As shown in FIG. 51, the layer 616 is a so-called superlattice consisting of 20 pairs of n-GaAs semiconductor film 628 and n-AlAs semiconductor film 630. The n-GaAs film 628 has a thickness of 61 nm, while the n-AlAs film 630 has a thickness of 72 nm. These films 628, 630 of the 20 pairs are alternately superposed on each other, to form a laminar structure which has a light reflecting characteristic wherein the reflectance is the highest with respect to the center wavelength of 880 nm of the radiation produced by the active layer 620.

The reflecting layer 616, clad layer 618, active layer 620, clad layer 622 and cap layer 624 of each diode 614 are formed by first forming respective single crystal layers by MOCVD or other epitaxial methods on the entire area of the top surface of the substrate 612, and then removing portions of the layers 616, 618, 620, 622 and 624 by photolithography, along respective lines for separating the individual diodes 614 from each other.

On the cap layer 624 of each diode 614, an n-Si$_3$N$_4$ insulating layer 632 having a thickness of 0.5 µm is formed as shown in FIG. 50. On the substantially the entire surface of this insulating layer 632, there is formed an upper electrode 634 made of AuZn/Ti/Au, as indicated by hatching lines in FIG. 49. The upper electrode 634 has an opening 636 through which the top surface of the light emitting portion 626 is exposed to the atmosphere, as a light emitting surface 638. The portions of the electrode 634 which defines the opening 636 are held in contact with the light emitting portion 626. As indicated in FIG. 49, the light emitting surface 638 has a rectangular shape with a very small area, for example, 40×70 µm$^2$. On the other hand, a lower electrode 640 of AuGe/Ni commonly used for the diodes 614 is formed on the entire lower surface of the substrate 612. The upper and lower electrodes 634, 640 are ohmic electrodes.

In operation of the surface emitting diode array 610 as the light source for the print head, a forward current is applied between the common lower electrode 640, and the upper electrodes 634 of the diodes 614 which are selected depending upon a desired image to be printed. As a result, the active layers 620 of the selected diodes 614 produce radiations. A portion of the radiation which travels upward toward the clad layer 622 is emitted from the light emitting surface 638 of each selected diode 614, whereby the photoconductive drum is image-wise exposed to the radiation. A portion of the radiation which travels downward toward the substrate 612 is reflected by the reflecting layer 616, and the reflected light is also emitted from the light emitting surface 638 toward the photosensitive drum. In this way, the photoconductive drum is image-wise exposed to form a latent image by selective activation of the diodes 614 according to the desired image to be printed. The latent image is developed into visible image, as in a known photocopying apparatus. In the presence of the insulating layer 632, the electric current flows from the portion of the upper electrode 634 which defines the opening 636, through the light emitting portion 626, to only the portions of the clad layer 622 and active layer 620 which are right below the light emitting portion 626, so that the radiation is produced from that limited portion of the active layer 620. This arrangement is effective to reduce the required power for each diode 614.

In the present surface emitting diode array 610 of FIGS. 49-51, the reflecting layer 616 consisting of the GaAs/AlAs semiconductor superlattice is disposed between the active layer 620 of each diode 614 and the common substrate 612. This arrangement assures uniform intensities of the radiations emitted from the individual diodes 614, for the following reason.

Usually, the substrate 612 has many dislocations, which are crystal defects occurring along certain lines. When the dislocations of the substrate 612 propagate toward the active layer 620, the dislocations are released along the interfaces of the semiconductor films of the superlattice of the reflecting layer 616, whereby the dislocations of the substrate 612 will not propagate to the active layer 620. If dislocations would occur in the active layer 620 due to the propagation of the dislocations of the substrate 612, the electrons and holes are coupled together without producing light. It is assumed that the reflecting layer 616 which prevents the propagation of the dislocations of the substrate 612 to the active layers 620 of the diodes 614 serves to prevent the otherwise possible reduction in the optical output of each active layer 620. Thus, it appears that the reflecting layer 616 also functions to assure uniform intensities of the radiations emitted from the individual diodes 614, and suitably prevent local density variation of the printed image.

The semiconductor films of the reflecting layer 616 which has the auxiliary function as indicated above can be easily formed by successive crystal growth operations within a common chamber, together with the active layer 620 and other layers. The provision of this reflecting layer 616 eliminates resistors which are provided in the driver circuit for the diode array, to assure uniform optical outputs of the individual diodes. Consequently, the print head using the diode array 610 is comparatively simplified. Further, the present diode array 610 does not suffer from an increase in the required power consumption, as in the arrangement wherein the resistors are used to lower the different optical outputs of the diodes to the smallest output. In the surface emitting diode array 610, the intensities of the radiations emitted by the individual diodes 614 are substantially equal to each other, and maintained at a high level without an increase in the power consumption.

Figure 52:
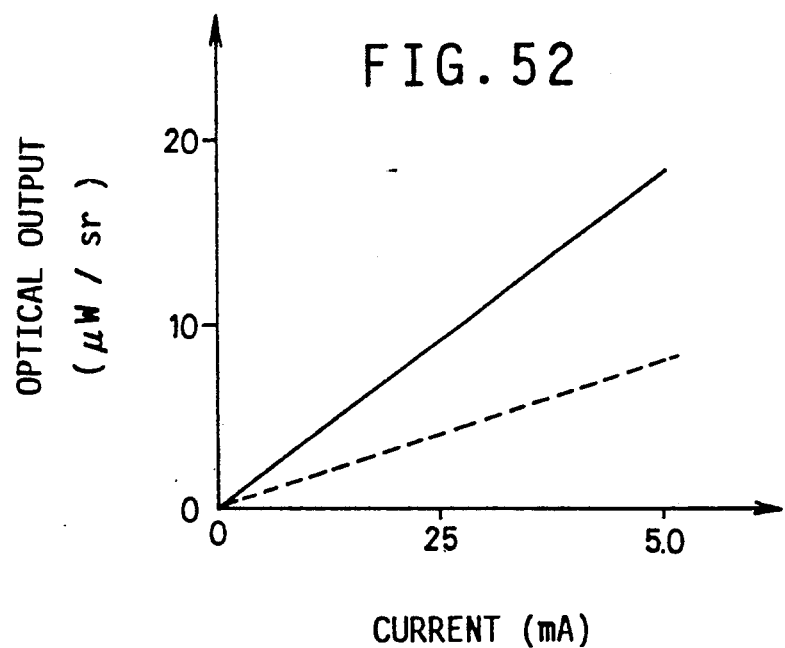
FIG. 52 is a graph indicating a relationship between optical output of the surface emitting diode array of FIG. 49 and an amount of current applied to the diode, as compared with that of a conventional diode array which does not have a reflecting layer.

It is also noted that any portion of the radiation which is produced by the active layer 620 is not absorbed by the substrate 612. Namely, the portion of the radiation which travels toward the substrate 612 is reflected by the reflecting layer 616 and is also emitted from the light emitting surface 638, assuring high optical outputs of the diodes 614. Solid line in FIG. 52 indicates the optical output of each diode 614 varying with the amount of current applied thereto, while dashed line indicate the optical output of a diode not provided with the reflecting layer 616. It will be understood from FIG. 52 that the optical output of the diode 614 is twice or more as high as that of the diode without the reflecting layer. Since the intensity of the radiation emitted by each diode 614 is high even with the small light emitting surface 638, the print head assures sufficiently high image reproduction resolution, with relatively small local areas of the photoconductive drum being selectively exposed to high-intensity beams.

While each diode 614 of the present surface emitting diode array 610 has the GaAs/AlGaAs double heterostructure, other compound semiconductors such as GaP, InP and InGaAsP may be used for a double or single heterostructure or a homostructure of each diode of a surface emitting diode array.

The GaAs/AlAs superlattice 628, 630 of the reflecting layer 616 may be replaced by a superlattice of other semiconductor materials selected depending upon the desired refractive index.

Although the surface emitting diode array 610 of the illustrated embodiment of FIGS. 49-51 is used as a light source for an image-wise exposing print head, the surface emitting diode array according to the present invention may find other applications, such as a display device whose light emitting elements have substantially the same optical outputs.

While the present invention have been described in its presently preferred embodiments, for illustrative purpose only, by reference to the accompanying drawings, it is to be understood that the invention may be embodied with various changes, modifications and improvements, which may occur to those skilled in the art, within the scope of the invention defined by the following claims.

What is claimed is:

1. A semiconductor device having an active layer for producing a radiation, a reflecting layer which in formed on one of opposite sides of said active layer and which receives a portion of said radiation as incident light and reflects said incident light by optical wave interference, and a light emitting surface provided on the other of said opposite sides of said active layer remote from said reflecting layer, for emitting the light received from said active layer, said reflecting layer comprising a plurality of unit semiconductors which are superposed one each other and each of which consists of two semiconductor films having different compositions superposed on each other, wherein the improvement comprises:

said reflecting layer including at least one varying-thickness portion, each of said at least one varying-thickness portion comprises a plurality of unit semiconductors whose thickness continuously varies in a direction of thickness of the reflecting layer.

2. A semiconductor device according to claim 1, wherein said reflecting layer further includes an iso-thickness portion comprising a plurality of unit semiconductors which are superposed on each other and each of which has a nominal thickness determined so as to reflect light whose wavelength is equal to or in the neighborhood of a nominal wavelength of said incident light, and wherein said at least one varying-thickness portion comprises a first varying-thickness portion and a second varying-thickness portion which are formed on opposite sides of said iso-thickness portion, said first varying-thickness portion comprises unit semiconductors whose thickness continuously decreases from said nominal thickness in a direction away from said iso-thickness portion, while said second varying-thickness portion comprises unit semiconductors whose thickness continuously increases from said nominal thickness in the direction away from said iso-thickness portion.

3. A semiconductor device according to claim 1, wherein each of said plurality of unit semiconductors comprises an AlAs semiconductor film and an $Al_xGa_{1-x}As$ semiconductor film.

4. A semiconductor device according to claim 3, wherein the thickness of said unit semiconductors continuously linearly varies between a largest thickness of $T(1+DD)$ and a smallest thickness $T(1-DD)$, where T represents a nominal thickness which is a sum of a thickness $T_A$ of said AlAs semiconductor film determined according to the following equation (1) based on a center wavelength $\lambda B$ of said incident light and a refractive index $n_A$ of said AlAs semiconductor film, and a thickness $T_G$ of said $Al_xGa_{1-x}As$ semiconductor film determined according to the following equation (2) based on said center wavelength $\lambda B$ and a refractive index $n_G$ of said $Al_xGa_{1-x}As$ semiconductor film, and DD represents a predetermined ratio of variation of said thickness of the unit semiconductors to said nominal thickness T, a ratio $T_A/T_G$ being maintained constant for all of said unit semiconductors, $$T_A = \lambda B/4n_A \quad (1)$$

$$T_G = \lambda B/4n_G \quad (2).$$

5. A semiconductor device according to claim 4, wherein the number of said plurality of unit semiconductors is equal to N, and said number N, said ratio DD and a ratio x of said $Al_xGa_{1-x}As$ semiconductor film are determined so as to satisfy the following equations (3) and (4), $$N \geq 10 + 25x \quad (3)$$

$$N \geq 100DD + (100x - 10)/2 \quad (4).$$

6. A semiconductor device according to claim 4, wherein the number of said plurality of unit semiconductors is equal to N, and said number N, said ratio DD and a ratio x of said $Al_xGa_{1-x}As$ semiconductor film are determined so as to satisfy the following equations (5) and (6), $$N \geq 15 \quad (5)$$

$$N \geq 200DD + (100x - 20)/2 \quad (6).$$

7. A semiconductor device according to claim 1, wherein each of said plurality of unit semiconductors comprises an $Al_xGa_{1-x}As$ semiconductor film and an $Al_yGa_{1-y}As$ semiconductor film, where $x < y$.

8. A semiconductor device according to claim 7, wherein the thickness of said unit semiconductors continuously linearly varies between a largest thickness of $T(1+DD)$ and a smallest thickness $T(1-DD)$, where T represents a nominal thickness which is a sum of a thickness $T_A$ of said $Al_yGa_{1-y}As$ semiconductor film determined according to the following equation (1) based on a center wavelength $\lambda B$ of said incident light and a refractive index $n_A$ of said $Al_yGa_{1-y}As$ semiconductor film, and a thickness $T_G$ of said $Al_xGa_{1-x}As$ semiconductor film determined according to the following equation (2) based on said center wavelength $\lambda B$ and a refractive index $n_G$ of said $Al_xGa_{1-x}As$ semiconductor film, and DD represents a predetermined ratio of variation of said thickness of the unit semiconductors to said nominal thickness T, a ratio $T_A/T_G$ being maintained constant for all of said unit semiconductors, $$T_A = \lambda B/4n_A \quad (1)$$

$$T_G = \lambda B/4n_G \quad (2).$$

9. A semiconductor device according to claim 8, wherein the number of said plurality of unit semiconductors is equal to N, and said number N, said ratio DD, a ratio x of said $Al_xGa_{1-x}As$ semiconductor film and a ratio y of said $Al_yGa_{1-y}As$ semiconductor film are determined so as to satisfy the following equations (7) and (8), $$N \geq 10 + 25(x - y + 1) \quad (7)$$

$$N \geq 100DD + \{100(x - y + 1) - 10\}/2 \quad (8).$$

10. A semiconductor device according to claim 8, wherein the number of said plurality of unit semiconductors is equal to N, and said number N, said ratio DD, a ratio x of said $Al_xGa_{1-x}As$ semiconductor film and a ratio y of said $Al_yGa_{1-y}As$ semiconductor film are determined so as to satisfy the following equations (9) and (10), $$N \geq 15 \quad (9)$$

$$N \geq 200DD + \{100(x - y + 1) - 20\}/2 \quad (10).$$

11. A semiconductor device having an active layer for producing a radiation, a reflecting layer which is formed on one of opposite sides of said active layer and which receives a portion of said radiation as incident light and reflects said incident light by optical wave interference, and a light emitting surface provided on the other of said opposite sides of said active layer remote from said reflecting layer, for emitting the light received from said active layer, said reflecting layer comprising a plurality of unit semiconductors which are superposed one each other and each of which comprises a plurality of semiconductor films having different compositions superposed an each other, wherein the improvement comprises:

a thickness of said unit semiconductors of said reflecting layer always at least one of continuously decreases and decreases in a step-wise manner, in a direction from a side of said reflecting layer remote rom a surface o flight incidence thereof through which said incident light received from said active layer is incident upon said reflecting layer, toward a side of said reflecting layer adjacent to said surface of light incidence.

12. A semiconductor device according to claim 11, wherein said reflecting layer has at least one varying-thickness portion in which the thickness of said unit semiconductors continuously decreases in said direction from said side of said reflecting layer remote from said surface of light incidence, toward said side of said reflecting layer adjacent to said surface of light incidence.

13. A semiconductor device according to claim 11, wherein said reflecting layer comprises a plurality of iso-thickness portions which comprise respective predetermined numbers of unit semiconductors, all of said unit semiconductors of each of said iso-thickness portions having a same thickness, and a thickness value of the unit semiconductors of one of said iso-thickness portions differing form a thickness value of the unit semiconductor of another of said iso-thickness portions such that the thickness of the unit semiconductors of said iso-thickness portions decreases in steps in said direction.

14. A semiconductor surface emitting diode having an active layer formed by epitaxy for producing a radiation, a reflecting layer which is formed of different semiconductor materials on one of opposite sides of said active layer and which receives a portion of said radiation as incident light and reflects said incident light by optical wave interference, and a light emitting surface which is provided on the other of said opposite sides of said active layer remote from said reflecting layer and through which the light received from said active layer is emitted, wherein the improvement comprises:
  said reflecting layer including semiconductor films having different compositions superposed one each other, a composition of said reflecting layer changing continuously, in a direction of thickness of said reflecting layer, at least at each interface between the adjacent semiconductor films, to thereby reduce a difference in a lattice constant between said adjacent semiconductor films for mitigating a lattice mismatch thereof.

15. A surface emitting diode having a light emitting surface form which a plurality of radiations having different wavelengths are emitted, comprising:
  a first active layer substantially parallel to said light emitting surface, for producing a first radiation having a first wavelength;
  a second active layer disposed on one of opposite sides of said first active layer which is remote form said light emitting surface, said second active layer producing a second radiation having a second wavelength longer than said first wavelength; and
  a selective reflecting layer comprising a multiplicity of semiconductor films and disposed between said first and second active layers, said selective reflecting layer reflecting said first radiation by optical wave interference, and transmitting said second radiation.

16. A surface emitting diode array having a plurality of surface emitting diodes each including a common substrate, an active layer for producing a radiation, and a light emitting surface which is disposed on one of opposite sides of said active layer and from which said radiation is emitted, wherein the improvement comprises:
  each of said diodes including a reflecting layer which comprises unit semiconductors superposed one each other and which is disposed between said active layer and said common substrate, for reflecting a portion of said radiation by optical wave interference, said reflecting layer including at least one varying-thickness portion, each of said at least one varying-thickness portion comprises a plurality of unit semiconductors, each comprising two semiconductor films having different compositions, the unit semiconductors of each said varying-thickness portion having a thickness which continuously varies in a direction of thickness of the reflecting layer.

* * * * *